US012228835B2

(12) United States Patent
Robinson et al.

(10) Patent No.: US 12,228,835 B2
(45) Date of Patent: Feb. 18, 2025

(54) DISPLAY DEVICE WITH UNIFORM OFF-AXIS LUMINANCE REDUCTION

(71) Applicant: RealD Spark, LLC, Boulder, CO (US)

(72) Inventors: Michael G. Robinson, Boulder, CO (US); Graham J Woodgate, Henley-on-Thames (GB)

(73) Assignee: RealD Spark, LLC, Boulder, CO (US)

( * ) Notice: Subject to any disclaimer, the term of this patent is extended or adjusted under 35 U.S.C. 154(b) by 0 days.

(21) Appl. No.: 18/216,774

(22) Filed: Jun. 30, 2023

(65) Prior Publication Data

US 2024/0045296 A1 Feb. 8, 2024

Related U.S. Application Data

(63) Continuation of application No. 17/772,094, filed as application No. PCT/US2020/060155 on Nov. 12, 2020, now Pat. No. 11,733,578.

(Continued)

(51) Int. Cl.
  *G02F 1/139* (2006.01)
  *F21V 8/00* (2006.01)
  (Continued)

(52) U.S. Cl.
  CPC ......... *G02F 1/1393* (2013.01); *G02B 6/0016* (2013.01); *G02B 6/0036* (2013.01);
  (Continued)

(58) Field of Classification Search
  CPC ......... G02F 1/133633; G02F 1/133528; G02F 1/1337; G02F 1/13363; G02F 1/133634;
  (Continued)

(56) References Cited

U.S. PATENT DOCUMENTS 3,914,022 A   10/1975  Kashnow
4,059,916 A   11/1977  Tachihara et al.
(Continued)

FOREIGN PATENT DOCUMENTS

CA   2222313 A1   6/1998
CN   1125943 C    10/2003
(Continued)

OTHER PUBLICATIONS

International search report and written opinion of the international searching authority mailed Feb. 28, 2020.
(Continued)

*Primary Examiner* — Mariam Qureshi
(74) *Attorney, Agent, or Firm* — Penny L. Lowry

(57) ABSTRACT

A display device comprising a spatial light modulator having a display polariser arranged on one side of the spatial light modulator is provided with an additional polariser arranged on the same side as the display polariser and polar control retarders between the additional polariser and the display polariser. The polar control retarders include a liquid crystal retarder having two surface alignment layers disposed adjacent to a layer of liquid crystal material on opposite sides. The surface alignment layers provide alignment in the adjacent liquid crystal material with an in-plane component, wherein the angle of said in-plane component changes monotonically along a predetermined axis across the display device, providing reduction of luminance in directions that are offset from a viewing axis, increasing uniformity in the reduction of luminance in directions that are offset from a viewing axis.

24 Claims, 43 Drawing Sheets

Related U.S. Application Data

(60) Provisional application No. 63/058,300, filed on Jul. 29, 2020, provisional application No. 62/934,619, filed on Nov. 13, 2019.

(51) Int. Cl.
  *G02F 1/1335* (2006.01)
  *G02F 1/13363* (2006.01)
  *G02F 1/1337* (2006.01)
  *G02F 1/1347* (2006.01)
  *H10K 50/80* (2023.01)

(52) U.S. Cl.
  CPC ......... *G02B 6/0068* (2013.01); *G02B 6/0076* (2013.01); *G02F 1/133528* (2013.01); *G02F 1/133536* (2013.01); *G02F 1/13363* (2013.01); *G02F 1/133633* (2021.01); *G02F 1/133738* (2021.01); *G02F 1/133742* (2021.01); *G02F 1/133746* (2021.01); *G02F 1/133757* (2021.01); *G02F 1/13471* (2013.01); *H10K 50/868* (2023.02)

(58) Field of Classification Search
  CPC ........... G02F 1/133631; G02F 2413/01; G02F 2413/00; G02F 2413/06; G02B 5/3083
  See application file for complete search history.

(56) References Cited

U.S. PATENT DOCUMENTS

| | | |
|---|---|---|
| 4,586,790 A | 5/1986 | Umeda et al. |
| 4,621,898 A | 11/1986 | Cohen |
| 4,974,941 A | 12/1990 | Gibbons et al. |
| 5,005,108 A | 4/1991 | Pristash et al. |
| 5,035,491 A | 7/1991 | Kawagishi et al. |
| 5,126,882 A | 6/1992 | Oe et al. |
| 5,579,139 A | 11/1996 | Abileah et al. |
| 5,608,550 A | 3/1997 | Epstein et al. |
| 5,658,490 A | 8/1997 | Sharp et al. |
| 5,671,994 A | 9/1997 | Tai et al. |
| 5,715,028 A | 2/1998 | Abileah et al. |
| 5,726,729 A | 3/1998 | Takei |
| 5,779,337 A | 7/1998 | Saito et al. |
| 5,791,757 A | 8/1998 | O'Neil et al. |
| 5,808,784 A | 9/1998 | Ando et al. |
| 5,835,166 A | 11/1998 | Hall et al. |
| 5,852,509 A | 12/1998 | Coleman |
| 5,854,872 A | 12/1998 | Tai |
| 5,894,361 A | 4/1999 | Yamazaki et al. |
| 5,914,760 A | 6/1999 | Daiku |
| 5,997,148 A | 12/1999 | Ohkawa |
| 6,055,103 A | 4/2000 | Woodgate et al. |
| 6,099,758 A | 8/2000 | Verrall et al. |
| 6,144,433 A | 11/2000 | Tillin et al. |
| 6,169,589 B1 | 1/2001 | Kaneko |
| 6,204,904 B1 | 3/2001 | Tillin et al. |
| 6,222,672 B1 | 4/2001 | Towler et al. |
| 6,280,043 B1 | 8/2001 | Ohkawa |
| 6,364,497 B1 | 4/2002 | Park et al. |
| 6,379,016 B1 | 4/2002 | Boyd et al. |
| 6,392,727 B1 | 5/2002 | Larson et al. |
| 6,437,915 B2 | 8/2002 | Moseley et al. |
| 6,731,355 B2 | 5/2004 | Miyashita |
| 6,752,505 B2 | 6/2004 | Parker et al. |
| 6,987,550 B2 | 1/2006 | Takato et al. |
| 7,067,985 B2 | 6/2006 | Adachi |
| 7,072,096 B2 | 7/2006 | Holman et al. |
| 7,163,319 B2 | 1/2007 | Kuo et al. |
| 7,227,602 B2 | 6/2007 | Jeon et al. |
| 7,366,392 B2 | 4/2008 | Honma et al. |
| 7,524,542 B2 | 4/2009 | Kim et al. |
| 7,528,893 B2 | 5/2009 | Schultz et al. |
| 7,528,913 B2 | 5/2009 | Kobayashi |
| 7,633,586 B2 | 12/2009 | Winlow et al. |
| 7,660,047 B1 | 2/2010 | Travis et al. |
| 7,766,534 B2 | 8/2010 | Iwasaki |
| 7,834,834 B2 | 11/2010 | Takatani et al. |
| 7,970,246 B2 | 6/2011 | Travis et al. |
| 7,991,257 B1 | 8/2011 | Coleman |
| 8,070,346 B2 | 12/2011 | Maeda et al. |
| 8,098,350 B2 | 1/2012 | Sakai et al. |
| 8,154,686 B2 | 4/2012 | Mather et al. |
| 8,228,476 B2 | 7/2012 | Shibazaki |
| 8,237,876 B2 | 8/2012 | Tan et al. |
| 8,249,408 B2 | 8/2012 | Coleman |
| 8,262,271 B2 | 9/2012 | Tillin et al. |
| 8,469,575 B2 | 6/2013 | Weber et al. |
| 8,646,931 B2 | 2/2014 | Choi et al. |
| 8,801,260 B2 | 8/2014 | Urano et al. |
| 8,848,132 B2 | 9/2014 | O'Neill et al. |
| 8,939,595 B2 | 1/2015 | Choi et al. |
| 8,973,149 B2 | 3/2015 | Buck |
| 9,195,087 B2 | 11/2015 | Terashima |
| 9,274,260 B2 | 3/2016 | Urano et al. |
| 9,304,241 B2 | 4/2016 | Wang et al. |
| 9,324,234 B2 | 4/2016 | Ricci et al. |
| 9,448,355 B2 | 9/2016 | Urano et al. |
| 9,501,036 B2 | 11/2016 | Kang et al. |
| 9,519,153 B2 | 12/2016 | Robinson et al. |
| 9,541,698 B2 | 1/2017 | Wheatley et al. |
| 9,798,169 B2 | 10/2017 | Su et al. |
| 9,939,675 B2 | 4/2018 | Peng et al. |
| 10,054,732 B2 | 8/2018 | Robinson et al. |
| 10,067,726 B2 | 9/2018 | Wakamoto et al. |
| 10,126,575 B1 | 11/2018 | Robinson et al. |
| 10,146,093 B2 | 12/2018 | Sakai et al. |
| 10,216,018 B2 | 2/2019 | Fang et al. |
| 10,288,914 B2 | 5/2019 | Chung et al. |
| 10,303,030 B2 | 5/2019 | Robinson et al. |
| 10,401,638 B2 | 9/2019 | Robinson et al. |
| 10,424,232 B2 | 9/2019 | Schubert et al. |
| 10,488,705 B2 | 11/2019 | Xu et al. |
| 10,527,775 B2 | 1/2020 | Yang et al. |
| 10,627,670 B2 | 4/2020 | Robinson et al. |
| 10,649,248 B1 | 5/2020 | Jiang et al. |
| 10,649,259 B2 | 5/2020 | Lee et al. |
| 10,712,608 B2 | 7/2020 | Robinson et al. |
| 10,802,356 B2 | 10/2020 | Harrold et al. |
| 10,935,714 B2 | 3/2021 | Woodgate et al. |
| 10,948,648 B2 | 3/2021 | Ihas et al. |
| 10,976,578 B2 | 4/2021 | Robinson et al. |
| 11,016,341 B2 | 5/2021 | Robinson et al. |
| 11,070,791 B2 | 7/2021 | Woodgate et al. |
| 11,079,645 B2 | 8/2021 | Harrold et al. |
| 11,079,646 B2 | 8/2021 | Robinson et al. |
| 11,092,851 B2 | 8/2021 | Robinson et al. |
| 11,092,852 B2 | 8/2021 | Robinson et al. |
| 11,099,433 B2 | 8/2021 | Robinson et al. |
| 11,099,447 B2 | 8/2021 | Woodgate et al. |
| 11,099,448 B2 | 8/2021 | Woodgate et al. |
| 11,237,417 B2 | 2/2022 | Woodgate et al. |
| 11,327,358 B2 | 5/2022 | Robinson et al. |
| 11,340,482 B2 | 5/2022 | Robinson et al. |
| 11,366,358 B2 | 6/2022 | Wu et al. |
| 11,442,316 B2 | 9/2022 | Woodgate et al. |
| 11,573,437 B2 | 2/2023 | Woodgate et al. |
| 11,892,717 B2 | 2/2024 | Harrold et al. |
| 11,977,286 B2 | 5/2024 | Woodgate et al. |
| 2001/0024561 A1 | 9/2001 | Cornelissen et al. |
| 2002/0015300 A1 | 2/2002 | Katsu et al. |
| 2002/0024529 A1 | 2/2002 | Miller et al. |
| 2002/0140342 A1 | 10/2002 | Sundahl |
| 2002/0163790 A1 | 11/2002 | Yamashita et al. |
| 2002/0171793 A1 | 11/2002 | Sharp et al. |
| 2003/0030764 A1 | 2/2003 | Lee |
| 2003/0058381 A1 | 3/2003 | Shinohara et al. |
| 2003/0089956 A1 | 5/2003 | Allen et al. |
| 2003/0107686 A1 | 6/2003 | Sato et al. |
| 2003/0117792 A1 | 6/2003 | Kunimochi et al. |
| 2003/0169499 A1 | 9/2003 | Bourdelais et al. |
| 2003/0214615 A1 | 11/2003 | Colgan et al. |
| 2003/0222857 A1 | 12/2003 | Abileah |
| 2004/0015729 A1 | 1/2004 | Elms et al. |

(56) References Cited

U.S. PATENT DOCUMENTS

| | | |
|---|---|---|
| 2004/0100598 A1 | 5/2004 | Adachi et al. |
| 2004/0125430 A1 | 7/2004 | Kasajima et al. |
| 2004/0141107 A1 | 7/2004 | Jones |
| 2004/0145703 A1 | 7/2004 | O'Connor et al. |
| 2004/0223094 A1 | 11/2004 | Hamada et al. |
| 2004/0240777 A1 | 12/2004 | Woodgate et al. |
| 2004/0246418 A1 | 12/2004 | Kumagai et al. |
| 2004/0264910 A1 | 12/2004 | Suzuki et al. |
| 2005/0002174 A1 | 1/2005 | Min et al. |
| 2005/0014913 A1 | 1/2005 | Kim et al. |
| 2005/0041311 A1 | 2/2005 | Mi et al. |
| 2005/0111100 A1 | 5/2005 | Mather et al. |
| 2005/0117186 A1 | 6/2005 | Li et al. |
| 2005/0135116 A1 | 6/2005 | Epstein et al. |
| 2005/0157225 A1 | 7/2005 | Toyooka et al. |
| 2005/0190326 A1 | 9/2005 | Jeon et al. |
| 2005/0190329 A1 | 9/2005 | Okumura |
| 2005/0206814 A1 | 9/2005 | Histake |
| 2005/0213348 A1 | 9/2005 | Parikka et al. |
| 2005/0219693 A1 | 10/2005 | Hartkop et al. |
| 2005/0243265 A1 | 11/2005 | Winlow et al. |
| 2005/0259193 A1 | 11/2005 | Sumiyoshi et al. |
| 2005/0259205 A1 | 11/2005 | Sharp et al. |
| 2005/0270798 A1 | 12/2005 | Lee et al. |
| 2006/0050209 A1 | 3/2006 | Higa |
| 2006/0066785 A1 | 3/2006 | Moriya |
| 2006/0082702 A1 | 4/2006 | Jacobs et al. |
| 2006/0092512 A1* | 5/2006 | Shioya .......... G02B 5/003 359/487.03 |
| 2006/0098296 A1 | 5/2006 | Woodgate et al. |
| 2006/0146405 A1 | 7/2006 | MacMaster |
| 2006/0203162 A1 | 9/2006 | Ito et al. |
| 2006/0215244 A1 | 9/2006 | Yosha et al. |
| 2006/0244884 A1 | 11/2006 | Jeon et al. |
| 2006/0262255 A1 | 11/2006 | Wang et al. |
| 2006/0262258 A1 | 11/2006 | Wang et al. |
| 2006/0262376 A1 | 11/2006 | Mather et al. |
| 2006/0262558 A1 | 11/2006 | Cornelissen |
| 2006/0268207 A1 | 11/2006 | Tan et al. |
| 2006/0285040 A1 | 12/2006 | Kobayashi |
| 2007/0008471 A1 | 1/2007 | Wang et al. |
| 2007/0024970 A1 | 2/2007 | Lub et al. |
| 2007/0030240 A1 | 2/2007 | Sumiyoshi et al. |
| 2007/0035964 A1 | 2/2007 | Olczak |
| 2007/0040780 A1 | 2/2007 | Gass et al. |
| 2007/0047254 A1 | 3/2007 | Schardt et al. |
| 2007/0064163 A1 | 3/2007 | Tan et al. |
| 2007/0076406 A1 | 4/2007 | Kodama et al. |
| 2007/0139772 A1 | 6/2007 | Wang |
| 2007/0147088 A1 | 6/2007 | Chien et al. |
| 2007/0223251 A1 | 9/2007 | Liao |
| 2007/0268427 A1 | 11/2007 | Uehara |
| 2007/0285775 A1 | 12/2007 | Lesage et al. |
| 2008/0008434 A1 | 1/2008 | Lee et al. |
| 2008/0068329 A1 | 3/2008 | Shestak et al. |
| 2008/0068862 A1 | 3/2008 | Shimura |
| 2008/0106689 A1 | 5/2008 | Inoue et al. |
| 2008/0117364 A1 | 5/2008 | Matsushima |
| 2008/0129899 A1 | 6/2008 | Sharp |
| 2008/0158491 A1 | 7/2008 | Zhu et al. |
| 2008/0158912 A1 | 7/2008 | Chang et al. |
| 2008/0205066 A1 | 8/2008 | Ohta et al. |
| 2008/0285310 A1 | 11/2008 | Aylward et al. |
| 2008/0316198 A1 | 12/2008 | Fukushima et al. |
| 2008/0316366 A1 | 12/2008 | Takatani et al. |
| 2009/0009894 A1 | 1/2009 | Chuang |
| 2009/0021657 A1 | 1/2009 | Yang et al. |
| 2009/0040426 A1 | 2/2009 | Mather et al. |
| 2009/0085894 A1 | 4/2009 | Gandhi et al. |
| 2009/0086509 A1 | 4/2009 | Omori et al. |
| 2009/0109381 A1 | 4/2009 | Haruyama |
| 2009/0109703 A1 | 4/2009 | Chen et al. |
| 2009/0128735 A1 | 5/2009 | Larson et al. |
| 2009/0128746 A1 | 5/2009 | Kean et al. |
| 2009/0135623 A1 | 5/2009 | Kunimochi |
| 2009/0174843 A1 | 7/2009 | Sakai et al. |
| 2009/0213147 A1 | 8/2009 | Sagardoyburu et al. |
| 2009/0213298 A1 | 8/2009 | Mimura et al. |
| 2009/0213305 A1 | 8/2009 | Ohmuro et al. |
| 2009/0244415 A1 | 10/2009 | Ide |
| 2010/0002296 A1 | 1/2010 | Choi et al. |
| 2010/0014313 A1 | 1/2010 | Tillin et al. |
| 2010/0066960 A1 | 3/2010 | Smith et al. |
| 2010/0128200 A1 | 5/2010 | Morishita et al. |
| 2010/0149459 A1 | 6/2010 | Yabuta et al. |
| 2010/0177113 A1 | 7/2010 | Gay et al. |
| 2010/0187704 A1 | 7/2010 | Hsu et al. |
| 2010/0205667 A1 | 8/2010 | Anderson et al. |
| 2010/0214324 A1 | 8/2010 | Broughton et al. |
| 2010/0238376 A1 | 9/2010 | Sakai et al. |
| 2010/0283930 A1 | 11/2010 | Park et al. |
| 2010/0289989 A1 | 11/2010 | Adachi et al. |
| 2010/0295755 A1 | 11/2010 | Broughton et al. |
| 2010/0309204 A1 | 12/2010 | Smith et al. |
| 2010/0328438 A1 | 12/2010 | Ohyama et al. |
| 2011/0018860 A1 | 1/2011 | Parry-Jones et al. |
| 2011/0032437 A1 | 2/2011 | Yoshimi et al. |
| 2011/0032483 A1 | 2/2011 | Hruska et al. |
| 2011/0176089 A1 | 7/2011 | Ishikawa et al. |
| 2011/0241573 A1 | 10/2011 | Tsai et al. |
| 2011/0241983 A1 | 10/2011 | Chang |
| 2011/0255304 A1 | 10/2011 | Kinoshita |
| 2011/0286222 A1 | 11/2011 | Coleman |
| 2011/0321143 A1 | 12/2011 | Angaluri et al. |
| 2012/0002121 A1 | 1/2012 | Pirs et al. |
| 2012/0020078 A1 | 1/2012 | Chang |
| 2012/0086875 A1 | 4/2012 | Yokota |
| 2012/0086893 A1* | 4/2012 | Ou .......... G02F 1/133788 264/436 |
| 2012/0113158 A1 | 5/2012 | Goto et al. |
| 2012/0120351 A1 | 5/2012 | Kawata |
| 2012/0127573 A1 | 5/2012 | Robinson et al. |
| 2012/0147026 A1 | 6/2012 | Gass et al. |
| 2012/0147280 A1 | 6/2012 | Osterman et al. |
| 2012/0170315 A1 | 7/2012 | Fan et al. |
| 2012/0188792 A1 | 7/2012 | Matsumoto et al. |
| 2012/0212414 A1 | 8/2012 | Osterhout et al. |
| 2012/0235891 A1 | 9/2012 | Nishitani et al. |
| 2012/0294037 A1 | 11/2012 | Holman et al. |
| 2012/0299913 A1 | 11/2012 | Robinson et al. |
| 2012/0314145 A1 | 12/2012 | Robinson |
| 2012/0320311 A1 | 12/2012 | Gotou et al. |
| 2012/0327101 A1 | 12/2012 | Blixt et al. |
| 2013/0039062 A1 | 2/2013 | Vinther et al. |
| 2013/0050610 A1 | 2/2013 | Parry-Jones et al. |
| 2013/0057807 A1 | 3/2013 | Goto et al. |
| 2013/0100097 A1 | 4/2013 | Martin |
| 2013/0107174 A1 | 5/2013 | Yun et al. |
| 2013/0120817 A1 | 5/2013 | Yoon et al. |
| 2013/0128165 A1 | 5/2013 | Lee et al. |
| 2013/0242231 A1 | 9/2013 | Kurata et al. |
| 2013/0242612 A1 | 9/2013 | Lee et al. |
| 2013/0278544 A1 | 10/2013 | Cok |
| 2013/0293793 A1 | 11/2013 | Lu |
| 2013/0300985 A1 | 11/2013 | Bulda |
| 2013/0307831 A1 | 11/2013 | Robinson et al. |
| 2013/0308185 A1 | 11/2013 | Robinson et al. |
| 2013/0308339 A1 | 11/2013 | Woodgate et al. |
| 2013/0321340 A1 | 12/2013 | Seo et al. |
| 2013/0328866 A1 | 12/2013 | Woodgate et al. |
| 2014/0009508 A1 | 1/2014 | Woodgate et al. |
| 2014/0022619 A1 | 1/2014 | Woodgate et al. |
| 2014/0071382 A1 | 3/2014 | Scardato |
| 2014/0098418 A1 | 4/2014 | Lin |
| 2014/0098558 A1 | 4/2014 | Vasylyev |
| 2014/0104147 A1 | 4/2014 | Nakahara et al. |
| 2014/0111760 A1 | 4/2014 | Guo et al. |
| 2014/0132887 A1 | 5/2014 | Kurata |
| 2014/0133181 A1 | 5/2014 | Ishida et al. |
| 2014/0140091 A1 | 5/2014 | Vasylyev |
| 2014/0140095 A1 | 5/2014 | Yuki et al. |
| 2014/0176873 A1 | 6/2014 | Shinohara et al. |
| 2014/0185322 A1 | 7/2014 | Liao |
| 2014/0201844 A1 | 7/2014 | Buck |

(56) References Cited

U.S. PATENT DOCUMENTS

| | | |
|---|---|---|
| 2014/0211125 A1 | 7/2014 | Kurata |
| 2014/0232836 A1 | 8/2014 | Woodgate et al. |
| 2014/0232960 A1 | 8/2014 | Schwartz et al. |
| 2014/0240344 A1 | 8/2014 | Tomono et al. |
| 2014/0240828 A1 | 8/2014 | Robinson et al. |
| 2014/0240839 A1 | 8/2014 | Yang et al. |
| 2014/0268358 A1 | 9/2014 | Kusaka et al. |
| 2014/0286043 A1 | 9/2014 | Sykora et al. |
| 2014/0286044 A1 | 9/2014 | Johnson et al. |
| 2014/0289835 A1 | 9/2014 | Varshavsky et al. |
| 2014/0313464 A1* | 10/2014 | Li .................. G02B 5/208 349/124 |
| 2014/0340728 A1 | 11/2014 | Taheri |
| 2014/0361990 A1 | 12/2014 | Leister |
| 2014/0367873 A1 | 12/2014 | Yang et al. |
| 2015/0029449 A1 | 1/2015 | Woo et al. |
| 2015/0035872 A1 | 2/2015 | Shima et al. |
| 2015/0055366 A1 | 2/2015 | Chang et al. |
| 2015/0088284 A1 | 3/2015 | Hendricks et al. |
| 2015/0116212 A1 | 4/2015 | Freed et al. |
| 2015/0177447 A1 | 6/2015 | Woodgate et al. |
| 2015/0177563 A1 | 6/2015 | Cho et al. |
| 2015/0185398 A1 | 7/2015 | Chang et al. |
| 2015/0205157 A1 | 7/2015 | Sakai et al. |
| 2015/0268479 A1 | 9/2015 | Woodgate et al. |
| 2015/0286061 A1 | 10/2015 | Seo et al. |
| 2015/0286817 A1 | 10/2015 | Haddad et al. |
| 2015/0293273 A1 | 10/2015 | Chen et al. |
| 2015/0293289 A1 | 10/2015 | Shinohara et al. |
| 2015/0293409 A1 | 10/2015 | Usukura et al. |
| 2015/0301400 A1 | 10/2015 | Kimura et al. |
| 2015/0338564 A1 | 11/2015 | Zhang et al. |
| 2015/0346417 A1 | 12/2015 | Powell |
| 2015/0346532 A1 | 12/2015 | Do et al. |
| 2015/0355490 A1 | 12/2015 | Kao et al. |
| 2015/0378085 A1 | 12/2015 | Robinson et al. |
| 2016/0054508 A1 | 2/2016 | Hirayama et al. |
| 2016/0103264 A1 | 4/2016 | Lee et al. |
| 2016/0132721 A1 | 5/2016 | Bostick et al. |
| 2016/0147074 A1 | 5/2016 | Kobayashi et al. |
| 2016/0154259 A1 | 6/2016 | Kim et al. |
| 2016/0154458 A1 | 6/2016 | Liu et al. |
| 2016/0216420 A1 | 7/2016 | Gaides et al. |
| 2016/0216540 A1 | 7/2016 | Cho et al. |
| 2016/0224106 A1 | 8/2016 | Liu |
| 2016/0238869 A1 | 8/2016 | Osterman et al. |
| 2016/0259115 A1 | 9/2016 | Kitano et al. |
| 2016/0291358 A1 | 10/2016 | Kikuchi et al. |
| 2016/0334898 A1 | 11/2016 | Kwak et al. |
| 2016/0349444 A1 | 12/2016 | Robinson et al. |
| 2016/0356943 A1 | 12/2016 | Choi et al. |
| 2016/0357046 A1 | 12/2016 | Choi et al. |
| 2017/0003436 A1 | 1/2017 | Inoue et al. |
| 2017/0023725 A1 | 1/2017 | Oki et al. |
| 2017/0031206 A1 | 2/2017 | Smith et al. |
| 2017/0085869 A1 | 3/2017 | Choi et al. |
| 2017/0090103 A1 | 3/2017 | Holman |
| 2017/0090237 A1 | 3/2017 | Kim et al. |
| 2017/0092187 A1 | 3/2017 | Bergquist |
| 2017/0092229 A1 | 3/2017 | Greenebaum et al. |
| 2017/0115485 A1 | 4/2017 | Saito et al. |
| 2017/0123241 A1 | 5/2017 | Su et al. |
| 2017/0139110 A1 | 5/2017 | Woodgate et al. |
| 2017/0168633 A1 | 6/2017 | Kwak et al. |
| 2017/0205558 A1 | 7/2017 | Hirayama et al. |
| 2017/0236494 A1 | 8/2017 | Sommerlade et al. |
| 2017/0269283 A1 | 9/2017 | Wang et al. |
| 2017/0269285 A1 | 9/2017 | Hirayama et al. |
| 2017/0276960 A1 | 9/2017 | Osterman et al. |
| 2017/0315423 A1 | 11/2017 | Serati et al. |
| 2017/0329399 A1 | 11/2017 | Azam et al. |
| 2017/0336661 A1 | 11/2017 | Harrold et al. |
| 2017/0339398 A1 | 11/2017 | Woodgate et al. |
| 2017/0343715 A1 | 11/2017 | Fang et al. |
| 2017/0363798 A1 | 12/2017 | Hirayama et al. |
| 2017/0363913 A1 | 12/2017 | Yi |
| 2018/0011173 A1 | 1/2018 | Newman |
| 2018/0014007 A1 | 1/2018 | Brown |
| 2018/0052346 A1 | 2/2018 | Sakai et al. |
| 2018/0082068 A1 | 3/2018 | Lancioni et al. |
| 2018/0095581 A1 | 4/2018 | Hwang et al. |
| 2018/0113334 A1 | 4/2018 | Fang et al. |
| 2018/0188576 A1 | 7/2018 | Xu et al. |
| 2018/0188603 A1 | 7/2018 | Fang et al. |
| 2018/0196275 A1 | 7/2018 | Robinson et al. |
| 2018/0210243 A1 | 7/2018 | Fang et al. |
| 2018/0210253 A1 | 7/2018 | Kashima |
| 2018/0231811 A1 | 8/2018 | Wu |
| 2018/0252949 A1 | 9/2018 | Klippstein et al. |
| 2018/0259799 A1 | 9/2018 | Kroon |
| 2018/0259812 A1 | 9/2018 | Goda et al. |
| 2018/0284341 A1 | 10/2018 | Woodgate et al. |
| 2018/0321523 A1 | 11/2018 | Robinson et al. |
| 2018/0321553 A1 | 11/2018 | Robinson et al. |
| 2018/0329245 A1 | 11/2018 | Robinson et al. |
| 2018/0364526 A1 | 12/2018 | Finnemeyer et al. |
| 2019/0056628 A1 | 2/2019 | Inokuchi |
| 2019/0086706 A1 | 3/2019 | Robinson et al. |
| 2019/0121173 A1 | 4/2019 | Robinson et al. |
| 2019/0146134 A1 | 5/2019 | Miura et al. |
| 2019/0154896 A1 | 5/2019 | Yanai |
| 2019/0196235 A1 | 6/2019 | Robinson et al. |
| 2019/0196236 A1 | 6/2019 | Chen et al. |
| 2019/0197928 A1 | 6/2019 | Schubert et al. |
| 2019/0215509 A1 | 7/2019 | Woodgate et al. |
| 2019/0227366 A1 | 7/2019 | Harrold et al. |
| 2019/0235304 A1 | 8/2019 | Tamada et al. |
| 2019/0250458 A1 | 8/2019 | Robinson et al. |
| 2019/0278010 A1 | 9/2019 | Sakai et al. |
| 2019/0293858 A1 | 9/2019 | Woodgate et al. |
| 2019/0293983 A1 | 9/2019 | Robinson et al. |
| 2019/0331944 A1 | 10/2019 | Fang et al. |
| 2019/0339433 A1 | 11/2019 | Benoit et al. |
| 2019/0353944 A1 | 11/2019 | Acreman et al. |
| 2019/0361165 A1 | 11/2019 | Chang et al. |
| 2020/0019006 A1 | 1/2020 | Robinson et al. |
| 2020/0026114 A1 | 1/2020 | Harrold et al. |
| 2020/0026125 A1 | 1/2020 | Robinson et al. |
| 2020/0041839 A1 | 2/2020 | Robinson et al. |
| 2020/0110301 A1 | 4/2020 | Harrold et al. |
| 2020/0132904 A1* | 4/2020 | Smith .................. G02B 5/3016 |
| 2020/0159055 A1 | 5/2020 | Robinson et al. |
| 2020/0185590 A1 | 6/2020 | Malhotra et al. |
| 2020/0218101 A1 | 7/2020 | Ihas et al. |
| 2020/0225402 A1 | 7/2020 | Ihas et al. |
| 2020/0233142 A1 | 7/2020 | Liao et al. |
| 2020/0409156 A1 | 12/2020 | Sissom et al. |
| 2021/0018773 A1 | 1/2021 | Woodgate et al. |
| 2021/0033898 A1 | 2/2021 | Woodgate et al. |
| 2021/0072448 A1 | 3/2021 | Peng et al. |
| 2021/0116627 A1 | 4/2021 | Tsuji |
| 2021/0149233 A1 | 5/2021 | Robinson et al. |
| 2021/0149234 A1 | 5/2021 | Woodgate et al. |
| 2021/0271121 A1 | 9/2021 | Woodgate et al. |
| 2021/0333577 A1 | 10/2021 | Robinson et al. |
| 2021/0333580 A1 | 10/2021 | Matsushima |
| 2021/0341769 A1 | 11/2021 | Woodgate et al. |
| 2021/0373382 A1 | 12/2021 | Sakai et al. |
| 2022/0269128 A1 | 8/2022 | Matsushima |
| 2022/0404540 A1 | 12/2022 | Robinson et al. |
| 2022/0413338 A1 | 12/2022 | Matsushima et al. |
| 2023/0099000 A1 | 3/2023 | Harrold et al. |
| 2023/0254457 A1 | 8/2023 | Robinson et al. |
| 2023/0375863 A1 | 11/2023 | Woodgate et al. |

FOREIGN PATENT DOCUMENTS

| | | |
|---|---|---|
| CN | 1690800 A | 11/2005 |
| CN | 1776484 A | 5/2006 |
| CN | 101042449 A | 9/2007 |
| CN | 101256251 A | 9/2008 |
| CN | 101435952 A | 5/2009 |
| CN | 101454712 A | 6/2009 |
| CN | 101518095 A | 8/2009 |

(56) References Cited

FOREIGN PATENT DOCUMENTS

| | | |
|---|---|---|
| CN | 101681061 A | 3/2010 |
| CN | 102540544 A | 7/2012 |
| CN | 103109226 A | 5/2013 |
| CN | 103473494 A | 12/2013 |
| CN | 103688211 A | 3/2014 |
| CN | 103988121 A | 8/2014 |
| CN | 104133292 A | 11/2014 |
| CN | 104303085 A | 1/2015 |
| CN | 104321686 A | 1/2015 |
| CN | 104380177 A | 2/2015 |
| CN | 104597661 A | 5/2015 |
| CN | 204740413 U | 11/2015 |
| CN | 105842909 A | 8/2016 |
| CN | 105960609 A | 9/2016 |
| CN | 106104372 A | 11/2016 |
| CN | 106415342 A | 2/2017 |
| CN | 106557711 A | 4/2017 |
| CN | 107102460 A | 8/2017 |
| CN | 109564366 A | 4/2019 |
| CN | 209171779 U | 7/2019 |
| EP | 1326102 A1 | 7/2003 |
| EP | 1060344 B1 | 5/2004 |
| EP | 1956423 A1 | 8/2008 |
| EP | 2037318 A1 | 3/2009 |
| GB | 2405542 A | 3/2005 |
| GB | 2415850 A | 1/2006 |
| GB | 2418518 A | 3/2006 |
| GB | 2428100 A | 1/2007 |
| GB | 2428345 A | 1/2007 |
| GB | 2482065 A | 1/2012 |
| GB | 2486935 B | 9/2013 |
| JP | S58143305 A | 8/1983 |
| JP | H01130783 U | 9/1989 |
| JP | H09197405 A | 7/1997 |
| JP | H10268251 A | 10/1998 |
| JP | H11174489 A | 7/1999 |
| JP | 2005316470 A | 11/2005 |
| JP | 2005345799 A | 12/2005 |
| JP | 2006139160 A | 6/2006 |
| JP | 2006201326 A | 8/2006 |
| JP | 2006330164 A | 12/2006 |
| JP | 2007501966 A | 2/2007 |
| JP | 2007148279 A | 6/2007 |
| JP | 2007273288 A | 10/2007 |
| JP | 2008310271 A | 12/2008 |
| JP | 2009020293 A | 1/2009 |
| JP | 2011095719 A | 5/2011 |
| JP | 2011103241 A | 5/2011 |
| JP | 2013160818 A | 8/2013 |
| JP | 2014032953 A | 2/2014 |
| JP | 2014099363 A | 5/2014 |
| KR | 20090106062 A | 10/2009 |
| KR | 20090108231 A | 10/2009 |
| KR | 20120011228 A | 2/2012 |
| KR | 101227145 B1 | 2/2013 |
| KR | 20130046116 A | 5/2013 |
| KR | 1020150021937 A | 3/2015 |
| KR | 20160053264 A | 5/2016 |
| KR | 1020170013915 A | 2/2017 |
| KR | 1020170019006 A | 2/2017 |
| KR | 1020170040565 A | 4/2017 |
| KR | 101990286 B1 | 6/2019 |
| TW | M537663 U | 3/2017 |
| TW | 001612360 | 1/2018 |
| TW | I612360 B | 1/2018 |
| WO | 2005071449 A2 | 8/2005 |
| WO | 2005071474 A2 | 8/2005 |
| WO | 2006030702 A1 | 3/2006 |
| WO | 2008001896 A1 | 1/2008 |
| WO | 2008078764 A1 | 7/2008 |
| WO | 2008093445 A1 | 8/2008 |
| WO | 2009008406 A1 | 1/2009 |
| WO | 2009011199 A1 | 1/2009 |
| WO | 2010021926 A2 | 2/2010 |
| WO | 2010101141 A1 | 9/2010 |
| WO | 2010143705 A1 | 12/2010 |
| WO | 2014011328 A1 | 1/2014 |
| WO | 2014130860 A1 | 8/2014 |
| WO | 2015040776 A1 | 3/2015 |
| WO | 2015057625 A1 | 4/2015 |
| WO | 2015143227 A1 | 9/2015 |
| WO | 2015157184 A1 | 10/2015 |
| WO | 2015190311 A1 | 12/2015 |
| WO | 2015200814 A1 | 12/2015 |
| WO | 2016195786 A1 | 12/2016 |
| WO | 2017050631 A1 | 3/2017 |
| WO | 2017065745 A1 | 4/2017 |
| WO | 2017117570 A1 | 7/2017 |
| WO | 2018003380 A1 | 1/2018 |
| WO | 2018035492 A1 | 2/2018 |
| WO | 2018178790 A1 | 10/2018 |
| WO | 2018208618 A1 | 11/2018 |
| WO | 2018221413 A1 | 12/2018 |
| WO | 2019055755 A1 | 3/2019 |
| WO | 2019067846 A1 | 4/2019 |
| WO | 2019090252 A1 | 5/2019 |
| WO | 2019147762 A1 | 8/2019 |
| WO | 2021003383 A1 | 1/2021 |

OTHER PUBLICATIONS

PCT/US2019/066208 International search report and written opinion of the international searching authority mailed Feb. 27, 2020.
PCT/US2020/017537 International search report and written opinion of the international searching authority mailed Apr. 29, 2020.
PCT/US2020/040686 International search report and written opinion of the international searching authority mailed Nov. 20, 2020.
PCT/US2020/044574 International search report and written opinion of the international searching authority mailed Oct. 21, 2020.
PCT/US2020/053863 International search report and written opinion of the international searching authority mailed Mar. 12, 2021.
PCT/US2020/060155 International search report and written opinion of the international searching authority mailed Feb. 5, 2021.
PCT/US2020/060191 International search report and written opinion of the international searching authority mailed Feb. 8, 2021.
PCT/US2020/063638 International search report and written opinion of the international searching authority mailed Mar. 2, 2021.
PCT/US2020/064633 International search report and written opinion of the international searching authority mailed Mar. 15, 2021.
PCT/US2021/029937 International search report and written opinion of the international searching authority mailed Aug. 6, 2021.
PCT/US2021/029944 International search report and written opinion of the international searching authority mailed Aug. 3, 2021.
PCT/US2021/029947 International search report and written opinion of the international searching authority mailed Aug. 10, 2021.
PCT/US2021/029954 International search report and written opinion of the international searching authority mailed Aug. 10, 2021.
PCT/US2021/029958 International search report and written opinion of the international searching authority mailed Aug. 10, 2021.
PCT/US2021/043435 International search report and written opinion of the international searching authority mailed Nov. 1, 2021.
PCT/US2021/043444 International search report and written opinion of the international searching authority mailed Nov. 1, 2021.
PCT/US2022/045030 International search report and written opinion of the international searching authority mailed Jan. 3, 2023.
PCT/US2023/012240 International search report and written opinion of the international searching authority mailed Apr. 27, 2023.
PCT/US2023/012243 International search report and written opinion of the international searching authority mailed May 10, 2023.
Robson, et al. "Spatial and temporal contrast-sensitivity functions of the visual system", J. Opt. Soc. Amer., vol. 56, pp. 1141-1142 (1966).
Simonyan et al., "Very Deep Convolutional Networks For Large-Scale Image Recognition", ICLR 2015.
TW107132221 First Office Action dated Apr. 28, 2022.
Weindorf et al., "Active Circular Polarizer OLED E-Mirror", Proceedings of the Society for Information Display 25th Annual Symposium of Vehicle Displays, Livonia, MI, pp. 225-237, Sep. 25-26, 2018.

(56) References Cited

OTHER PUBLICATIONS

CN201980056000.4 Notification of the First Office Action dated Nov. 1, 2023.
CN201980056022.0 Notification of the First Office Action dated Oct. 23, 2023.
CN202080020818.3 Notification of the First Office Action dated Oct. 23, 2023.
CN202080059812.7 Notification of the First Office Action dated Oct. 19, 2023.
EP-20851155.0 Extended European Search Report of European Patent Office dated Aug. 2, 2023.
EP-20872625.7 Extended European Search Report of European Patent Office dated Sep. 20, 2023.
EP-20887527.8 Extended European Search Report of European Patent Office dated Nov. 20, 2023.
JP2021-518864 Non-Final Notice of Reasons for Rejection dated Oct. 24, 2023.
KR10-2020-7024293 Notice of Preliminary Rejection mailed Dec. 7, 2023.
PCT/US2023/017639 International search report and written opinion of the international searching authority mailed Jul. 6, 2023.
EP-20887756.3 Extended European Search Report of European Patent Office dated Jan. 2, 2024.
EP-20898295.9 Extended European Search Report of European Patent Office dated Jan. 22, 2024.
IN202017035853 Hearing Notice dated Jan. 3, 2024.
TW108140291 First Office Action dated Nov. 9, 2023.
Adachi, et al. "P-228L: Late-News Poster: Controllable Viewing-Angle Displays using a Hybrid Aligned Nematic Liquid Crystal Cell", ISSN, SID 2006 Digest, pp. 705-708.
Brudy et al., "Is Anyone Looking? Mitigating Shoulder Surfing on Public Displays through Awareness and Protection", Proceedings of the International Symposium on Persuasive Displays (Jun. 3, 2014), pp. 1-6.
Cheng, et al., "Fast-Response Liquid Crystal Variable Optical Retarder and Multilevel Attenuator," Optical Engineering 52 (10), 107105 (Oct. 16, 2013). (Year: 2013).
Chiu, et al, "Advanced Hyoer-Viewing Angle Controllable LCD", 39-1 / M.-H. Chiu Invited Paper; AUO Technology Center, AU Optronics Corp., Hsinchu, Taiwan, SID 2021 Digest, ISSN 0097-996X/21/5202-0543, pp. 543-545.
CN201680061632.6 Notification of the First Office Action dated Sep. 14, 2021.
CN201780030715.3 Notification of the First Office Action dated Jan. 21, 2020.
CN201880042320.X Notification of the First Office Action dated May 25, 2021.
CN-201880042320.X Notification of the Third Office Action from the Chinese Patent Office dated Dec. 30, 2022.
CN201880073578.6 Notification of the First Office Action dated Aug. 27, 2021.
CN-201980020303.0—Notification of the First Office Action dated Dec. 16, 2021.
CN201980030279.9 Notification of the First Office Action dated Mar. 29, 2022.
CN-201980082757.0 Notification of the 1st Office Action of the Chinese Patent Office mailed Dec. 5, 2022.
EP-16860628.3 Extended European Search Report of European Patent Office dated Apr. 26, 2019.
EP-17799963.8 Extended European Search Report of European Patent Office dated Oct. 9, 2019.
EP-18855604.7 Extended European Search Report of European Patent Office dated Jun. 1, 2021.
EP-18857077.4 Extended European Search Report of European Patent Office dated Jun. 16, 2021.
EP-19743619.9 Extended European Search of European Patent Office dated Nov. 23, 2021.
EP-19743701.5 Extended European Search Report of European Patent Office dated Nov. 24, 2021.
EP19771688.9 Extended European Search Report of European Patent Office dated Dec. 2, 2021.
EP19771688.9 Notification of the First Office Action dated Mar. 6, 2023.
EP-19825448.4 Extended European Search Report of European Patent Office dated Mar. 10, 2022.
EP-19881483.2 Extended European Search Report of European Patent Office dated Aug. 5, 2022.
EP-20754927.0 Extended European Search Report of European Patent Office dated Sep. 19, 2022.
EP-20835231.0 Extended European Search Report of European Patent Office dated May 15, 2023.
Gass, et al. "Privacy LCD Technology for Cellular Phones", Sharp Laboratories of Europe Ltd, Mobile LCD Group, Feb. 2007, pp. 45-49.
Ishikawa, T., "New Design for a Highly Collimating Turning Film", SID 06 Digest, pp. 514-517.
JP2019-561773 Non-Final Notice of Reasons for Rejection dated Mar. 22, 2022.
JP2020-509511 Non-Final Notice of Reasons for Rejection dated Jul. 19, 2022.
JP2020-540724 Non-Final Notice of Reasons for Rejection dated Jan. 4, 2023.
JP-2020-540797 Non-Final Notice of Reasons for Rejection from the Japan Patent Office mailed Dec. 6, 2022.
JP2020-550747 Non-Final Notice of Reasons for Rejection dated Mar. 29, 2023.
Kalantar, et al. "Backlight Unit With Double Surface Light Emission," J. Soc. Inf. Display, vol. 12, Issue 4, pp. 379-387 (Dec. 2004).
KR10-2020-7010753 Notice of Preliminary Rejection mailed Feb. 17, 2023.
Nelkon et al., "Advanced Level Physics", Third edition with SI units, Heinemann Educational Books LTD, London, 1970.
PCT/US2016/058695 International search report and written opinion of the international searching authority mailed Feb. 28, 2017.
PCT/US2017/032734 International search report and written opinion of the international searching authority mailed Jul. 27, 2017.
PCT/US2018/031206 International search report and written opinion of the international searching authority mailed Jul. 20, 2018.
PCT/US2018/031218 International search report and written opinion of the international searching authority mailed Jul. 19, 2018.
PCT/US2018/051021 International search report and written opinion of the international searching authority mailed Nov. 21, 2018.
PCT/US2018/051027 International search report and written opinion of the international searching authority mailed Nov. 30, 2018.
PCT/US2018/053328 International search report and written opinion of the international searching authority mailed Nov. 30, 2018.
PCT/US2018/059249 International search report and written opinion of the international searching authority mailed Jan. 3, 2019.
PCT/US2018/059256 International search report and written opinion of the international searching authority mailed Jan. 3, 2019.
PCT/US2019/014889 International search report and written opinion of the international searching authority mailed May 24, 2019.
PCT/US2019/014902 International search report and written opinion of the international searching authority mailed Jun. 25, 2019.
PCT/US2019/023659 International search report and written opinion of the international searching authority mailed Jun. 10, 2019.
PCT/US2019/038409 International search report and written opinion of the international searching authority mailed Sep. 19, 2019.
PCT/US2019/038466 International search report and written opinion of the international searching authority mailed Nov. 5, 2019.
PCT/US2019/042027 International search report and written opinion of the international searching authority mailed Oct. 15, 2019.
PCT/US2019/054291 International search report and written opinion of the international searching authority mailed Jan. 6, 2020.
CN202080089170.5 Notification of the First Office Action dated Apr. 7, 2024.
EP23218625.4 Extended European Search Report of European Patent Office dated Feb. 23, 2024.
JP2022-506340 Non-Final Notice of Reasons for Rejection dated Mar. 19, 2024.
EP21795524.4 Extended European Search Report of European Patent Office dated Apr. 26, 2024.

(56) References Cited

OTHER PUBLICATIONS

EP21796016.0 Extended European Search Report of European Patent Office dated Apr. 29, 2024.
EP21849510.9 Extended European Search Report of European Patent Office dated Jun. 19, 2024.
Heber, "Switchable View Control using a Vertically Aligned Polarizer and Polarization Control", 31-2, siOPTICA GmbH, SID 2024 Digest, Jena, Germany, ISSN 0097-996X/24/5501, pp. 398-401.
JP2022-526302 Non-Final Notice of Reasons for Rejection dated Apr. 30, 2024.
CN201980056022.0 Notification of the Second Office Action dated Jul. 26, 2024.
CN202080079843.9 Notification of the First Office Action dated Jul. 18, 2024.
EP21849888.9 Extended European Search Report of European Patent Office dated Jul. 1, 2024.
KR10-2020-7024291 Notice of Preliminary Rejection mailed Jun. 13, 2024.
PCT/US2024/020519 International search report and written opinion of the international searching authority mailed Jun. 17, 2024.
EP20835231.0 Notification of the First Office Action dated Nov. 27, 2024.
KR10-2022-7019753 Notice of Preliminary Rejection mailed Oct. 30, 2024.
CN202080089170.5 Notification of the Second Office Action dated Oct. 17, 2024.
PCT/US2024/025836 International search report and written opinion of the international searching authority mailed Jul. 23, 2024.

\* cited by examiner

DISPLAY DEVICE WITH UNIFORM OFF-AXIS LUMINANCE REDUCTION

TECHNICAL FIELD

This disclosure generally relates to luminance uniformity in display devices.

BACKGROUND

Display devices may be configured to reduce luminance in directions offset from a viewing axis, typically normal to the display device. Such off-axis luminance reduction may have various purposes. In one example, off-axis luminance reduction may be applied in a privacy display to provide visibility of a displayed image to a primary user in an on-axis position and reduce visibility of the displayed image to a snooper in an off-axis position. In another example off-axis luminance reduction may be applied to reduce stray light that may otherwise cause unwanted reflections in an environment around the display device, for example within an automobile.

A privacy function may be provided by micro-louvre optical films that transmit a high luminance from a display device in an on-axis direction with low luminance in off-axis positions. However such films are not switchable, and thus the display is limited to privacy only function.

Switchable privacy displays may be provided by implementing control of the off-axis optical output. Control of off-axis privacy may be provided by means of contrast reduction, for example by adjusting the liquid crystal bias tilt in an In-Plane-Switching LCD.

Control may be further provided by means of off-axis luminance reduction. Luminance reduction may be achieved by means of switchable backlights for a liquid crystal display (LCD) spatial light modulator. Off-axis luminance reduction may also be provided by switchable liquid crystal retarders and compensation retarders arranged to modulate the input and/or output directional luminance profile of a spatial light modulator.

Control may be further provided by means of off-axis reflectivity increase. Reflectivity increase may be achieved by means of switchable liquid crystal retarders, compensation retarders that are arranged to control the polarisation of ambient light that falls onto a reflective polariser.

However, in operation such off-axis luminance reduction may provide non-uniformity of luminance across the area of the display device for display viewers. For many applications, it would be desirable to increase the perceived uniformity.

BRIEF SUMMARY

According to the present disclosure, there is provided a display device comprising: a spatial light modulator; a display polariser arranged on a side of the spatial light modulator, the display polariser being a linear polariser; an additional polariser arranged on the same side of the spatial light modulator as the display polariser, the additional polariser being a linear polariser; and at least one polar control retarder arranged between the additional polariser and the display polariser, the at least one polar control retarder includes a liquid crystal retarder comprising: a layer of liquid crystal material; and two surface alignment layers disposed adjacent to the layer of liquid crystal material and on opposite sides thereof, at least one of the surface alignment layers being arranged to provide alignment in the adjacent liquid crystal material with an in-plane component that is in the plane of the layer of liquid crystal material, wherein the angle of said in-plane component of the alignment in the adjacent liquid crystal material changes monotonically along a predetermined axis across at least part of the display device. Advantageously, a display device may be provided which reduces changes in luminance across at least part of the display device as perceived by a viewer in a predetermined position, in at least one state of the liquid crystal material. For example, for an off-axis viewer, e.g. a snooper, the display device may provide a more uniform luminance across at least part of the display, e.g. across the width of the display. In such cases, the luminance may be a uniform reduced luminance such that the off-axis viewer cannot observe any image output by the display device at any point along the display device. In a similar manner, for an on-axis viewer, e.g. the primary user of the display device, the display device may also provide a more uniform luminance across at least part of the display for the on-axis viewer. Such uniform luminance across at least part of the display device may be a non-reduced, or observable, luminance such that the on-axis viewer can observe the image output by the display. This may therefore reduce the "roll-off" which occurs on prior art displays whereby the luminance reduces towards the edges of the display for an on-axis viewer.

The angle of said in-plane component of the alignment in the adjacent liquid crystal material may change monotonically along the predetermined axis across at least part of the display device and not change along further axes perpendicular to the predetermined axis.

Said in-plane component of the alignment in the adjacent liquid crystal material may have a mean direction that is parallel or orthogonal to the electric vector transmission directions of at least one of the display polariser and the additional polariser. Advantageously head-on users may have increased luminance and image uniformity.

The display polariser and the additional polariser have electric vector transmission directions that are parallel. Advantageously transmission at desirable viewing angles from the display is increased.

Alternatively, the angle of said in-plane component of the alignment in the adjacent liquid crystal material may change monotonically along the predetermined axis across at least part of the display device and also change along a further axis perpendicular to the predetermined axis. Advantageously, it may be possible to reduce changes in luminance across at least part of the display device in two directions perpendicular to one another. This may, for example, make it possible to create uniform luminance for an off-axis viewer in two different directions relative to the display device, e.g. for an off-axis viewer to the side of the display device and for an off-axis viewer at an angle above or below the display device. When used to provide uniform reduced luminance, this may therefore improve the privacy achieved by the display device.

At least one of the surface alignment layers may be arranged to provide homogenous alignment in the adjacent liquid crystal material. Further, each of the surface alignment layers may be arranged to provide homogenous alignment in the adjacent liquid crystal material.

At least one of the surface alignment layers may be arranged to provide homeotropic alignment in the adjacent liquid crystal material with a pretilt providing said in-plane component.

One of the surface alignment layers may be arranged to provide homogeneous alignment in the adjacent liquid crystal material, wherein the angle of said in-plane component of the alignment in the liquid crystal material adjacent to said one of the surface alignment layers may change monotonically along the predetermined axis across at least part of the display device, and the other of the surface alignment layers may be arranged to provide homeotropic alignment in the adjacent liquid crystal material, wherein the angle of said in-plane component of the alignment in the liquid crystal material adjacent to said other of the surface alignment layers may not change along the predetermined axis across at least part of the display device. Advantageously complexity of construction may be reduced. Homogeneous alignment layers may be more conveniently provided with controlled alignment directions. Increased size of polar region with reduction of luminance and increase of reflectance may be achieved.

Each of the surface alignment layers may be arranged to provide alignment in the adjacent liquid crystal material with respective in-plane components that are in the plane of the layer of liquid crystal material, wherein the angles of said in-plane components of the alignment in the adjacent liquid crystal material changes monotonically along the predetermined axis across at least part of the display device.

The angle of said in-plane component of the alignment in the adjacent liquid crystal material may change monotonically along the predetermined axis across at least part of the display device so that directions of maximum light transmission of the display polariser, the additional polariser and said at least one polar control retarder from points of said at least part of the display device may be directed towards a common optical window in front of the display device. Advantageously uniformity of an image may be increased for a display user and uniformity of security level may be increased for a snooper.

The angle of said in-plane component of the alignment in the adjacent liquid crystal material may change monotonically along a predetermined axis across the entire display device. Advantageously complexity and cost may be reduced. Uniformity may be increased across the entire display device.

The angle of said in-plane component of the alignment in the adjacent liquid crystal material may change monotonically along a predetermined axis across a first part of the display device. Advantageously the uniformity across the first part of the display device for a user of that part of the display device may be increased. Further the uniformity of the security level may be increased for a snooper of the first part of the display device.

The angle of said in-plane component of the alignment in the adjacent liquid crystal material may also change monotonically along a predetermined axis across a second part of the display device. The angle of said in-plane component of the alignment in the adjacent liquid crystal material may change monotonically along the predetermined axis across the first part of the display device so that directions of maximum light emission from points of the first part of the display device may be directed towards a first common optical window in front of the display device, and the angle of said in-plane component of the alignment in the adjacent liquid crystal material may change monotonically along the predetermined axis across the second part of the display device so that directions of maximum light emission from points of the second part of the display device may be directed towards a second common optical window in front of the display device different from the first common optical window. Advantageously the uniformity across the second part of the display device for a user of that part of the display device may be increased. Further the uniformity of the security level may be increased for a snooper of the second part of the display device. A central display for an automotive vehicle may be arranged with first and second privacy regions for passengers and drivers.

The additional polariser and the at least one polar control retarder may be curved with a concave curvature. The spatial light modulator may be curved with a concave curvature. The additional polariser, the at least one polar control retarder and optionally the spatial light modulator may be curved with a concave curvature. Advantageously, the changes in luminance across the display device, both for an off-axis and on-axis viewer, may further be reduced.

The liquid crystal retarder may be a switchable liquid crystal retarder further comprising electrodes arranged to apply a voltage for controlling the liquid crystal layer.

The display device may further comprise a control system arranged to control the voltage applied to the electrodes of the switchable liquid crystal retarder.

The at least one polar control retarder may further comprise at least one passive compensation retarder.

The spatial light modulator may be an emissive spatial light modulator and the display polariser may be an output polariser arranged on an output side of the emissive spatial light modulator.

The spatial light modulator may be a transmissive spatial light modulator. Further, the display polariser may be an output polariser arranged on an output side of the transmissive spatial light modulator.

The display device may further comprise a reflective polariser arranged between the output polariser and the at least one polar control retarder, the reflective polariser being a linear polariser arranged to pass the same linearly polarised polarisation component as the output polariser.

The display device may further comprise: an input polariser arranged on the input side of the spatial light modulator, the input polariser being a linear polariser; a further additional polariser arranged on the input side of the input polariser; and at least one further polar control retarder arranged between the output polariser and the additional polariser, the at least one polar control retarder includes a liquid crystal retarder comprising: a layer of liquid crystal material; and two surface alignment layers disposed adjacent to the layer of liquid crystal material and on opposite sides thereof, at least one of the surface alignment layers being arranged to provide alignment in the adjacent liquid crystal material with an in-plane component that is in the plane of the layer of liquid crystal material, wherein the angle of said in-plane component of the alignment in the adjacent liquid crystal material changes monotonically along the predetermined axis across at least part of the display device.

Advantageously through the user of a further polar control retarder and associated polarisers, it may be possible to further reduce the luminance of light for an off-axis viewer thereby further improving the privacy function of the display device. Each of the polar control retarders, together with their associated polarisers, may independently reduce the luminance in an off-axis direction. Together the two polar control retarders and their associated polarisers may have a multiplicative effect in reducing the off-axis luminance. This may therefore significantly reduce the luminance for an off-axis viewer.

Embodiments of the present disclosure may be used in a variety of optical systems. The embodiments may include or work with a variety of projectors, projection systems, optical components, displays, microdisplays, computer systems, processors, self-contained projector systems, visual and/or audio-visual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which.

DETAILED DESCRIPTION

Figure 1A:
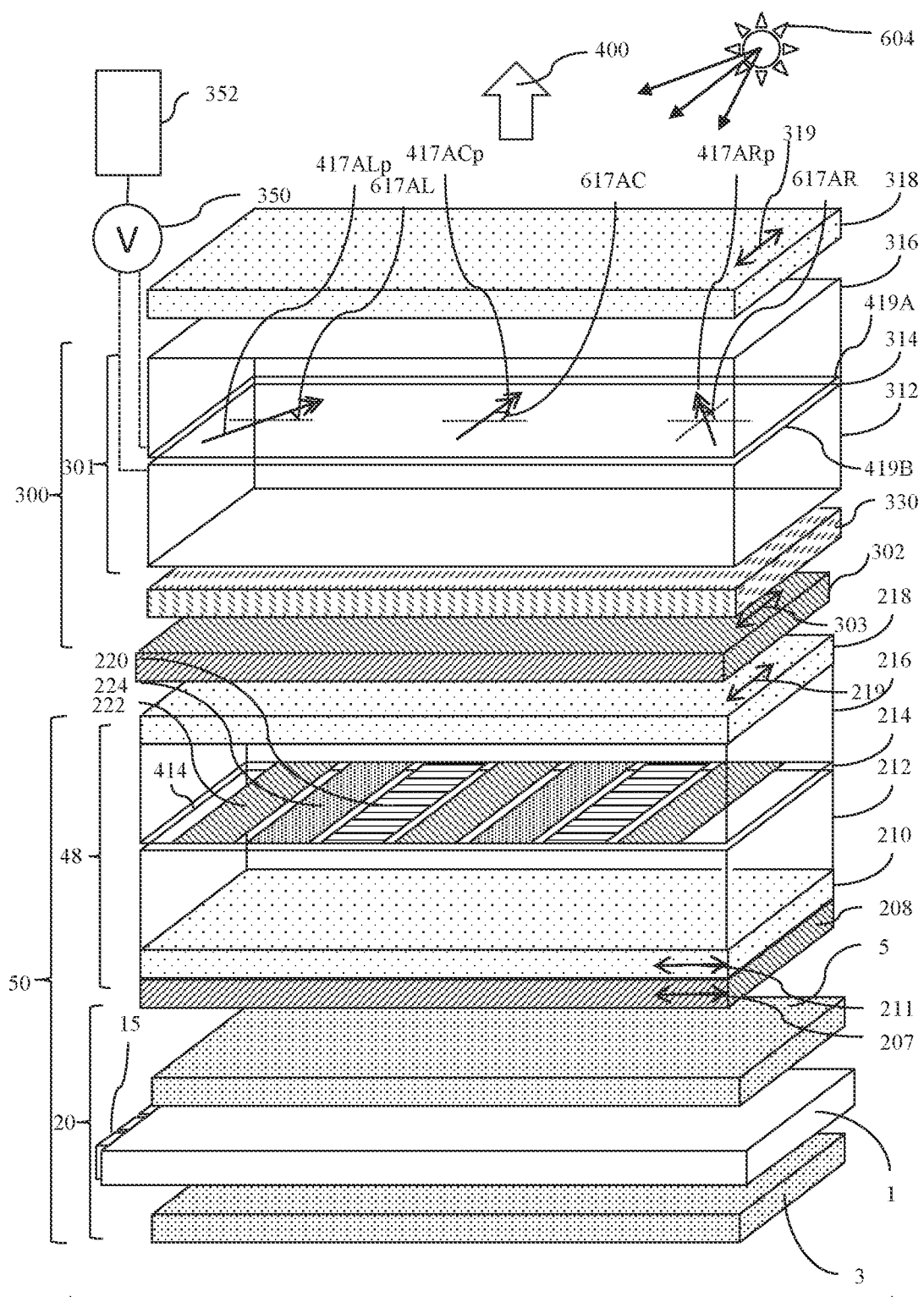
FIG. 1A is a side perspective view of a transmissive display device providing uniformity in reduction of luminance in directions.

Terms related to optical retarders for the purposes of the present disclosure will now be described.

In a layer comprising a uniaxial birefringent material there is a direction governing the optical anisotropy whereas all directions perpendicular to it (or at a given angle to it) have equivalent birefringence.

The optical axis of an optical retarder refers to the direction of propagation of a light ray in the uniaxial birefringent material in which no birefringence is experienced. This is different from the optical axis of an optical system which may for example be parallel to a line of symmetry or normal to a display surface along which a principal ray propagates.

For light propagating in a direction orthogonal to the optical axis, the optical axis is the slow axis when linearly polarized light with an electric vector direction parallel to the slow axis travels at the slowest speed. The slow axis direction is the direction with the highest refractive index at the design wavelength. Similarly the fast axis direction is the direction with the lowest refractive index at the design wavelength.

For positive dielectric anisotropy uniaxial birefringent materials the slow axis direction is the extraordinary axis of the birefringent material. For negative dielectric anisotropy uniaxial birefringent materials the fast axis direction is the extraordinary axis of the birefringent material.

The terms half a wavelength and quarter a wavelength refer to the operation of a retarder for a design wavelength $\lambda_0$ that may typically be between 500 nm and 570 nm. In the present illustrative embodiments exemplary retardance values are provided for a wavelength of 550 nm unless otherwise specified.

The retarder provides a phase shift between two perpendicular polarization components of the light wave incident thereon and is characterized by the amount of relative phase, Γ, that it imparts on the two polarization components; which is related to the birefringence Δn and the thickness d of the retarder by $$\Gamma = 2\cdot\pi\cdot\Delta n\cdot d/\lambda_0 \qquad \text{eqn.1}$$

In eqn. 1, Δn is defined as the difference between the extraordinary and the ordinary index of refraction, i.e.

$$\Delta n = n_e - n_o \qquad \text{eqn. 2}$$

For a half-wave retarder, the relationship between d, Δn, and $\lambda_0$ is chosen so that the phase shift between polarization components is Γ=π. For a quarter-wave retarder, the relationship between d, Δn, and $\lambda_0$ is chosen so that the phase shift between polarization components is Γ=π/2.

The term half-wave retarder herein typically refers to light propagating normal to the retarder and normal to the spatial light modulator.

Some aspects of the propagation of light rays through a transparent retarder between a pair of polarisers will now be described.

The state of polarisation (SOP) of a light ray is described by the relative amplitude and phase shift between any two orthogonal polarization components. Transparent retarders do not alter the relative amplitudes of these orthogonal polarisation components but act only on their relative phase. Providing a net phase shift between the orthogonal polarisation components alters the SOP whereas maintaining net relative phase preserves the SOP. In the current description, the SOP may be termed the polarisation state.

A linear SOP has a polarisation component with a non-zero amplitude and an orthogonal polarisation component which has zero amplitude.

A linear polariser transmits a unique linear SOP that has a linear polarisation component parallel to the electric vector transmission direction of the linear polariser and attenuates light with a different SOP.

Absorbing polarisers are polarisers that absorb one polarisation component of incident light and transmit a second orthogonal polarisation component. Examples of absorbing linear polarisers are dichroic polarisers.

Reflective polarisers are polarisers that reflect one polarisation component of incident light and transmit a second orthogonal polarisation component. Examples of reflective polarisers that are linear polarisers are multilayer polymeric film stacks such as DBEF™ or APF™ from 3M Corporation, or wire grid polarisers such as ProFlux™ from Moxtek. Reflective linear polarisers may further comprise cholesteric reflective materials and a quarter waveplate arranged in series.

A retarder arranged between a linear polariser and a parallel linear analysing polariser that introduces no relative net phase shift provides full transmission of the light other than residual absorption within the linear polariser.

A retarder that provides a relative net phase shift between orthogonal polarisation components changes the SOP and provides attenuation at the analysing polariser.

In the present disclosure an 'A-plate' refers to an optical retarder utilizing a layer of birefringent material with its optical axis parallel to the plane of the layer.

A 'positive A-plate' refers to positively birefringent A-plates, i.e. A-plates with a positive $\Delta n$.

In the present disclosure a 'C-plate' refers to an optical retarder utilizing a layer of birefringent material with its optical axis perpendicular to the plane of the layer. A 'positive C-plate' refers to positively birefringent C-plate, i.e. a C-plate with a positive $\Delta n$. A 'negative C-plate' refers to negatively birefringent C-plates, i.e. C-plates with a negative $\Delta n$.

'O-plate' refers to an optical retarder utilizing a layer of birefringent material with its optical axis having a component parallel to the plane of the layer and a component perpendicular to the plane of the layer. A 'positive O-plate' refers to positively birefringent O-plates, i.e. O-plates with a positive $\Delta n$.

Achromatic retarders may be provided wherein the material of the retarder is provided with a retardance $\Delta n \cdot d$ that varies with wavelength $\lambda$ as $$\Delta n \cdot d / \lambda = \kappa \qquad \text{eqn.3}$$

where $\kappa$ is substantially a constant.

Examples of suitable materials include modified polycarbonates from Teijin Films. Achromatic retarders may be provided in the present embodiments to advantageously minimise color changes between polar angular viewing directions which have low luminance reduction and polar angular viewing directions which have increased luminance reductions as will be described below.

Various other terms used in the present disclosure related to retarders and to liquid crystals will now be described.

A liquid crystal cell has a retardance given by $\Delta n \cdot d$ where $\Delta n$ is the birefringence of the liquid crystal material in the liquid crystal cell and d is the thickness of the liquid crystal cell, independent of the alignment of the liquid crystal material in the liquid crystal cell.

Homogeneous alignment refers to the alignment of liquid crystals in switchable liquid crystal displays where molecules align substantially parallel to a substrate. Homogeneous alignment is sometimes referred to as planar alignment. Homogeneous alignment may typically be provided with a small pre-tilt such as 2 degrees, so that the molecules at the surfaces of the alignment layers of the liquid crystal cell are slightly inclined as will be described below. Pretilt is arranged to minimise degeneracies in switching of cells.

In the present disclosure, homeotropic alignment is the state in which rod-like liquid crystalline molecules align substantially perpendicularly to the substrate. In discotic liquid crystals homeotropic alignment is defined as the state in which an axis of the column structure, which is formed by disc-like liquid crystalline molecules, aligns perpendicularly to a surface. In homeotropic alignment, pretilt is the tilt angle of the molecules that are close to the alignment layer and is typically close to 90 degrees and for example may be 88 degrees.

In a twisted liquid crystal layer a twisted configuration (also known as a helical structure or helix) of nematic liquid crystal molecules is provided. The twist may be achieved by means of a non-parallel alignment of alignment layers. Further, cholesteric dopants may be added to the liquid crystal material to break degeneracy of the twist direction (clockwise or anti-clockwise) and to further control the pitch of the twist in the relaxed (typically undriven) state. A supertwisted liquid crystal layer has a twist of greater than 180 degrees. A twisted nematic layer used in spatial light modulators typically has a twist of 90 degrees.

Liquid crystal molecules with positive dielectric anisotropy are switched from a homogeneous alignment (such as an A-plate retarder orientation) to a homeotropic alignment (such as a C-plate or O-plate retarder orientation) by means of an applied electric field.

Liquid crystal molecules with negative dielectric anisotropy are switched from a homeotropic alignment (such as a C-plate or O-plate retarder orientation) to a homogeneous alignment (such as an A-plate retarder orientation) by means of an applied electric field.

Rod-like molecules have a positive birefringence so that $n_e > n_o$ as described in eqn. 2. Discotic molecules have negative birefringence so that $n_e < n_o$.

Positive retarders such as A-plates, positive O-plates and positive C-plates may typically be provided by stretched films or rod-like liquid crystal molecules. Negative retarders such as negative C-plates may be provided by stretched films or discotic like liquid crystal molecules.

Parallel liquid crystal cell alignment refers to the alignment direction of homogeneous alignment layers being parallel or more typically antiparallel. In the case of pre-tilted homeotropic alignment, the alignment layers may have components that are substantially parallel or antiparallel.

Hybrid aligned liquid crystal cells may have one homogeneous alignment layer and one homeotropic alignment layer. Twisted liquid crystal cells may be provided by alignment layers that do not have parallel alignment, for example oriented at 90 degrees to each other.

Transmissive spatial light modulators may further comprise retarders between the input display polariser and the output display polariser for example as disclosed in U.S. Pat. No. 8,237,876, which is herein incorporated by reference in its entirety. Such retarders (not shown) are in a different place to the passive retarders of the present embodiments. Such retarders compensate for contrast degradations for off-axis viewing locations, which is a different effect to the luminance reduction for off-axis viewing positions of the present embodiments.

A private mode of operation of a display is one in which an observer sees a low contrast sensitivity such that an image is not clearly visible. Contrast sensitivity is a measure of the ability to discern between luminances of different levels in a static image. Inverse contrast sensitivity may be used as a measure of visual security, in that a high visual security level (VSL) corresponds to low image visibility.

For a privacy display providing an image to an observer, visual security may be given as:

$$V=(Y+R)/(Y-K) \qquad \text{eqn. 4}$$

where V is the visual security level (VSL), Y is the luminance of the white state of the display at a snooper viewing angle, K is the luminance of the black state of the display at the snooper viewing angle and R is the luminance of reflected light from the display.

Panel contrast ratio is given as:

$$C=Y/K \qquad \text{eqn. 5}$$

so the visual security level may be further given as:

$$V=(P \cdot Y_{max}+I \cdot \rho/\pi)/(P \cdot (Y_{max}-Y_{max}/C)) \qquad \text{eqn. 6}$$

where: $Y_{max}$ is the maximum luminance of the display; P is the off-axis relative luminance typically defined as the ratio of luminance at the snooper angle to the maximum luminance $Y_{max}$; C is the image contrast ratio; $\rho$ is the surface reflectivity; and l is the illuminance. The units of $Y_{max}$ are the units of I divided by solid angle in units of steradian.

The luminance of a display varies with angle and so the maximum luminance of the display $Y_{max}$ occurs at a particular angle that depends on the configuration of the display.

In many displays, the maximum luminance $Y_{max}$ occurs head-on, i.e. normal to the display. Any display device disclosed herein may be arranged to have a maximum luminance $Y_{max}$ that occurs head-on, in which case references to the maximum luminance of the display device $Y_{max}$ may be replaced by references to the luminance normal to the display device.

Alternatively, any display described herein may be arranged to have a maximum luminance $Y_{max}$ that occurs at a polar angle to the normal to the display device that is greater than 0°. By way of example, the maximum luminance $Y_{max}$ may occur may at a non-zero polar angle and at an azimuth angle that has for example zero lateral angle so that the maximum luminance is for an on-axis user that is looking down on to the display device. The polar angle may for example be 10 degrees and the azimuthal angle may be the northerly direction (90 degrees anti-clockwise from easterly direction). The viewer may therefore desirably see a high luminance at typical non-normal viewing angles.

The off-axis relative luminance, P is sometimes referred to as the privacy level. However, such privacy level P describes relative luminance of a display at a given polar angle compared to head-on luminance, and in fact is not a measure of privacy appearance.

The illuminance, I is the luminous flux per unit area that is incident on the display and reflected from the display towards the observer location. For Lambertian illuminance, and for displays with a Lambertian front diffuser illuminance I is invariant with polar and azimuthal angles. For arrangements with a display with non-Lambertian front diffusion arranged in an environment with directional (non-Lambertian) ambient light, illuminance I varies with polar and azimuthal angle of observation.

Thus in a perfectly dark environment, a high contrast display has VSL of approximately 1.0. As ambient illuminance increases, the perceived image contrast degrades, VSL increases and a private image is perceived.

For typical liquid crystal displays the panel contrast C is above 100:1 for almost all viewing angles, allowing the visual security level to be approximated to:

$$V=1+I \cdot \rho/(\pi \cdot P \cdot Y_{max}) \qquad \text{eqn. 7}$$

In the present embodiments, in addition to the exemplary definition of eqn. 4, other measurements of visual security level, V may be provided, for example to include the effect on image visibility to a snooper of snooper location, image contrast, image colour and white point and subtended image feature size. Thus the visual security level may be a measure of the degree of privacy of the display but may not be restricted to the parameter V.

The perceptual image security may be determined from the logarithmic response of the eye, such that $$S=\log_{10}(V) \qquad \text{eqn. 8}$$

Desirable limits for S were determined in the following manner. In a first step a privacy display device was provided. Measurements of the variation of privacy level, P(θ) of the display device with polar viewing angle and variation of reflectivity ρ(θ) of the display device with polar viewing angle were made using photopic measurement equipment. A light source such as a substantially uniform luminance light box was arranged to provide illumination from an illuminated region that was arranged to illuminate the privacy display device along an incident direction for reflection to a viewer position at a polar angle of greater than 0° to the normal to the display device. The variation I(θ) of illuminance of a substantially Lambertian emitting lightbox with polar viewing angle was determined by and measuring the variation of recorded reflective luminance with polar viewing angle taking into account the variation of reflectivity ρ(θ). The measurements of P(θ), r(θ) and I(θ) were used to determine the variation of Security Factor S(θ) with polar viewing angle along the zero elevation axis.

In a second step a series of high contrast images were provided on the privacy display including (i) small text images with maximum font height 3 mm, (ii) large text images with maximum font height 30 mm and (iii) moving images.

In a third step each observer (with eyesight correction for viewing at 1000 mm where appropriate) viewed each of the images from a distance of 1000 m, and adjusted their polar angle of viewing at zero elevation until image invisibility was achieved for one eye from a position near on the display at or close to the centre-line of the display. The polar location of the observer's eye was recorded. From the relationship S(θ), the security factor at said polar location was determined. The measurement was repeated for the different images, for various display luminance $Y_{max}$, different lightbox illuminance $I(\theta=0)$, for different background lighting conditions and for different observers.

From the above measurements S<1.0 provides low or no visual security, 1.0≤S<1.5 provides visual security that is dependent on the contrast, spatial frequency and temporal frequency of image content, 1.5≤S<1.8 provides acceptable image invisibility (that is no image contrast is observable) for most images and most observers and S≥1.8 provides full image invisibility, independent of image content for all observers.

In practical display devices, this means that it is desirable to provide a value of S for an off-axis viewer who is a snooper that meets the relationship S≥$S_{min}$, where: $S_{min}$ has a value of 1.0 or more to achieve the effect that the off-axis viewer cannot perceive the displayed image; $S_{min}$ has a value of 1.5 or more to achieve the effect that the displayed image is invisible, i.e. the viewer cannot perceive even that an image is being displayed, for most images and most observers; or $S_{min}$ has a value of 1.8 or more to achieve the effect that the displayed image is invisible independent of image content for all observers.

In comparison to privacy displays, desirably wide angle displays are easily observed in standard ambient illuminance conditions. One measure of image visibility is given by the contrast sensitivity such as the Michelson contrast which is given by:

$$M=(I_{max}-I_{min})/(I_{max}+I_{min}) \qquad \text{eqn. 9}$$

and so:

$$M=((Y+R)-(K+R))/((Y+R)+(K+R))=(Y-K)/(Y+K+2\cdot R) \qquad \text{eqn. 10}$$

Thus the visual security level (VSL), V is equivalent (but not identical to) 1/M. In the present discussion, for a given off-axis relative luminance, P the wide angle image visibility, W is approximated as $$W=1/V=1/(1+I\cdot\rho/(\pi\cdot P\cdot Y_{max})) \qquad \text{eqn. 11}$$

The above discussion focusses on reducing visibility of the displayed image to an off-axis viewer who is a snooper, but similar considerations apply to visibility of the displayed image to the intended user of the display device who is typically on-axis. In this case, decrease of the level of the visual security level (VSL) V corresponds to an increase in the visibility of the image to the viewer. During observation S<0.1 may provide acceptable visibility of the displayed image. In practical display devices, this means that it is desirable to provide a value of S for an on-axis viewer who is the intended user of the display device that meets the relationship S≤$S_{max}$, where $S_{max}$ has a value of 0.1.

In the present discussion the colour variation Δε of an output colour ($u_w'+\Delta u'$, $v_w'+\Delta v'$) from a desirable white point ($u_w'$, $v_w'$) may be determined by the CIELUV colour difference metric, assuming a typical display spectral illuminant and is given by:

$$\Delta\varepsilon=(\Delta u'^2+\Delta v'^2)^{1/2} \qquad \text{eqn. 12}$$

Switchable directional display apparatuses for use in privacy display for example and comprising plural retarders arranged between a display polariser and an additional polariser are described in U.S. Patent Publ. No. 2019-0086706, U.S. Patent Publ. No. 2019-0250458, U.S. Patent Publ. No. 2020-0225402, and WIPO Publ. No. 2019-055755, all of which are herein incorporated by reference in their entireties. Directional display apparatuses further comprising reflective polarisers arranged between the display polariser and retarders are described in U.S. Patent Publ. No. 2019-0250458 and in U.S. Patent Publ. No. 2019-0227366, both of which are herein incorporated by reference in their entireties. Directional display polarisers comprising passive retarders arranged between a display polariser and an additional polariser are described U.S. Patent Publ. No. 2018-0321553, which is herein incorporated by reference in its entirety.

Curvature is a property of a line that is curved and for the present disclosure is the inverse radius of curvature. A planar surface has a curvature of zero.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

Figure 1B:
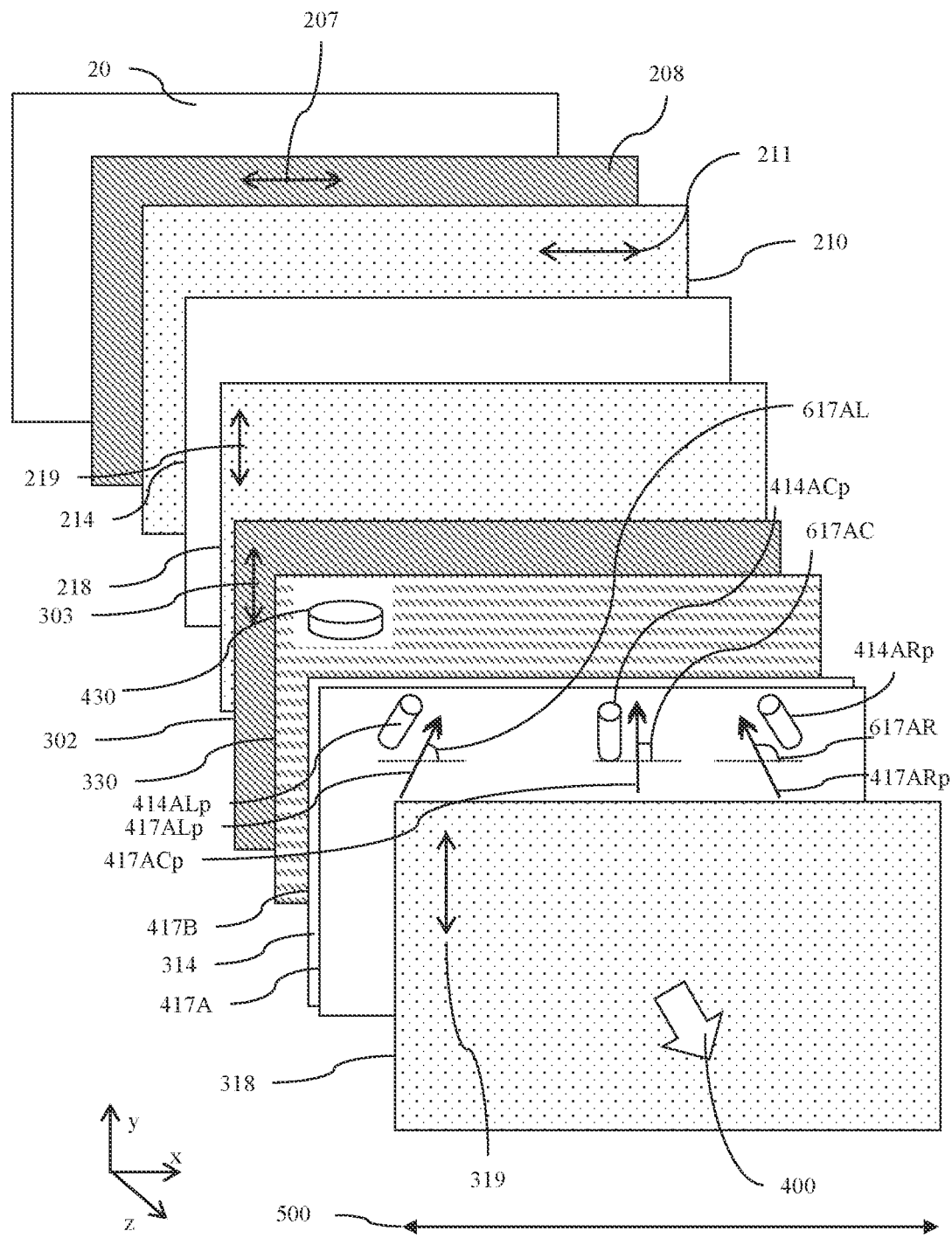
FIG. 1B is a front view of the stack of layers of the display device of FIG. 1A.

FIG. 1A is a side perspective view of a display device 100 providing uniformity in reduction of luminance in directions; and FIG. 1B is a front view of the stack of layers of the display device of FIG. 1A. Features of the arrangement of FIG. 1B not discussed in further detail may be assumed to correspond to the features with equivalent reference numerals of FIG. 1A, including any potential variations in the features.

FIG. 1A illustrates the display device 100, for use in ambient illumination 604, which comprises a spatial light modulator (SLM) 48 arranged to output light 400. The SLM 48 comprises an input polariser 210 arranged on the input side of the SLM 48 and an output polariser 218, arranged on the output side of the SLM 48, the input polariser 210 and the output polariser 218 being the two display polarisers of the SLM. The input polariser 210 and the output polariser 218 are each linear polarisers.

The display device 100 also comprises an additional polariser 318 arranged on the output side of the output polariser 218, that is the same side as the output polariser 218, and a reflective polariser 302 arranged between the output polariser 218 and the additional polariser 318. The additional polariser 318 and the reflective polariser 302 are each a linear polariser. Typical polarisers 210, 218, 318 may be polarisers such as dichroic polarisers.

The display device 100 also comprises at least one polar control retarder 300 which is arranged between the additional polariser 318 and the output polariser 218 and wherein the polar control retarder 300 includes a liquid crystal retarder 301. The polar control retarder 300 is also arranged between the reflective polariser 302 and the additional polariser 318. Further, the reflective polariser 302 is arranged between the output polariser 218 and the polar control retarder 300. The electric vector transmission direction 303 of the reflective polariser 302 is parallel to the electric vector transmission direction 319 of the additional polariser 318, i.e. the reflective polariser 302 is a linear polariser arranged to pass the same linearly polarised component as the output polariser 218. The electric vector transmission direction 303 of the reflective polariser 302 is parallel to the electric vector transmission direction 219 of the output polariser 218.

The electric vector transmission direction 211 of the input polariser 210 is orthogonal to the electric vector transmission direction 219 of the output polariser 218. Advantageously the transmission of partially polarised light from the waveguide 1 through the input polariser 210 may be increased.

In the present disclosure, the SLM 48 may comprise a liquid crystal display comprising substrates 212, 216, liquid crystal layer 214 and red, green and blue pixels 220, 222, 224. The output polariser 218 may be arranged to provide high extinction ratio for light from the pixels 220, 222, 224 of the SLM 48 and to prevent back reflections from the reflective polariser 302 towards the pixels 220, 222, 224.

Backlight 20 may be arranged to illuminate the SLM 48, thereby providing a transmissive SLM 48 and may comprise input light sources 15, waveguide 1, rear reflector 3 and optical stack 5 comprising diffusers, light tuning films and other known optical backlight structures. Plural first light sources 15 are shown by way of non-limitative example, but in general there may any number of one or more light sources 15. Asymmetric diffusers, that may comprise asymmetric surface relief features for example, may be provided in the optical stack 5 with increased diffusion in the elevation direction in comparison to the lateral direction may be provided. Advantageously image uniformity may be increased.

The display may further comprise a reflective recirculation polariser 208 arranged between the backlight 20 and the SLM 48. The reflective recirculation polariser 208 is different to the reflective polariser 302 of the present embodiments. Reflective recirculation polariser 208 provides reflection of polarised light from the backlight 20 that has a polarisation that is orthogonal to the electric vector transmission direction of the dichroic input polariser 210. Reflective recirculation polariser 208 does not reflect ambient light 604 to a snooper.

The SLM 48 may alternatively be provided by other display types that provide output light 400 by emission, such as organic LED displays (OLED), with output polariser 218. Output polariser 218 may provide reduction of luminance for light reflected from the OLED pixel plane by means of one of more retarders 518 inserted between the output display polariser 218 and OLED pixel plane. The one or more retarders 518 may be a quarter waveplate and is different to the retarder 330 of the present disclosure.

In the embodiment of FIG. 1, the polar control retarder 300 comprises passive polar control retarder 330, i.e. at least one passive compensation retarder, and a layer of liquid crystal material provided by a switchable liquid crystal retarder. In general, the polar control retarder 300 may comprise any configuration of at least one retarder, some examples of which are present in the devices described below.

The at least one polar control retarder 300 is capable of simultaneously introducing no net relative phase shift to orthogonal polarisation components of light passed by the reflective polariser 302 along an axis along a normal to the plane of the at least one polar control retarder 300 and introducing a relative phase shift to orthogonal polarisation components of light passed by the reflective polariser 302 along an axis inclined to a normal to the plane of the at least one polar control retarder 300. The polar control retarder 300 does not affect the luminance of light passing through the reflective polariser 302, the polar control retarder 300 and the additional polariser 318 along an axis along a normal to the plane of the polar control retarder 300. The polar control retarder 300 does, however, reduce the luminance of light passing therethrough along an axis inclined to a normal to the plane of the polar control retarder 300, at least in one of the switchable states of the switchable retarder 301. The principles leading to this effect are described in greater detail below with reference to FIGS. 23A-25E and arises from the presence or absence of a phase shift introduced by the polar control retarder 300 to light along axes that are angled differently with respect to the liquid crystal material of the polar control retarder 300. A similar effect is achieved in all the devices described below.

The polar control retarder 300 comprises a switchable liquid crystal retarder 301 comprising a layer 314 of liquid crystal material, and substrates 312, 316 arranged between the reflective polariser 302 and the additional polariser 318. Thus the at least one polar control retarder 300 comprises a switchable liquid crystal retarder 301 comprising a layer 314 of liquid crystal material 414, wherein the at least one polar control retarder 300 is arranged, in a switchable state of the switchable liquid crystal retarder 301, simultaneously to introduce no net relative phase shift to orthogonal polarisation components of light passed by the reflective polariser 302 along an axis along a normal to the plane of the at least one polar control retarder 300 and to introduce a net relative phase shift to orthogonal polarisation components of light passed by the reflective polariser 302 along an axis inclined to a normal to the plane of the at least one polar control retarder.

The substrates 312, 316 of the switchable liquid crystal retarder 301 comprise electrodes 413, 415 (illustrated in FIG. 5A) arranged to provide a voltage across the layer 314 of liquid crystal material 414 for controlling the layer 314. A control system 352 is arranged to control the voltage applied, by a voltage driver 350, across the electrodes 413, 415 of the switchable liquid crystal retarder 301.

The polar control retarder further comprises two surface alignment layers 419A, 419B disposed adjacent to the layer 314 of liquid crystal material 414 and on opposite sides thereof. Each of the surface alignment layers 419A, 419B is arranged to provide alignment in the adjacent liquid crystal material 414 with an in-plane component 417Ap, 417Bp respectively that is in the plane of the layer 314 of liquid crystal material 414.

In a region on the left side of the liquid crystal retarder 301 the in-plane component 417ALp on the first alignment layer 419A has an orientation angle 617AL. In a region near the centre of the liquid crystal retarder 301, the in-plane component 417ACp on the first alignment layer 419A has an orientation angle 617AC. In a region on the right side of the liquid crystal retarder 301 the in-plane component 417ARp on the first alignment layer 419A has an orientation angle 617AR.

As will be described further hereinbelow, in a region on the left side of the liquid crystal retarder 301 the in-plane component 417BLp on the second alignment layer 419B has an orientation angle 617BL. In a region near the centre of the liquid crystal retarder 301, the in-plane component 417BCp on the second alignment layer 419B has an orientation angle 617BC. In a region on the right side of the liquid crystal retarder 301 the in-plane component 417BRp on the second alignment layer 419B has an orientation angle 617BR.

In the present embodiments at least one of the angles 617A, 617B of said in-plane component of the alignment in the adjacent liquid crystal material 414 changes monotonically along the predetermined axis across at least part of the display device 100. This will be further described hereinbelow, for example with reference to FIG. 4 below.

As illustrated in FIG. 1B in the case when the SLM 48 is a liquid crystal display, the input electric vector transmission direction 211 at the input polariser 210 provides an input polarisation component that may be transformed by the liquid crystal layer 214 to provide output polarisation component determined by the electric vector transmission direction 219 of the output polariser 218. The electric vector transmission direction of the reflective polariser 302 is parallel to the electric vector transmission direction of the output polariser 218. Further, the electric vector transmission direction of the output polariser 218 and the electric vector transmission direction 303 of the reflective polariser 302 are parallel to the electric vector transmission direction 319 of the additional polariser 318 in this example.

The at least one passive retarder 330, of the at least one polar control retarder 300, is arranged to introduce no net relative phase shift to orthogonal polarisation components of light passed by the reflective polariser 302 along an axis along a normal to the plane of the at least one passive retarder and to introduce a net relative phase shift to orthogonal polarisation components of light passed by the reflective polariser 302 along an axis inclined to a normal to the plane of the at least one passive retarder.

As will be described for example in FIG. 5A hereinbelow, the liquid crystal material 414 is aligned with an in-plane component that is in the plane of the layer 314 of liquid crystal material 414. FIG. 1B illustrates the alignment of liquid crystal material 414 at the alignment layer 417A. The angle 617AL, 617AC, 617AR of said in-plane components 417ALp, 417ACp, 417ARp of the alignment in the adjacent liquid crystal material 414 at the alignment layer 417A of the liquid crystal layer 314 changes monotonically along the predetermined axis 500 across at least part of the display device 100, to provide liquid crystal material 414 molecules 414ALp, 414ACp and 414ARp with varying alignment across alignment layer 417A. When viewed from left to right, the angle 617 of the in-plane component of material 414B increases from approximately 70 degrees for material 414ALp, to 90 degrees at for material 414ACp, to approximately 110 degrees for material 414ARp. In this case, the angle has been determined from the axis 500, rotating counter-clockwise, to the in-plane component of the liquid crystal material 414. Determining the angle 617AL, 617AC, 617AR in this manner results in a monotonically increasing angle. Alternatively, the angle may be determined from the axis 500 in a clockwise direction to the in-plane component of the liquid crystal material. In this case, the angle would be monotonically decreasing.

Passive polar control retarder 330 may comprise retardation layer with a solid birefringent material 430, while switchable liquid crystal retarder 301 may comprise a layer 314 of liquid crystal material 414, as will be described below.

An emissive display device will now be described.

Figure 2:
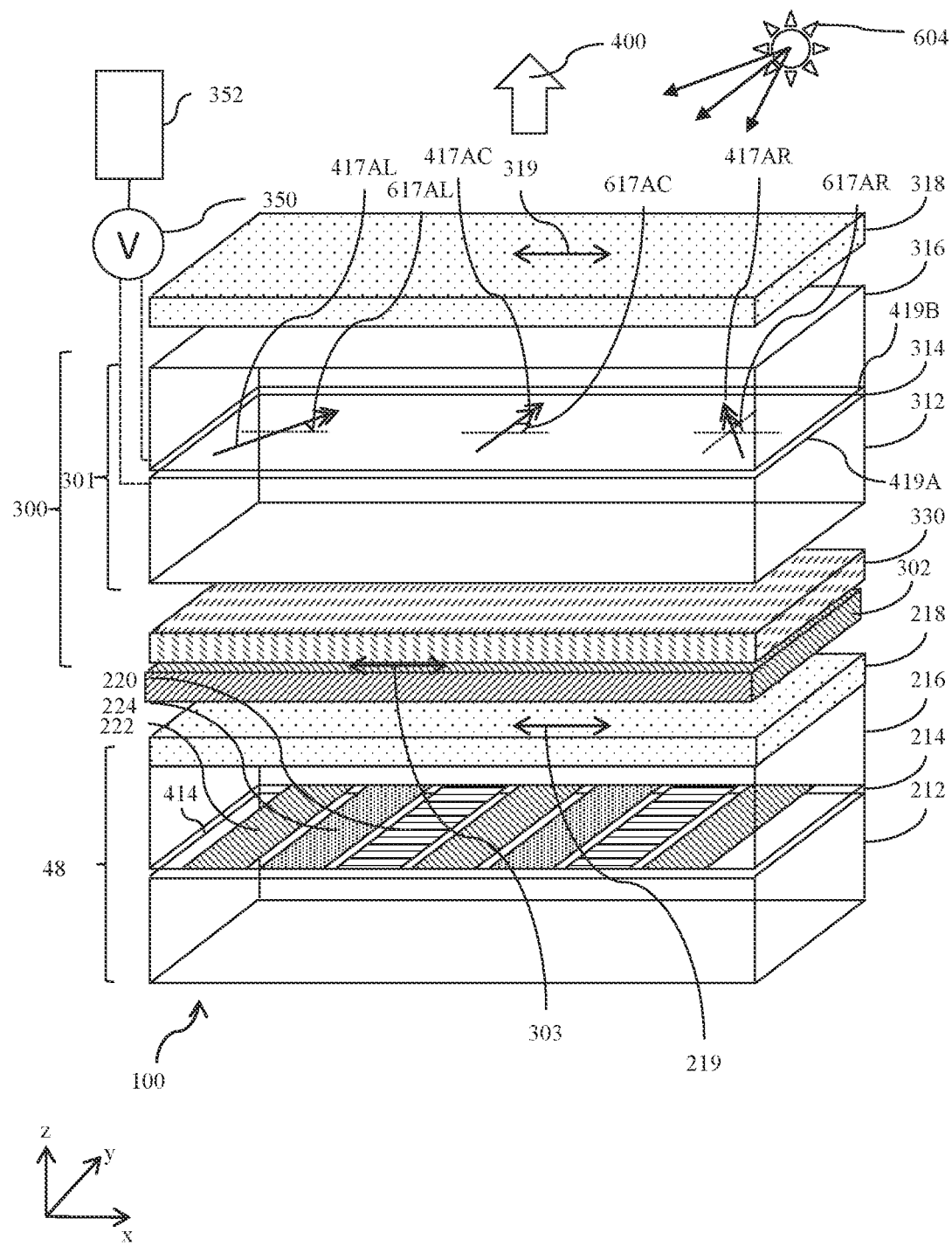
FIG. 2 is a side perspective view of an emissive display device providing uniformity in reduction of luminance in directions.

FIG. 2 is a side perspective view of an emissive display device 100 providing uniformity in reduction of luminance in directions. Features of the arrangement of FIG. 2 not discussed in further detail may be assumed to correspond to the features with equivalent reference numerals as discussed above, including any potential variations in the features.

FIG. 2 is an alternative embodiment wherein the spatial light modulator 48 is an emissive spatial light modulator and the display polariser 218 is an output polariser arranged on an output side of the transmissive spatial light modulator 48. Pixels 220, 222, 224 may be provided by emissive elements such as OLED, micro-LED or other known emitting elements. Advantageously thickness may be reduced in comparison to the embodiment of FIG. 1.

By way of comparison with FIGS. 1A-B. FIG. 2 also illustrates an alternative arrangement wherein the electric vector transmission directions 219, 303, 319 of the output polariser 218, reflective polariser 302 and additional polariser 318 may be orthogonal to the alignment direction with in-plane component 417ACp. The operation of the present embodiments is substantially the same for parallel or orthogonal alignments of the electric vector transmission directions 219, 303, 319 with the said in-plane components 417ACp of the alignment in the adjacent liquid crystal material 414AC. Advantageously the transmission of light through sunglasses with transmission direction parallel to the x-axis may be increased.

Arrangements of alignment layers 419A, 419B will now be further described.

Figure 3A:
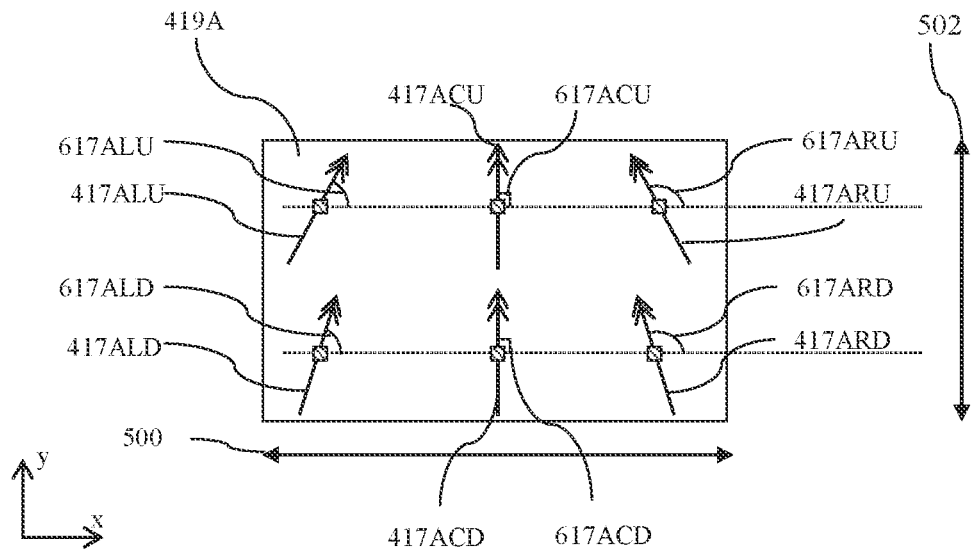
FIG. 3A is a front view of a surface alignment layer of the display device of FIG. 1A wherein the angle of in-plane component of the alignment varies along first and second axes.

FIG. 3A is a front view of a first surface alignment layer 419A of the display device 100 of FIG. 1A wherein the angle of in-plane component of the alignment varies along first and second axes 500, 502. Features of the arrangement of FIG. 3A not discussed in further detail may be assumed to correspond to the features with equivalent reference numerals as discussed above, including any potential variations in the features.

The surface alignment layer 419A may have material that provides different alignment orientations across the surface alignment layer 419A as will be described further hereinbelow.

The material on the upper left has alignment 417ALU which has an angle 617ALU to the axis 500. The material in the upper centre has an alignment 417ACU, which has an angle 617ACU to the axis 500. The material in the far right has an alignment 417ARU, which has an angle 617ARU to the axis 500. As is apparent, the angle 617AU of the material in the plane of the alignment layer 419A increases monotonically from left to right along the axis 500. This alignment layer 419A will thus result in an angle of the in-plane component of the alignment in the adjacent liquid crystal material 414, in the liquid crystal layer 314, which changes monotonically along the predetermined axis across at least part of the display device 100, which corresponds to the axis 500 of the alignment layer 419A.

In the lower left portion of the alignment layer 419A, the material has an alignment 417ALD which has an angle 617ALD to the axis 500.

In the lower centre of the alignment layer 419A, the material has the same alignment 417ACD to the alignment 417ACU which has an angle 617ACD that is the same as the angle 617ACU to the axis 500. In alternative embodiments the angles 617ACU, 617ACD may be different to provide luminance control in the vertical axis 502 as will be described further hereinbelow.

Further, the material 414 on the lower right portion of the alignment layer 419A has an alignment 417ARD which has an angle 617ARD to the axis 500. As shown, the angle 617ALU is larger than angle 619ALD, and angle 617ARU is larger than angle 619ARD. Accordingly, in addition to the angle changing monotonically along axis 500, the angle of the in-plane component of the alignment layer 419A, and hence the alignment in the adjacent liquid material also changes monotonically along a further axis, shown by axis 502 which is perpendicular to axis 500.

Advantageously as will be described below, increased uniformity of illumination to on-axis viewers may be increased.

Figure 3B:
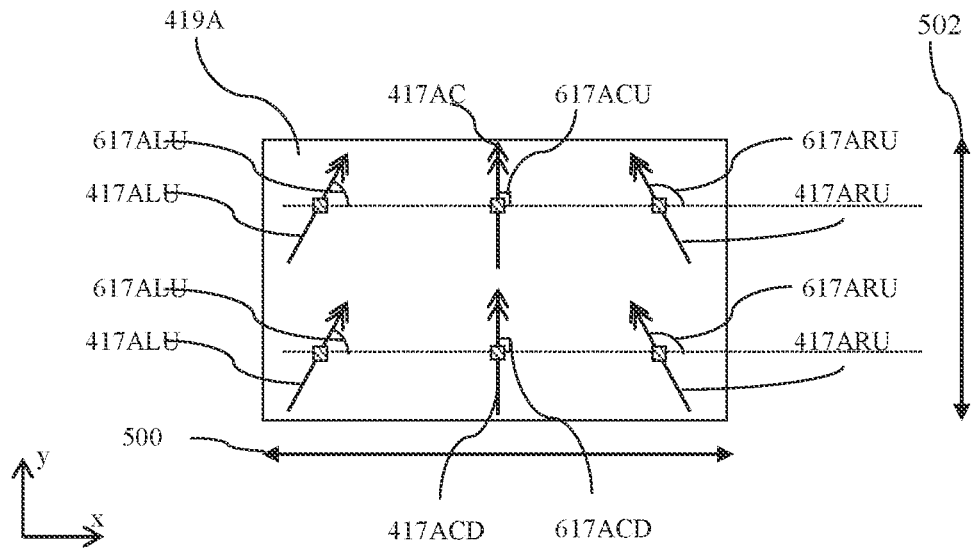
FIG. 3B is a front view of a surface alignment layer of the display device of FIG. 1A wherein the angle of in-plane component of the alignment varies along a first axis.

FIG. 3B is a front view of a surface alignment layer 419A of the display device of FIG. 1A wherein the angle of in-plane component of the alignment 417A varies along the first axis 500 and not along the second axis 502. Features of the arrangement of FIG. 3B not discussed in further detail may be assumed to correspond to the features with equivalent reference numerals as discussed above, including any potential variations in the features.

Thus the alignment does not change along a further axes perpendicular to the predetermined axis 500. Advantageously the alignment layer may be provided to achieve increased uniformity of luminance along the axis 500. The alignment layers 419A, 419B may be more conveniently manufactured than the arrangement of FIG. 3A, as will be described further below with reference to FIGS. 21-22.

The second surface alignment layer 419B (not shown) may be the same as the first surface alignment layer 419A, or alternatively it may be different. The alignment directions 417B on the second surface alignment layer 419B may typically be parallel or anti-parallel to the alignment directions 417A on the first alignment layer. Advantageously increased uniformity may be provided in a lateral direction along axis 500 as will be described further below.

Some twist may be provided between the alignment directions 417A, 417B at the first and second alignment layers 419A, 419B. Advantageously increased rotational symmetry of output profile may be achieved. Further the number of substrates that have varying alignment directions may be reduced, reducing cost and complexity.

Variations of alignment angles 617 will now be described.

Figure 4:
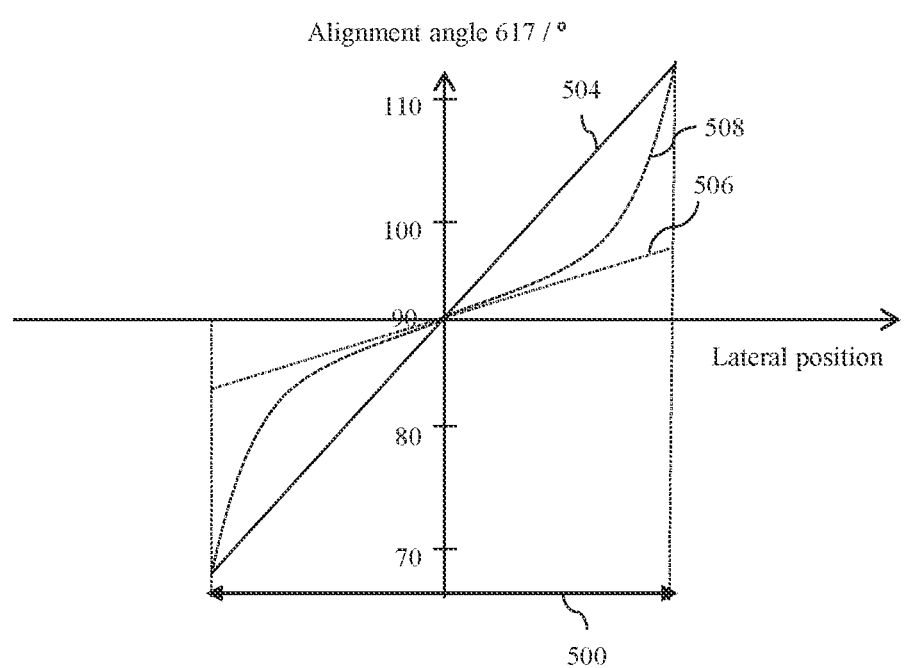
FIG. 4 is a graph of the in-plane component of angle of the alignment provided by the surface alignment layer of FIG. 3A.

FIG. 4 is a graph of the in-plane component of angle 617 of the alignment provided by the surface alignment layer 419A of FIG. 3A in the predetermined direction 500 across the width of the active area of display device 100. The alignment orientation shown by the profiles 504, 506, 508 change monotonically across at least part of the display 100. Profiles 504, 506 illustrates a linear variation of alignment angle 617. In manufacture, the gradient of the profile may be varied to provide maximum uniformity for different nominal viewing distances of the primary viewer from the display device 100. For example, a high gradient may be used for a short viewing distance while a lower gradient of profile 506 may be provided for displays arranged to be operated at longer viewing distances. Advantageously uniformity may be optimised.

Profile 508 illustrates a non-linear variation of angle 617 in the predetermined direction 500. Such a profile may be provided to compensate for non-linear variations of luminance profile with viewing angle as will be further described with reference to FIGS. 10A-H below for example.

In these examples, the in-plane component of angle at least one of the angles 617A, 617B of said in-plane component of the alignment in the adjacent liquid crystal material 414 changes monotonically along the predetermined axis a mean direction that is parallel to the electric vector transmission directions of the output polariser 218 and the reflective polariser 302 and the additional polariser 318, with a mean direction that is parallel to the electric vector transmission directions of the output polariser 218, the reflective polariser 302 and the additional polariser 318. More generally, in the case that the electric vector transmission directions of the output polariser 218, the reflective polariser 302 and the additional polariser 318 are not parallel, the mean direction may be parallel to or orthogonal to the electric vector transmission directions of at least one of the output polariser 218, the reflective polariser 302 and the additional polariser 318. However, this is not essential. In other examples, the mean direction may be at a non-zero acute angle to one or more of the electric vector transmission directions of the output polariser 218, the reflective polariser 302 and the additional polariser 318.

In the examples described above, at least one of the angles 617A, 617B of said in-plane component of the alignment in the adjacent liquid crystal material 414 changes monotonically along the predetermined axis across the entirety of the display device 100. In other examples described below, the at least one of the angles 617A, 617B of said in-plane component of the alignment in the adjacent liquid crystal material 414 changes monotonically along the predetermined axis across a part of the display device 100, in which case the technical effects are achieved for that part.

An illustrative polar control retarder arrangement will now be described.

Figure 5A:
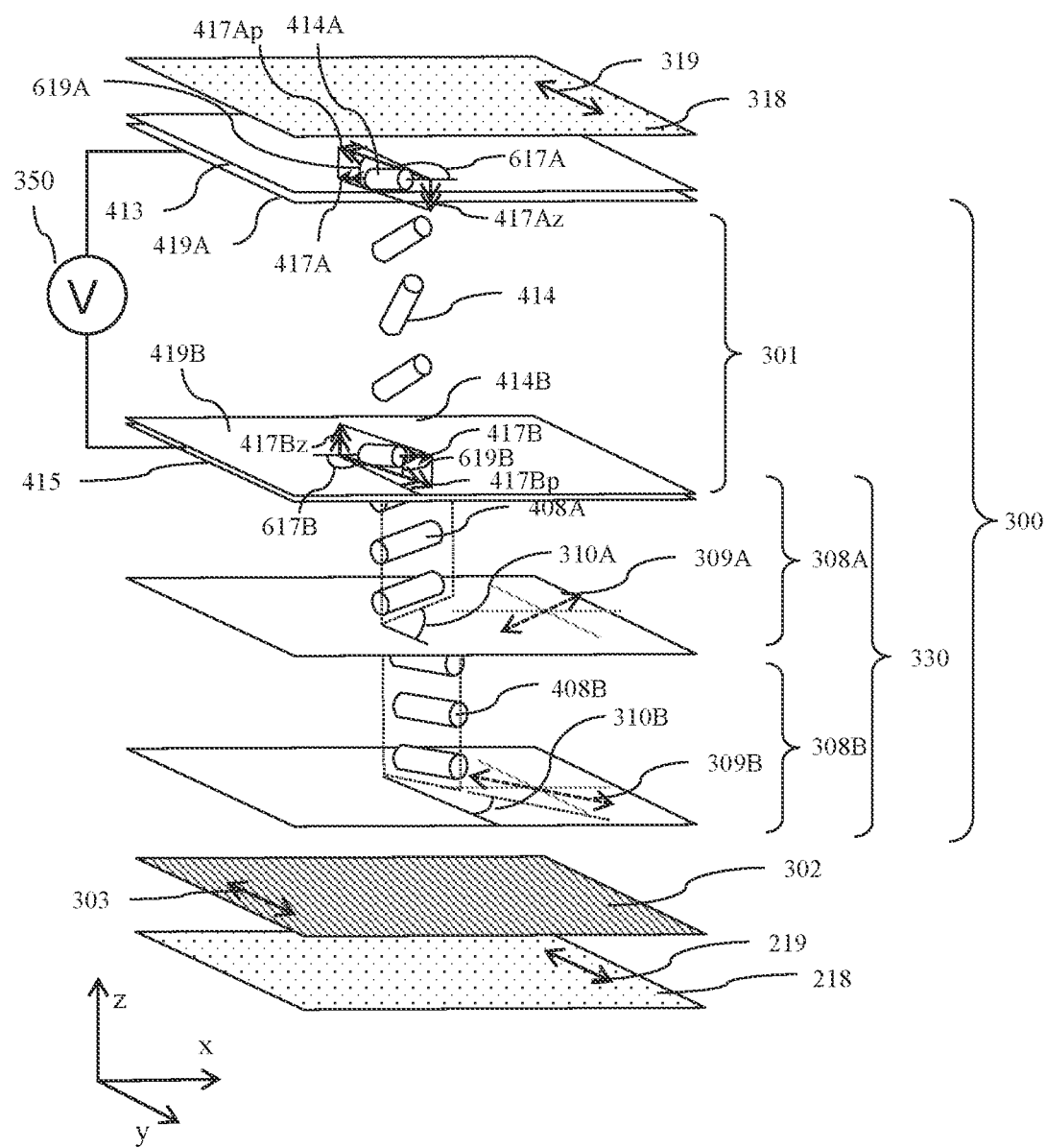
FIG. 5A is a perspective view of polar control retarders that may be applied in FIG. 1, comprising a homogeneously aligned switchable LC retarder and passive crossed A-plate retarders.
Figure 5B:
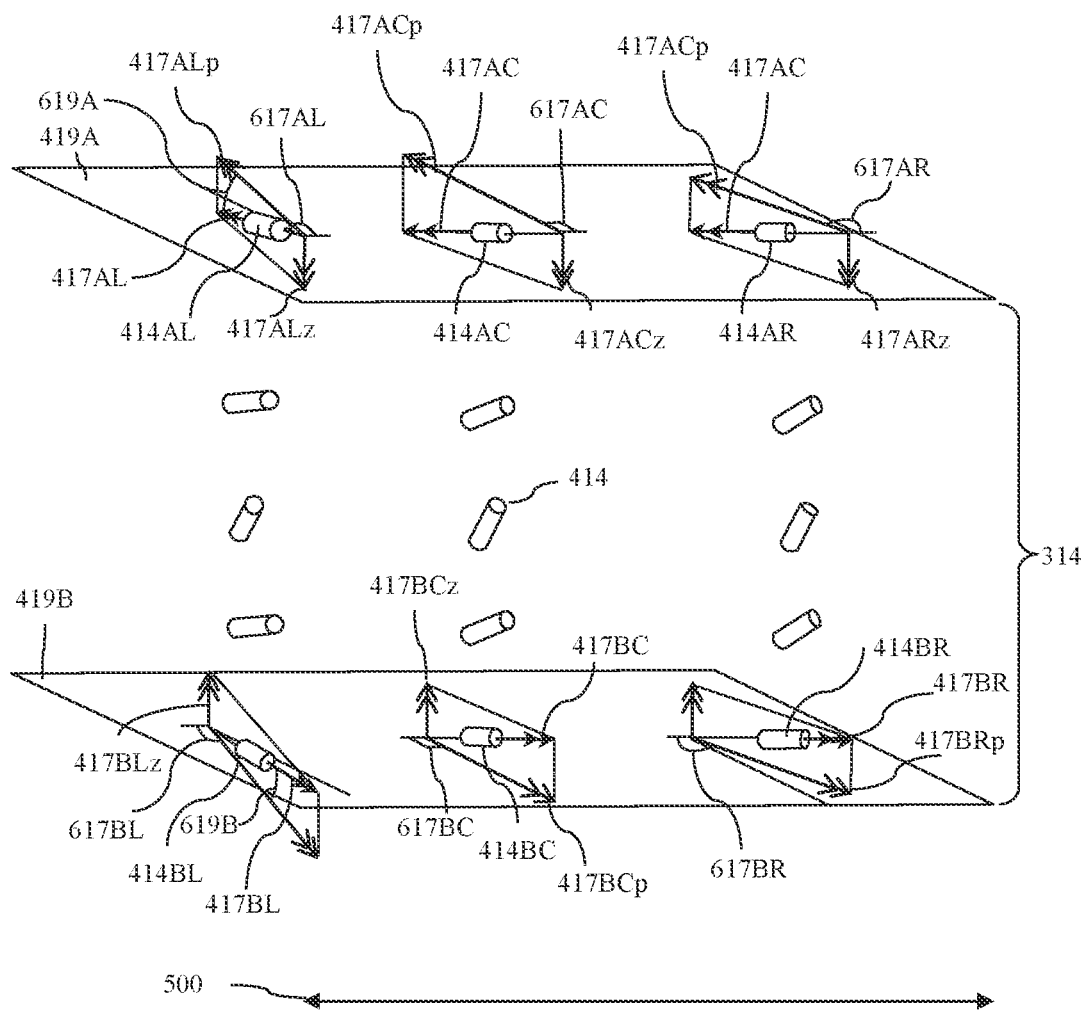
FIG. 5B is a perspective view of liquid crystal alignment in the liquid crystal retarder of FIG. 5A.

FIG. 5A is a perspective view of polar control retarders 330, 301 that may be applied in FIG. 1, comprising a homogeneously aligned switchable LC retarder 301 and passive crossed A-plate retarders 308A, 308B; and FIG. 5B is a perspective view of liquid crystal material 414 alignment orientations in the liquid crystal layer 314 of the liquid crystal polar control retarder 301 of FIG. 5A.

In FIGS. 5A-B and other schematic diagrams below, some layers of the optical stack are omitted for clarity. For example the switchable liquid crystal retarder 301 is shown omitting the substrates 312, 316. Features of the arrangement of FIG. 5A not discussed in further detail may be assumed to correspond to the features with equivalent reference numerals as discussed above, including any potential variations in the features.

The switchable liquid crystal retarder 301 comprises a layer 314 of liquid crystal material 414 with a positive dielectric anisotropy.

The switchable liquid crystal retarder 301 comprises two surface alignment layers 419A, 419B disposed adjacent to the layer of liquid crystal material 421 and on opposite sides thereof and each arranged to provide homogeneous alignment in the adjacent liquid crystal material 414. The layer 314 of liquid crystal material 414 of the switchable liquid crystal retarder 301 comprises a liquid crystal material 414 with a positive dielectric anisotropy. The layer 314 of liquid crystal material 414 has a retardance for light of a wavelength of 550 nm in a range from 500 nm to 900 nm, preferably in a range from 600 nm to 850 nm and most preferably in a range from 700 nm to 800 nm. The passive polar control retarder 330 further comprises a pair of passive retarders 308A, 308B which have optical axes in the plane of the retarders, that is they are A-plates, that are crossed. Each passive retarder 308A, 308B of the pair of passive retarders 308A, 308B has a retardance for light of a wavelength of 550 nm in a range from 300 nm to 800 nm, preferably in a range from 350 nm to 650 nm and most preferably in a range from 450 nm to 550 nm.

In the present embodiments, 'crossed' refers to an angle of substantially 90° between the optical axes of the two retarders 308A, 308B in the plane of the retarders 308A, 308B. To reduce cost of retarder materials, it is desirable to provide materials with some variation of retarder orientation due to stretching errors during film manufacture for example. Variations in retarder orientation away from preferable directions can reduce the head-on luminance and increase the minimum transmission. Preferably the angle 310A is at least 35° and at most 55°, more preferably at least 40° and at most 50° and most preferably at least 42.5° and at most 47.5°. Preferably the angle 310B is at least 125° and at most 145°, more preferably at least 130° and at most 135° and most preferably at least 132.5° and at most 137.5°.

The passive retarders 308A, 308B may be provided using stretched films to advantageously achieve low cost and high uniformity. Further field of view for liquid crystal retarders with homogeneous alignment is increased while providing resilience to the visibility of flow of liquid crystal material during applied pressure.

It may be desirable to provide the additional polariser 318 with a different electric vector transmission direction to the electric vector transmission direction of the output polariser 218 and reflective polariser 302.

The liquid crystal retarder 301 further comprises electrodes 413, 415, which are transmissive, arranged across the layer 314 to control the liquid crystal material 414 and thereby control the liquid crystal retarder. The layer 314 of liquid crystal material 414 is switchable by means of adjusting the voltage being applied to the electrodes 413, 415. The electrodes 413, 415 are on opposite sides of the layer 314 of liquid crystal material 414 and may for example be indium-tin-oxide (ITO) electrodes.

The alignment layers 419A, 419B may be formed between electrodes 413, 415 and the liquid crystal material 414 of the layer 314.

The orientation of the liquid crystal molecules 414 will now be further described.

Considering the molecule 414A that is adjacent the first alignment layer 417A, the optical axis direction 417A is determined by the pretilt angle 619A of the alignment layer 417A. For non-zero pretilt angles 619A, a component 417Az of liquid crystal molecule 414A optical axis alignment direction is provided that is out of the plane in which the liquid crystal retarder 301 extends. The optical axis direction 417A is also determined by the orientation direction 617A (that may be also referred to as the rubbing direction) of the alignment layer 417A in the region in which the molecule 414A is arranged. A component 417Ap of liquid crystal molecule 414A optical axis alignment direction is provided that is in the plane in which the liquid crystal retarder 301 extends.

Considering the molecule 414B that is adjacent the second alignment layer 417B, the optical axis direction 417B is determined by the pretilt angle 619B of the alignment layer 417B. For non-zero pretilt angles 619B, a component 417Bz of liquid crystal molecule 414B optical axis alignment direction is provided that is out of the plane in which the liquid crystal retarder 301 extends. The optical axis direction 417B is also determined by the orientation direction 617B (that may be also referred to as the rubbing direction) of the alignment layer 417B in the region in which the molecule 414B is arranged. A component 417Bp of liquid crystal molecule 414B optical axis alignment direction is provided that is in the plane in which the liquid crystal retarder 301 extends.

In other words, the orientation angle 617A, 617B is determined by the pretilt directions 619A, 619B of the alignment layers 419A, 419B so that each alignment layer 419A, 419B has a pretilt. In the embodiment of FIGURE 5A, the pretilt of each alignment layer 419A, 419B has a pretilt direction with a component 417Ap, 417Bp in the plane of the layer 314 that is parallel or anti-parallel or orthogonal to each other.

In the embodiment of FIG. 5A, each of the surface alignment layers 419A, 419B is arranged to provide homogenous alignment in the adjacent liquid crystal material 414. In such homogeneous alignment layers 419A, 419B may be provided with a pretilt angle 619A, 619B that is 2° for example.

Driver 350 provides a voltage V to electrodes 413, 415 across the layer 314 of switchable liquid crystal material 414 such that liquid crystal molecules are inclined at a tilt angle to the vertical, forming an O-plate. The plane of the tilt is determined by the pretilt direction of alignment layers 419A, 419B formed on the electrodes 413, 415 that are formed on the inner surfaces of substrates 312, 316 (seen in FIG. 1).

In typical use, for switching between a public mode and a privacy mode, the layer 314 of liquid crystal material 414 is switchable between two states. The first state being a public mode so that the display 100 may be used by multiple users, the second state being a privacy mode for use by a primary user with minimal visibility by snoopers. The switching may be by means of a voltage being applied across the electrodes 413, 415.

In general such a display 100 may be considered having a first wide angle state and a second reduced off-axis luminance state. Such a display 100 may provide a privacy display. In another use, or to provide controlled luminance to off-axis observers, for example in an automotive environment when a passenger or driver may wish some visibility of the displayed image, without full obscuration, by means of intermediate voltage levels. Stray light may be reduced for night-time operation. The display 100 may also provide more uniform luminance reduction across at least part of the display 100 for off-axis viewers whilst also providing more uniform luminance across at least part of the display for on-axis viewers.

The embodiment of FIG. 5B further illustrates the variation of alignment orientations with location along the lateral axis 500. Alignment layers 419A. 419B are provided with pretilts 619A, 619B respectively that are of the same magnitude and arranged to provide homogeneous alignment in the adjacent liquid crystal material 414.

On the left side of the display on the first alignment layer 419A, liquid crystal molecule 414AL has an alignment direction 417AL with an out-of-plane component 417ALz and an in-plane component 417ALp that has an acute angle 617AL from the axis 500 direction. For the second alignment layer 419B, liquid crystal molecule 414BL has an alignment direction 417BL with an out-of-plane component 417BLz and an in-plane component 417BLp that has an acute angle 617BL from the axis 500 direction. The directions 417ALp, 417BLp are anti-parallel.

On the right side of the display on the first alignment layer 419A, liquid crystal molecule 414AR has an alignment direction 417AR with an out-of-plane component 417ARz and an in-plane component 417ARp that has an acute angle 617AR from the axis 500 direction. For the second alignment layer 419B, liquid crystal molecule 414BR has an alignment direction 417BR with an out-of-plane component 417BRz and an in-plane component 417BRp that has an obtuse angle 617BR from the axis 500 direction. The directions 417ARp, 417BRp are anti-parallel.

In the centre of the display, on the first alignment layer 419A, liquid crystal molecule 414AC has an alignment direction 417AC with an out-of-plane component 417ACz and an in-plane component 417ACp that has an acute angle 617AC from the axis 500 direction. For the second alignment layer 419B, liquid crystal molecule 414BC has an alignment direction 417BC with an out-of-plane component 417BCz and an in-plane component 417BCp that has a right angle 617BC from the axis 500 direction. The directions 417ACp, 417BCp are anti-parallel.

Variations of liquid crystal molecule 414 orientations through the liquid crystal layer 314 will now be described.

Figure 6:
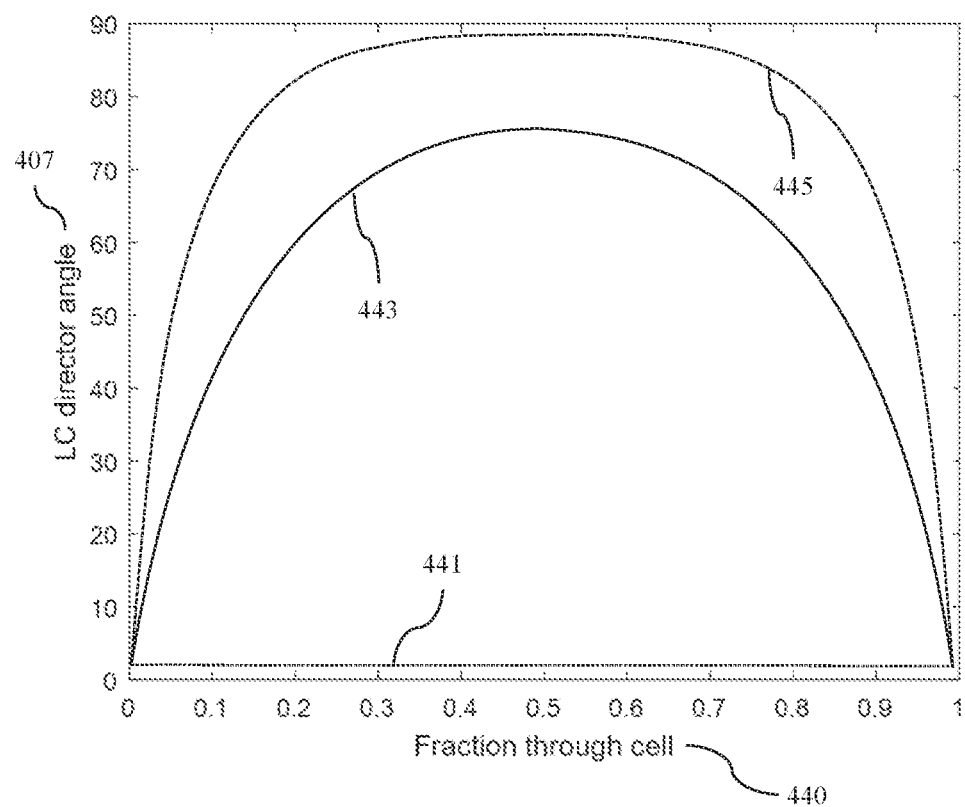
FIG. 6 is a graph of the LC director angle of the homogeneously aligned switchable LC in FIG. 5A through its thickness.

FIG. 6 is a graph of the LC director angle of the homogeneously aligned switchable LC in FIG. 5A through its thickness, showing liquid crystal director angle 407 against fractional location 440 through the switchable liquid crystal retarder 301 for various different applied voltages. Profile 441 illustrates liquid crystal material 414 tilt angle for no applied voltage, tilt profile 443 illustrates director orientations for a first applied voltage to be use in privacy mode and tilt profile 445 illustrates director orientations for a higher applied voltage to be used in wide angle mode of operation.

Thus the liquid crystal layers are typically splayed in desirable switched states, and compensated by the compensation retarders 330. Increasing the voltage progressively reduces the thickness of the retarder 301 in which splay is present, and above the level for privacy operation advantageously increases the polar field of view over which the transmission is maximised.

The splay illustrated in FIG. 6 by profile 443, 445 is through the thickness of the liquid crystal layer 314 and is different to the variation in angle 617 of the alignment direction at the alignment layer 419.

The propagation of polarised light from the output polariser 218 will now be considered for on-axis and off-axis directions.

Figure 7:
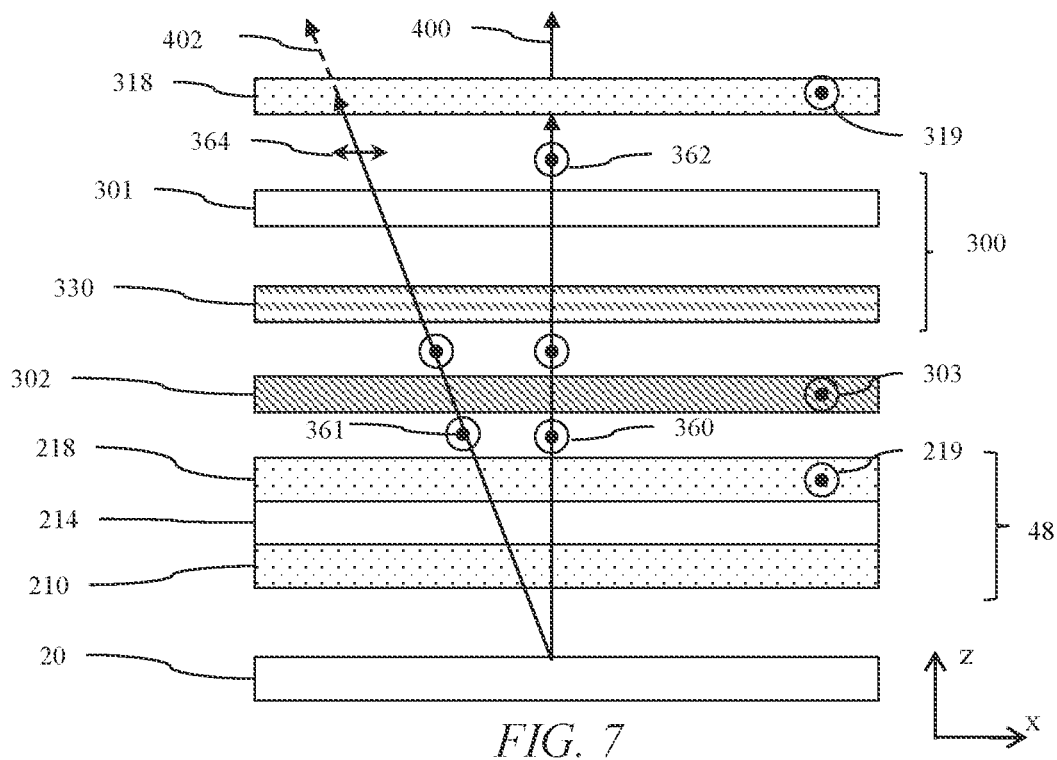
FIG. 7 is a side view of propagation of output light from a SLM through the optical stack of FIG. 1A in a privacy mode.

FIG. 7 is a side view of propagation of output light from the SLM 48 through the optical stack of FIG. 1A in a privacy mode. When the layer 314, seen in FIG. 5A, of the switchable liquid crystal retarder 301, is in a second state of said two states, the polar control retarder 300 provides no overall transformation of polarisation component 360 to output light rays 400 passing therethrough along an axis perpendicular to the plane of the switchable retarder. The polar control retarder does, however, provide an overall transformation of polarisation component 361 to light rays 402 passing therethrough for some polar angles which are at an acute angle to the perpendicular to the plane of the retarders. Features of the arrangement of FIG. 7 not discussed in further detail may be assumed to correspond to the features with equivalent reference numerals as discussed above, including any potential variations in the features.

Polarisation component 360 from the output polariser 218 is transmitted by reflective polariser 302 and incident the polar control retarder 300, which comprises the switchable liquid crystal retarder 301 and the passive polar control retarder 330. On-axis light has a polarisation component 362, upon exiting the polar control retarder 300, that is unmodified from component 360. Whereas off-axis light has a polarisation component 364, upon exiting the polar control retarder 300, that is transformed by the polar control retarder 300. The polarisation component 361 may be transformed to a linear polarisation component 364 which is absorbed by additional polariser 318. More generally, the polarisation component 361 may be transformed to an elliptical polarisation component, that is partially absorbed by additional polariser 318.

Thus, in a polar representation of transmission by the polar control retarder 300 and additional polariser 318 in a privacy mode at different polar angles, regions of high transmission and regions of low transmission are provided.

The polar distribution of light transmission modifies the polar distribution of luminance output of the underlying SLM 48. In the case that the SLM 48 comprises a directional backlight 20 then off-axis luminance may be further be reduced as described above.

Advantageously, a privacy display is provided that has low luminance to an off-axis snooper while maintaining high luminance for an on-axis observer.

Figure 8:
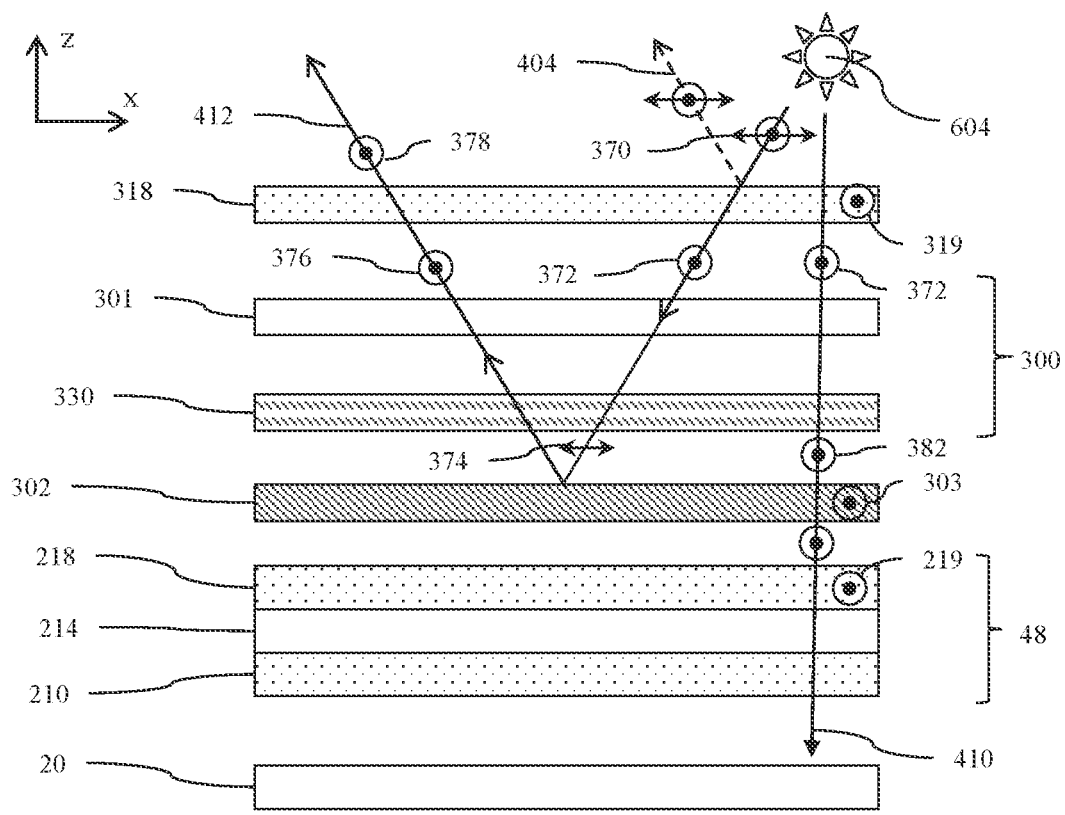
FIG. 8 is a side view of propagation of ambient illumination light through the optical stack of FIG. 1A in a privacy mode.

FIG. 8 is a side view of propagation of ambient illumination light through the optical stack of FIG. 1A in a privacy mode. Features of the arrangement of FIG. 8 not discussed in further detail may be assumed to correspond to the features with equivalent reference numerals as discussed above, including any potential variations in the features.

Ambient light source 604 illuminates the display 100 with unpolarised light. The additional polariser 318 transmits light ray 410 normal to the display surface with a first polarisation component 372 that is a linear polarisation component parallel to the electric vector transmission direction 319 of the additional polariser 318.

As depicted, the light ray 410 passes through the polar control retarder 300 before being incident on the reflective polariser 302. In both states of operation, the polarisation component 372 remains unmodified by the polar control retarder 300 and so transmitted polarisation component 382 is parallel to the transmission axis of the reflective polariser 302 and the output polariser 218. Ambient light is therefore directed through the SLM 48 and lost.

By comparison, for ray 412 which is off-axis, the additional polariser 318 transmits a portion of the light ray 412 with a first polarisation component 372 that is a linear polarisation component parallel to the electric vector transmission direction 319 of the additional polariser. The off-axis light ray 412 is directed through the polar control retarder 300 and its first polarisation component 372 is modified to become a modified polarisation component 374. The ray 412 having the modified polarisation component 374 is incident on the reflective polariser 302. Because the modified polarisation component 374 is different to the transmission axis of the reflective polariser 302, the ray 412 may be reflected by the reflective polariser 302. The modified polarisation component 374 is re-converted into polarisation component 376 after passing through retarders 300 and is transmitted through the additional polariser 318.

Thus, when the layer 314 of liquid crystal material is in this state, the polar control retarder 300 provides no overall transformation of polarisation component 372 to ambient light rays 410 passing through the additional polariser 318, and then the polar control retarder 300, along an axis perpendicular to the plane of the switchable retarder. The reflective polariser 302 thus provides no reflected light for ambient light rays 410 passing through the additional polariser 318 and then the polar control retarder 300 along an axis perpendicular to the plane of the polar control retarder 300. The polar control retarder 300 does, however provide an overall transformation of polarisation component 372 to ambient light rays 412 passing through the absorptive polariser 318 and then the polar control retarder 300 at some polar angles which are at an acute angle to the perpendicular to the plane of the polar control retarder 300. This results in reflected light rays 412 for ambient light passing through the additional polariser 318, and then the polar control retarder 300, at some polar angles which are at an acute angle to the perpendicular to the plane of the polar control retarder 300, wherein the ray 412, reflected by the reflective polariser 302, passes back through the polar control retarder 300 and is then transmitted by the additional polariser 318.

Advantageously, the polar distribution of light reflection provides high reflectivity at typical snooper locations by means of the privacy state of the polar control retarder 300, while maintaining low reflectivity for an on-axis observer. Thus, in the privacy mode of operation, the reflectivity for off-axis viewing positions is increased, and the luminance for off-axis light from the SLM is reduced. As is described above, such increased reflectivity provides increased visual security level for the display in an ambiently illuminated environment.

Operation of a privacy display to a viewer and snooper will now be further described.

Figure 9A:
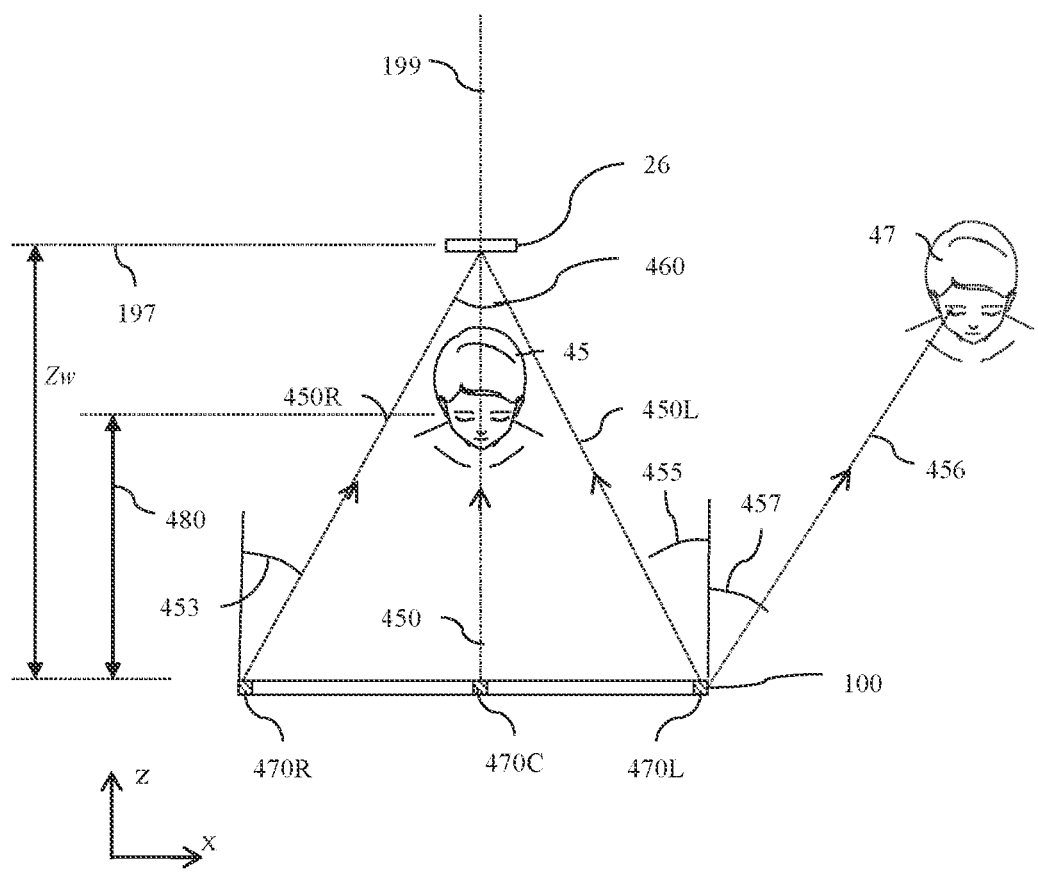
FIG. 9A is a schematic top view of the display device illustrating observation viewing angles of a privacy display.
Figure 9B:
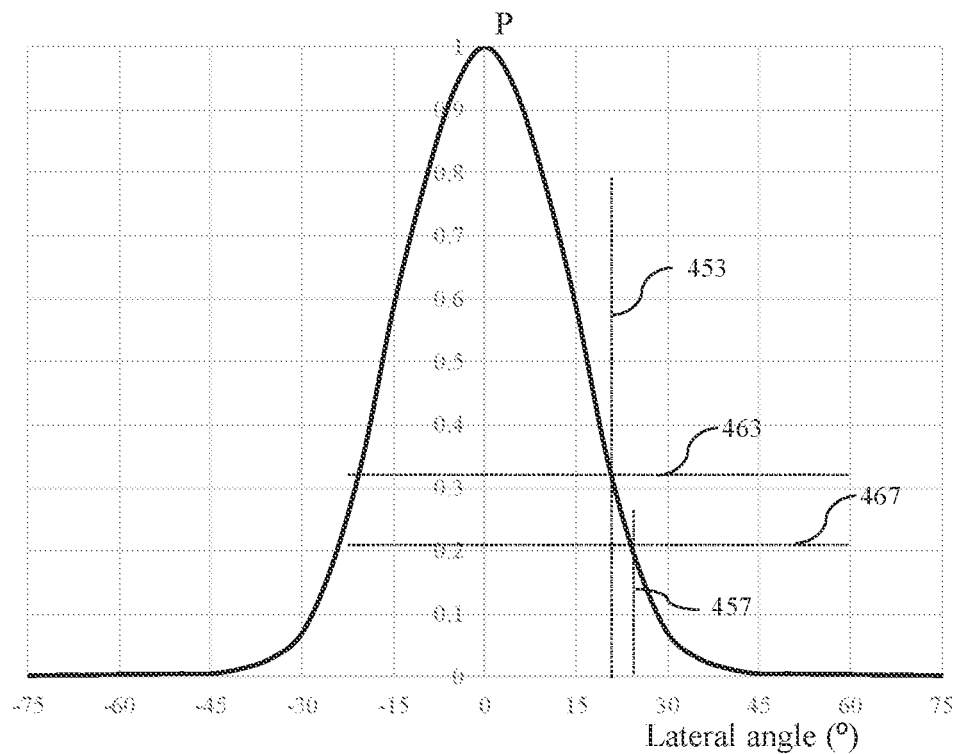
FIG. 9B is a graph of output luminance of the display device of FIG. 1A at different viewing angles.
Figure 9C:
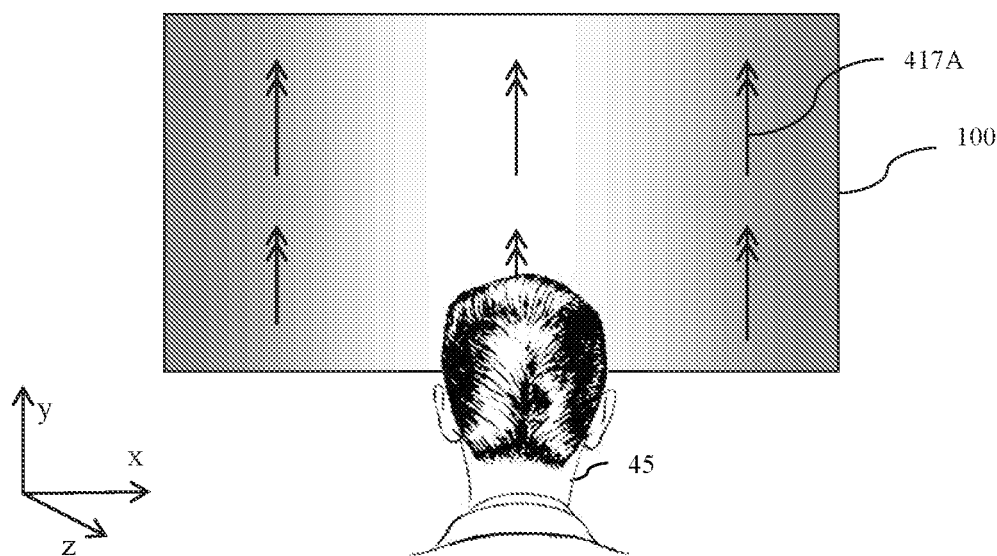
FIG. 9C is a perspective view of a viewer and the surface alignment layer of the display device of a prior art device.
Figure 10A:
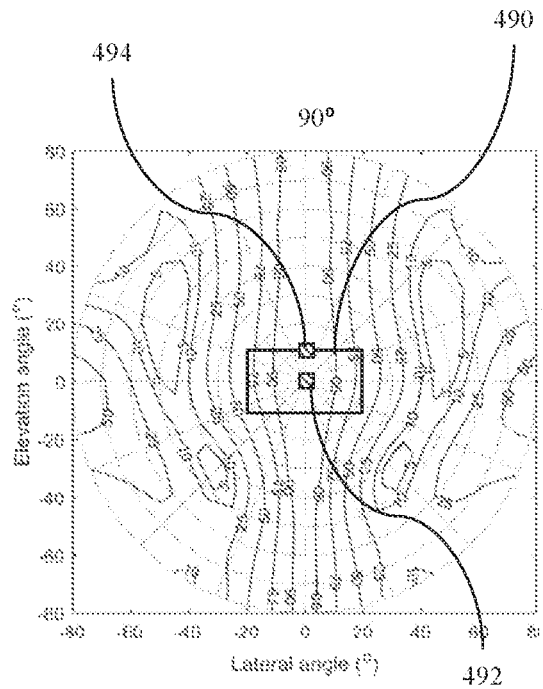
FIGS. 10A-D are graphs illustrating the variation of luminance with polar direction for the light output from a display device of FIG. 1A using the plural retarders of FIG. 5A for different points on the display device for the left-side of the centre of the display with the angle of in-plane component of the alignment of 90°, 85°, 80°, 70° respectively.
Figure 10B:
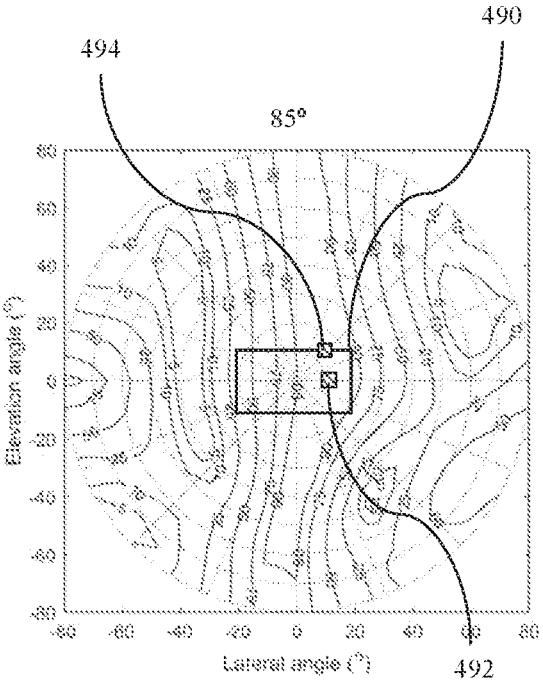
Figure 10C:
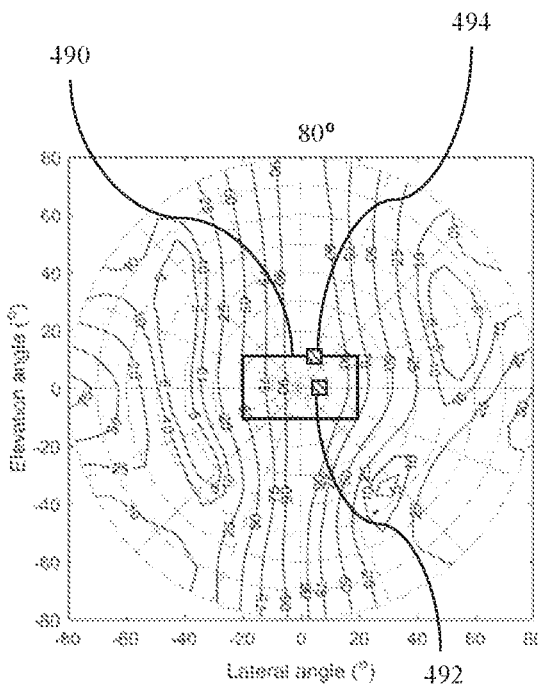
Figure 10D:
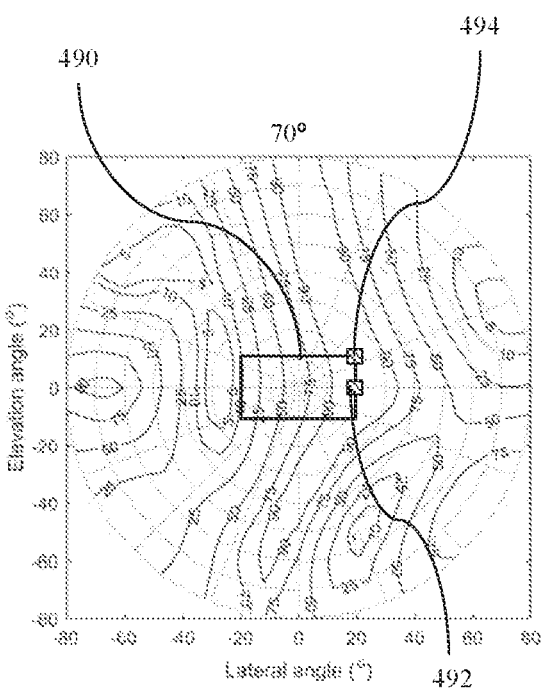
Figure 10E:
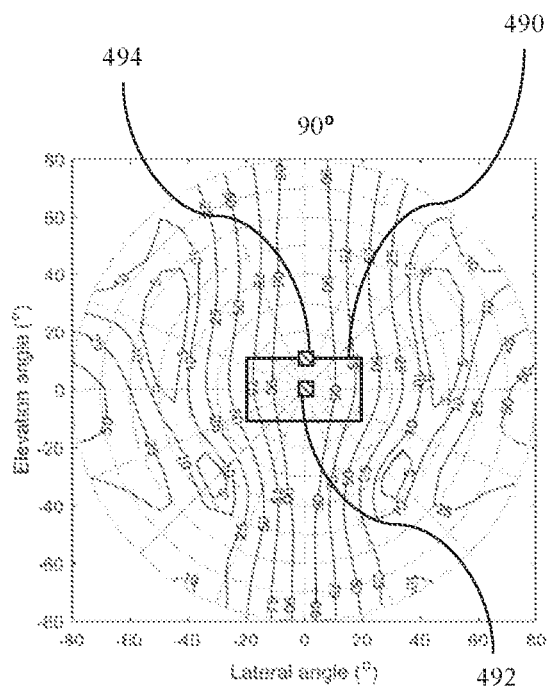
FIGS. 10E-H are graphs illustrating the variation of luminance with polar direction for the light output from a display device of FIG. 1A using the plural retarders of FIG. 5A for different points on the display device for the right-side of the display with the angle of in-plane component of the alignment of 90°, 85°, 80°, 70° respectively.
Figure 10F:
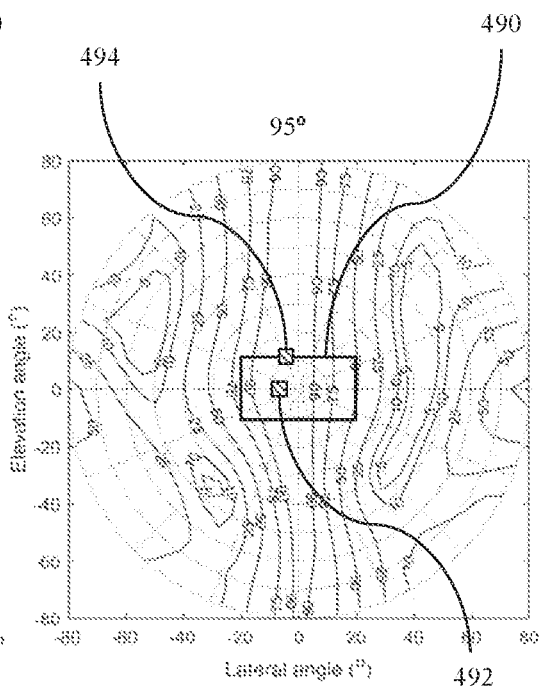
Figure 10G:
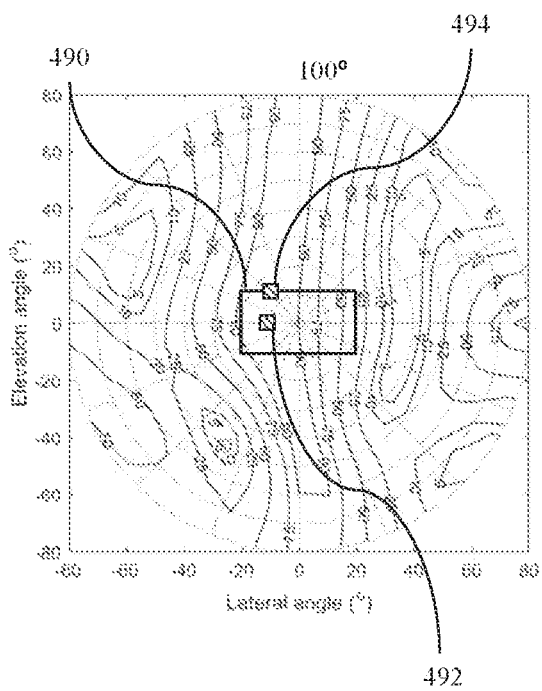
Figure 10H:
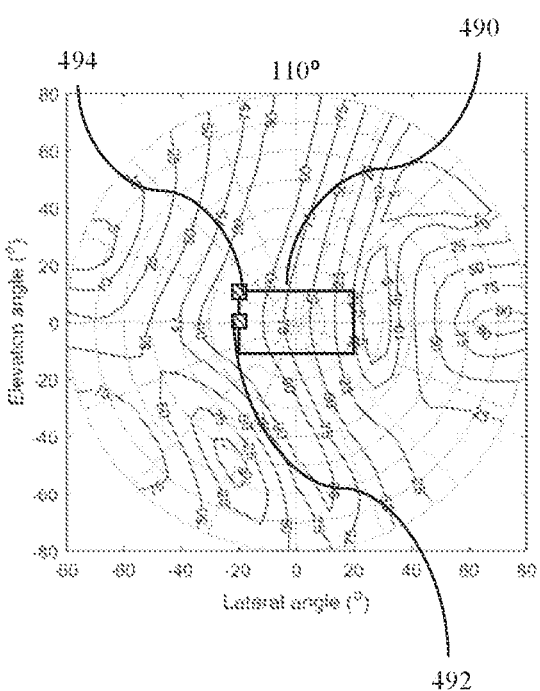
Figure 11A:
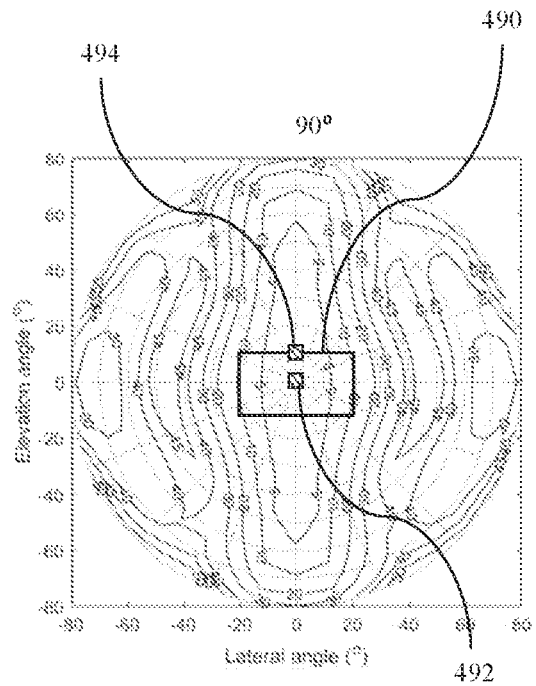
FIGS. 11A-D are graphs illustrating the variation of reflectivity with polar direction for the light output from a display device of FIG. 1A using the plural retarders of FIG. 5A for different points on the display device for the left-side of the centre of the display with the angle of in-plane component of the alignment of 90°, 85°, 80°, 70° respectively.
Figure 11B:
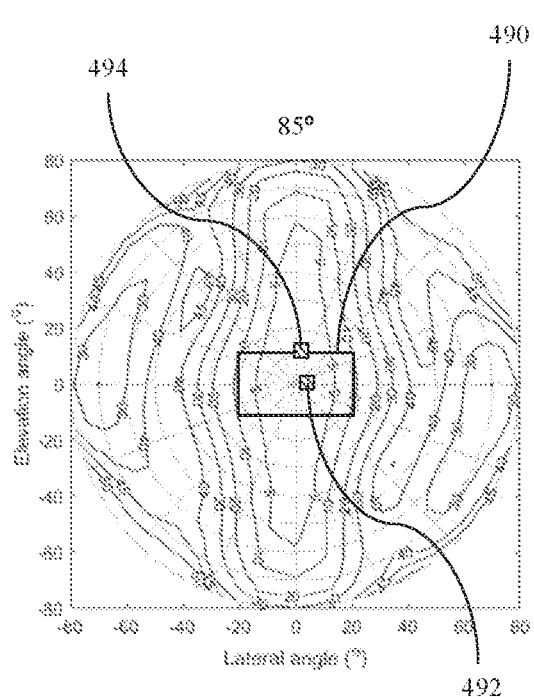
Figure 11C:
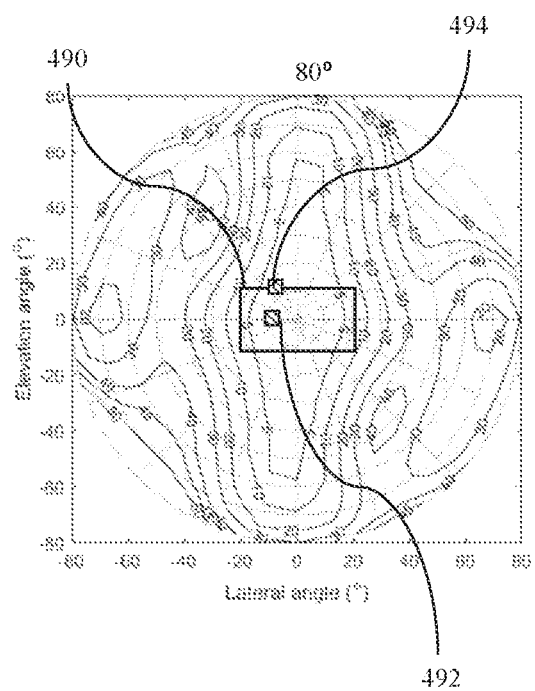
Figure 11D:
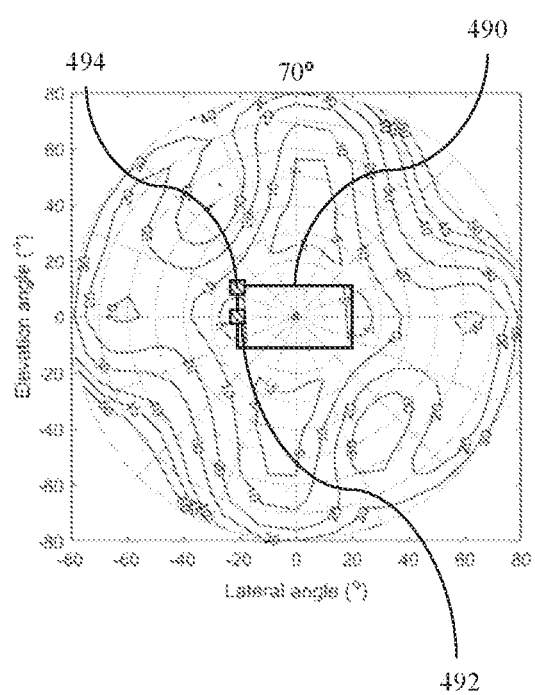
Figure 11E:
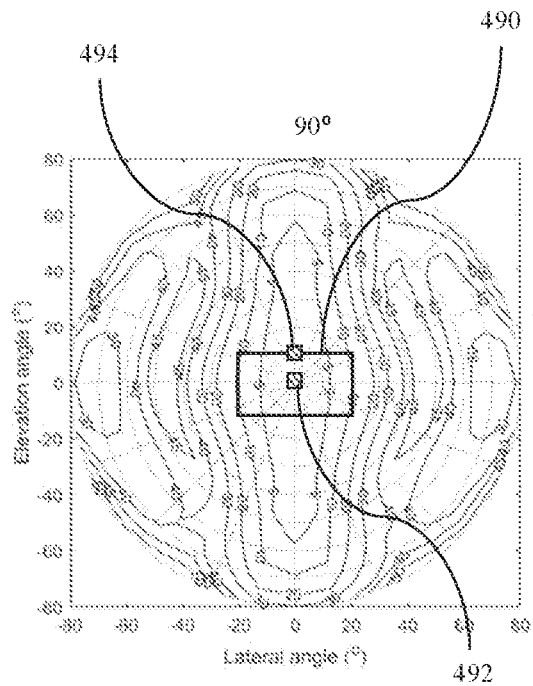
FIGS. 11E-H are graphs illustrating the variation of reflectivity with polar direction for the light output from a display device of FIG. 1A using the plural retarders of FIG. 5A for different points on the display device for the right-side of the display with the angle of in-plane component of the alignment of 90°, 85°, 80°, 70° respectively.
Figure 11F:
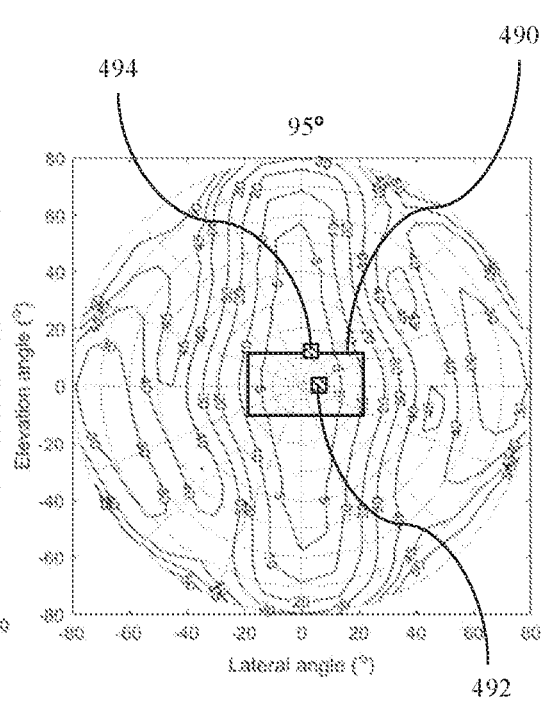
Figure 11G:
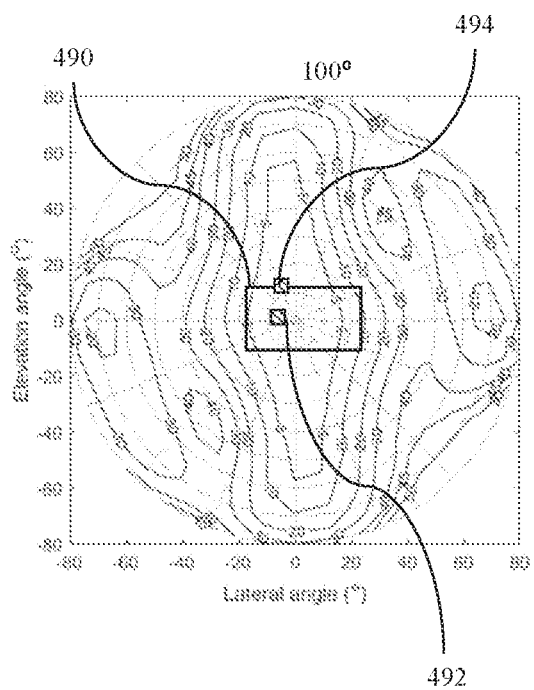
Figure 11H:
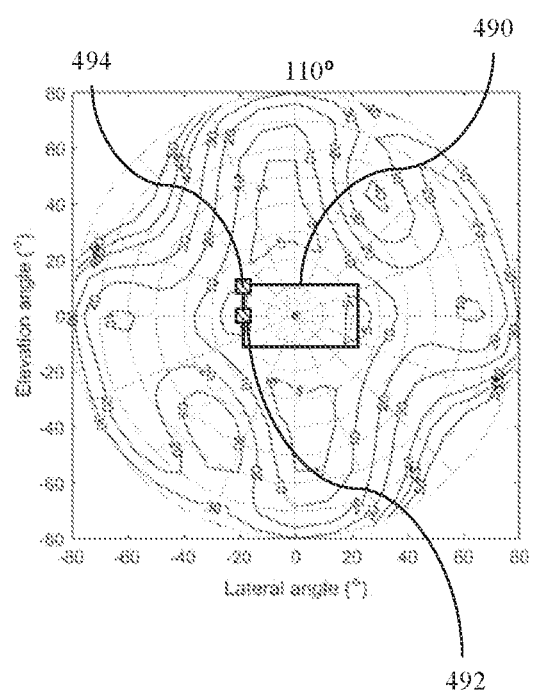

FIG. 9A is a schematic top view of the display device 100 illustrating variation in the viewing angle of a display device 100 across its width, FIG. 9B is a graph illustrating the variation of luminance with polar direction for the light output from a centre point of the display device 100 including the polar control retarder 300 of FIG. 5A; and FIG. 9C is a perspective view of a user 45 and the surface alignment layer of a prior art display device 1.

The display 100 comprises a liquid crystal polar control retarder 301, wherein the angle 617 of said in-plane component 417 of the alignment in the adjacent liquid crystal material 414 changes monotonically along the predetermined axis 500 across at least part of the display device as illustrated elsewhere herein.

In the alternative embodiment of FIG. 9A the angle of said in-plane component 417 of the alignment in the adjacent liquid crystal material 414 changes monotonically along a predetermined axis across the entire display device 100.

Directions as illustrated by light rays 450R, 450C, 450L of maximum light transmission of the display polarizer 218, the additional polariser 318 and said at least one polar control retarder 300 from points 470R, 470C 470L of said at least part of the display device 100 are directed towards a common optical window 26 in front of the display device 100. In operation, the optical window 26 in window plane 197 may be provided at a window distance Zw that is typically equal to or greater than the nominal viewing distance 480. The optical window 26 may alternatively be referred to as an optical pupil, and the output of the display 100 may be described as being pupillated. Advantageously desirable uniformity variation across the display 100 may be provided for the user 45.

Referring to FIG. 9A, an on-axis observer 45, positioned centrally with respect to the display 100, is aligned with optical axis 199 that is normal to the display. Thus ray 450C that is with a polar angle of zero degrees from a central location point 470C is directed towards the primary user 45 in the normal direction.

A first ray 450R propagating from point 470R on the right side of the display 100, propagates at a first angle 453 relative to a normal 199 to the display 100 towards the user 45. For a snooper 47, positioned at a distance away from the display 100 to the right side, for a second ray 456 propagating from point 470L at the left edge of the display 100, towards the snooper 47, propagates at a second angle 457 relative to a normal 199 to the display 100.

As depicted, the first angle 453 and second angle 457 may be comparatively similar in size.

Referring to FIG. 9B, in a display device 100 with a large field of view angle 460 to the primary user 45 in which the angle of the in-plane component of the liquid crystal in the plane of the retarder is uniform across the display as illustrated in FIG. 9C, the luminance 463 of the point 470R on the display from which the ray 450R emanates at angle 453, for the user 45, may be undesirably the same or similar to the luminance 467 for the snooper 47 for ray 456 at angle 457 from point 470L.

As illustrated in FIG. 9C, this further results in a luminance roll-off across the display 100 wherein the luminance is at its brightest in the centre of the display and reduces gradually towards a minimum at the edges of the display 100. The change in luminance across the display 100 may be noticeable by an observer 45 which may not be desirable.

In comparison to the arrangement of FIG. 9C, it is generally desirable for the ray 450R to be observable by the user 45 and the ray 456 to have low luminance and high reflectivity for the snooper 47. Further it is desirable that the luminance across at least part of the display device 100 is provided with high uniformity to the user 45 at a nominal viewing distance 480.

In the present embodiments the display 100 provides alignment of the adjacent liquid crystal material 414 with an in-plane component that is in the plane of the layer of liquid crystal material 314 and wherein the angle of said in-plane component of the alignment in the adjacent liquid crystal material changes monotonically along the predetermined axis across at least part of the display device 100. A different angular dependent luminance is achieved for different points 470C, 470R, 470L across at least part of the display. Accordingly, with an appropriate in-plane angle of the liquid crystal material 314 it may be possible for the first ray 450R to have a luminance that is observable by the user 45, and ray 456, which travels at a similar angle 457 to the angle 453 of first ray 450R, to have a reduced luminance which is not observable by the snooper 47. This may be achieved across the entire width of the display 100 by the liquid crystal material 314 adjacent the two surface alignment layers 419A, 419B, having an in-plane component which has an angle which changes monotonically across an axis across at least part of the display device 100.

As can be seen, the luminance of the of the centre point on the display decreases from a maximum at 0° lateral angle to a minimum at around a 45° lateral angle. Accordingly, an on-axis user will see a maximum luminance from the centre of the display device 100, whereas a snooper, i.e. an off-axis observer, positioned at a lateral angle of around 45° will see a minimum luminance from the centre of the display device 100. It may therefore be possible for the minimum luminance to be sufficiently small that the snooper cannot observe the display device 100.

The polar output of an illustrative embodiment will now be described.

FIGS. 10A-D are graphs illustrating the variation of luminance with polar direction for the light output from a display device 100 of FIG. 1A using the plural retarders of FIG. 5A for different points on the display device for the left-side of the centre of the display with the angle 617L of in-plane component of the alignment of 90°, 85°, 80°, 70° respectively; and FIGS. 10E-H are graphs illustrating the variation of luminance with polar direction for the light output from a display device of FIG. 1A using the plural retarders of FIG. 5A for different points on the display device for the right-side of the display with the angle 617R of in-plane component of the alignment of 90°, 95°, 100°, 110° respectively.

The illustrative embodiments are provided for properties of TABLE 1.

TABLE 1

| Passive retarder(s) | | Active LC retarder | | | |
| --- | --- | --- | --- | --- | --- |
| Type | $\Delta n.d$/nm | Alignment layers | Pretilt/ deg | $\Delta n.d$/ nm | $\Delta\epsilon$ | Voltage/ V |
| Crossed A | +565 @ 45° +565 @ 135° | Homogeneous Homogeneous | 2 2 | 750 | 13.2 | 2.5 |

It would be further desirable to provide low reflectivity to the primary user 45 while providing high reflectivity to the snooper 47.

FIGS. 11A-D are graphs illustrating the variation of reflectivity with polar direction for the light reflected from a display device of FIG. 1A using the plural retarders of FIG. 5A for different points on the display device for the left-side of the centre of the display with the angle 617L of in-plane component of the alignment of 90°, 85°, 80°, 70° respectively; and FIGS. 11E-H are graphs illustrating the variation of reflectivity with polar direction for the light output from a display device of FIG. 1A using the plural retarders of FIG.

5A for different points on the display device for the right-side of the display with the angle 617R of in-plane component of the alignment of 90°, 95°, 100°, 110° respectively.

Each graph shows the variation in luminance with polar direction from the axis 199, for a given point on the display 100. Each graph is labelled with the angle 617 of the alignment direction. Further the angle at which the luminance drops below a certain level, i.e. the angle at which a point is not visible for a snooper, varies across the width of the display. This therefore means that for a given position of a snooper, different parts of the display will have different luminance.

Each of the profiles further illustrates the subtended angular size of the display for a primary user 45 as shown by polar outline 490. The profiles further illustrate the polar location 492 of the maximum luminance for zero elevation and the location 494 of the maximum luminance for the elevation of light at the top of the display device 100 as seen by the user 45.

As the angle 617 varies from 90 degrees, the polar locations 492, 496 of maximum luminance shift in polar direction. As shown in the embodiment of FIG. 3A, the angles 617 vary with spatial location, and thus the direction of peak luminance also varies with spatial position. Advantageously display luminance to the primary user 45 is increased. Further the reduction to the snooper is increased for points across at least part of the display. Further the uniformity of luminance reduction to the snooper 47 is increased. Visual security level of the display is increased.

FIGS. 11A-H illustrate the polar locations of the points 490, 492 of FIG. 10A-H, and thus provide the reflectivity as seen by the primary user 45. Advantageously reflectivity to the primary user may be reduced and reflectivity to the snooper may be increased.

In combination, the minimum visual security level, VSL as seen by the snooper 47 is increased for points across at least part of the display device 100, and the uniformity of VSL may be increased.

Arrangements of alignment directions for planar and curve displays will now be described.

Figure 12A:
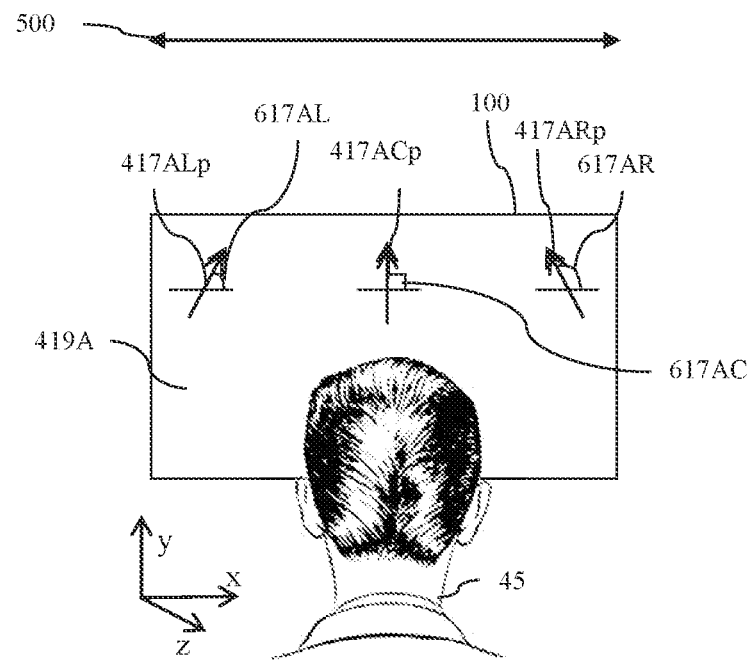
FIG. 12A is a perspective view of a viewer in front of a planar display device.

FIG. 12A is a perspective view of a user 45 in front of a planar display device 100 comprising a polar control retarder 300 comprising a liquid crystal retarder 301 comprising alignment layer 417A. Features of the arrangement of FIG. 12A not discussed in further detail may be assumed to correspond to the features with equivalent reference numerals as discussed above, including any potential variations in the features.

In the embodiments herein wherein only one of the two alignment layers 419A, 419B is illustrated then the other of the alignment layers that is not shown may be arranged with corresponding alignment directions, for example as illustrated in FIG. 5A, FIG. 5B, FIG. 16, FIG. 18A, FIG. 19A. FIG. 19C or FIG. 20B as illustrated elsewhere herein.

In FIG. 12A, the display device 100 has a planar structure such that it is flat. For every point on the display 100, an on-axis user 45 views each point at a different lateral and elevation angle as illustrated in FIG. 9A. As seen above in FIGS. 10A-H and FIGS. 11A-H, these angles impact the luminance and reflectivity for an on-axis observer for each of the points.

Thus the different alignment directions 417ALp, 417ACp, 417Arp with orientation angles 617AL, 617AC, 617AR respectively are arranged to provide variations in the direction of maximum luminance across the angular size of the display as described elsewhere herein. Advantageously the varying alignment directions achieve increased uniformity across the display device 100 of both luminance and reflectivity as observed by the user 45 at viewing distance 480. Visual security to off-axis snooper 47 is also increased.

In other words, in comparison to the arrangement of FIG. 9C, FIG. 12A illustrates that the uniformity is increased by means of varying the polar angle of the maximum luminance at different lateral locations across the display device 100.

An alternative arrangement for a curved display 100 will now be described.

Figure 12B:
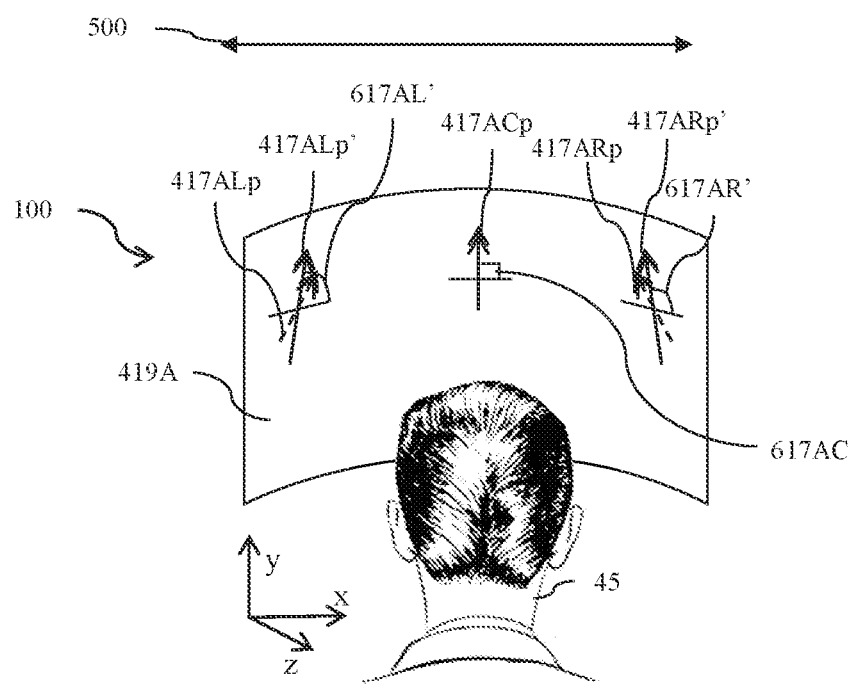
FIG. 12B is a perspective view of a viewer in front of a curved display device.

FIG. 12B is a perspective view of a user 45 in front of a curved display device 100 comprising a polar control retarder 300 comprising a liquid crystal retarder 301 comprising alignment layer 417A. The display device 100 is curved about the y-axis and has a centre of curvature on the same side of the display device 100 as the user 45. Features of the arrangement of FIG. 12B not discussed in further detail may be assumed to correspond to the features with equivalent reference numerals as discussed above, including any potential variations in the features.

In the alternative of FIG. 12B, wherein the display 100 comprises an arrangement such as illustrated in FIG. 1A the additional polariser 318A and the at least one polar control retarder 300 are curved with a concave curvature. The spatial light modulator 48 and backlight 20 is also curved with a concave curvature.

FIG. 12B illustrates an alternative structure wherein the display device 100 is curved. In such a case, the additional polariser 318, the at least one polar control retarder 300 and optionally the spatial light modulator 48 are curved with a concave curvature. The other components of the device 100, as described above, may also be curved with a concave curvature.

The curved display device 100 may further improve the luminance for an on-axis observer of the display device as the lateral angle for individual points across the display may be reduced.

In this instance, the in-plane component of the liquid crystal material 414 adjacent the alignment layers 419A, 419B, may not need to be as large to create the desired effect. The alignment directions 417ALp', 417ARp' are different to the alignment directions 417ALp, 417ARp, the deviations of angles 617AL', 617AR' from 90 degrees (that is the direction orthogonal to the axis 500) being reduced. Advantageously the uniformity of the display may be increased and visibility of the display to off-axis snoopers may be reduced.

Figure 13A:
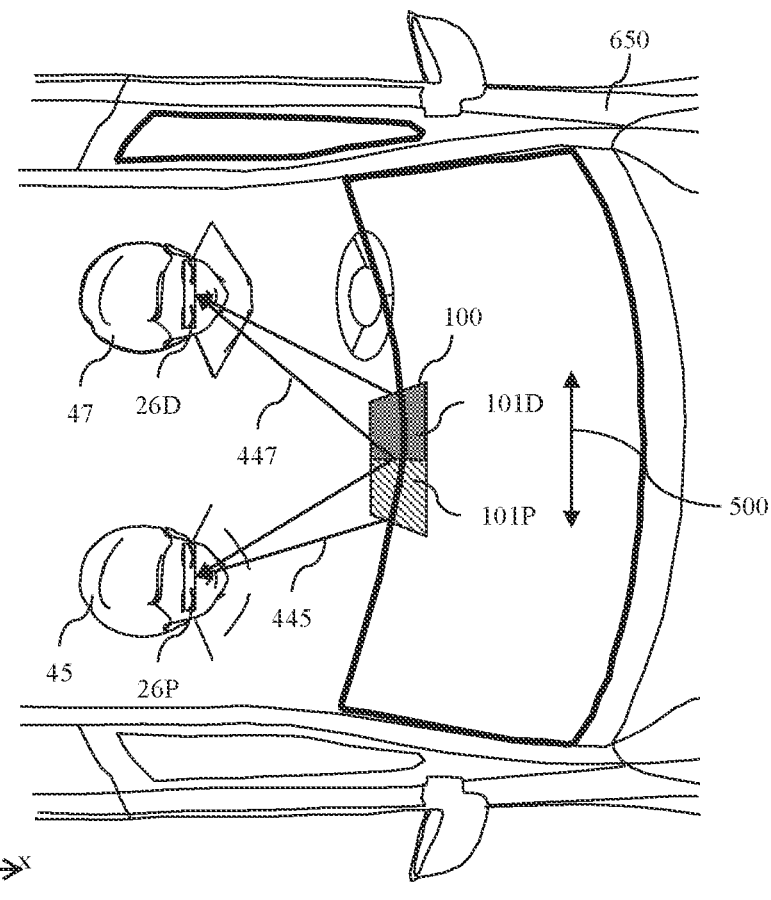
FIG. 13A is a top view of a centre stack display for an automotive vehicle.

FIG. 13A is a top view of a centre stack display for an automotive vehicle 650. Display 100 comprises a first part 101P that is provided with modified alignment directions best suited to passenger that is user 45 whereas second part 101D is provided with modified alignment directions best suited to driver that is user 47. In comparison to the embodiments illustrated elsewhere herein, the alternative of FIG. 13A illustrates that the display 100 comprises first and second parts 101D, 101P.

In comparison to the embodiment of FIG. 9A, the left part 101D of the display 100 provides an optical window 26D in the region of the driver 47 and the right part 101P of the display 100 provides an optical window 26P in the region of the passenger 45. Advantageously uniformity of luminance is increased for viewing of the part 101D by the driver 47 and uniformity is increased for viewing of the part 101P by the passenger 45. Further uniformity of security factor is increased for viewing of the part 101P by the driver 47 and uniformity of security factor is increased for viewing of the part 101D by the passenger 45.

In other embodiments (not shown), the first and second parts 101P, 101D may be interleaved, for example to provide a camouflage effect, for example with features that are a few millimetres or less in width. Advantageously increased obscuration of image data may be provided.

Figure 13B:
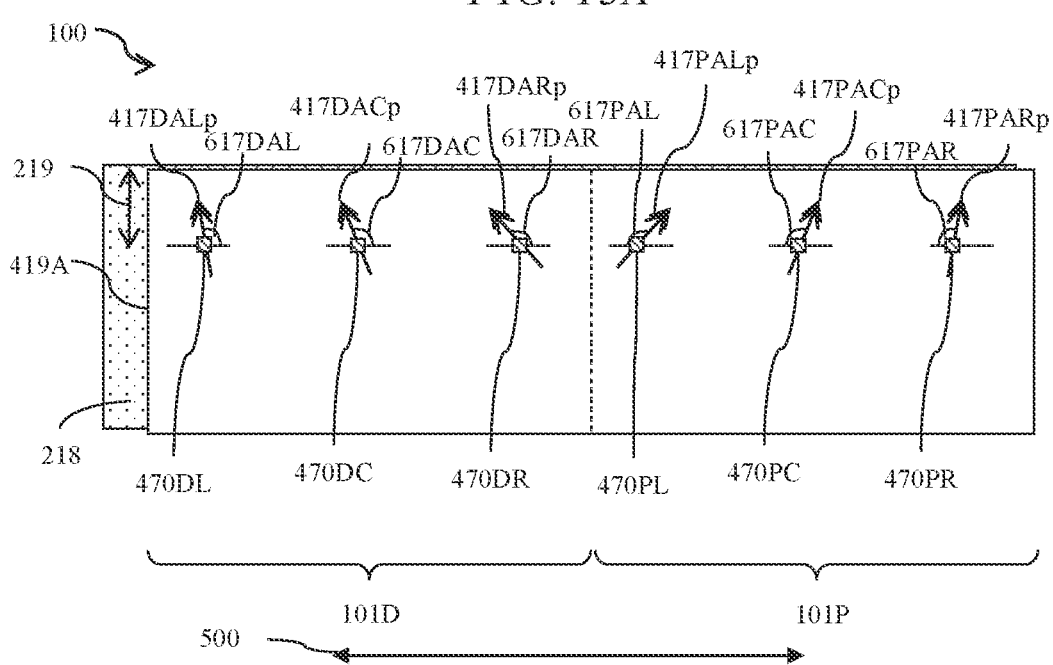
FIG. 13B is a top view of an alignment layer for the display of FIG. 13A.

FIG. 13B is a top view of an alignment layer 419A for the display 100 of FIG. 13A comprising the arrangement of FIG. 1A and further comprising first and second parts 101P, 101D. Features of the arrangement of FIG. 13B not discussed in further detail may be assumed to correspond to the features with equivalent reference numerals as discussed above, including any potential variations in the features.

Considering one alignment layer 417A of the pair of alignment layers 419A, 419B, the angle 617DAL, 617DAC, 617DAR of said in-plane component 417DALp, 417DACp, 417DARp of the alignment in the adjacent liquid crystal material 414 changes monotonically along the predetermined axis 500 across a first part 10D of the display device 100. The angle 617PAL. 617PAC, 617PAR of said in-plane component 417PALp, 417PACp, 417PARp of the alignment in the adjacent liquid crystal material 404 also changes monotonically along a predetermined axis across a second part of the display device.

Referring further to FIG. 13A, the angle 617D of said in-plane component of the alignment 417Dp in the adjacent liquid crystal material 414 changes monotonically along the predetermined axis 500 across the first part 101D of the display device 100 so that directions of maximum light transmission of the display polarizer 218, the additional polariser 318 and said at least one polar control retarder 300 from points 470DL, 470DC, 470DR of the first part of the display device 100 in are directed towards a first common optical window 26D in front of the display device 100, and the angle 617P of said in-plane component 417Pp of the alignment in the adjacent liquid crystal material 414 changes monotonically along the predetermined axis 500 across the second part 101P of the display device 100 so that directions of maximum light transmission of the display polarizer 218, the additional polariser 318 and said at least one polar control retarder 300 from points of the second part 101P of the display device 100 are directed towards a second common optical window 26P in front of the display device 100 different from the first common optical window 26D.

FIG. 13B illustrates alignment layer 418A alignment directions 417PALp, 417PACp, 417PARp with angles 617PAL, 617PAC, 617PAR for the first part 101P. Such an alignment advantageously achieves increased uniformity from the right side of the display 100 to the passenger user 45. FIG. 13B further illustrates alignment layer 418A alignment directions 417DALp, 417DACp, 417DARp with angles 617DAL, 617DAC, 617DAR for the second part 101D. Such an alignment advantageously achieves increased uniformity from the right side of the display 100 to the driver user 47.

Thus for the two surface alignment layers 419A. 419B disposed adjacent to the layer of liquid crystal material 414 and on opposite sides thereof, at least one of the surface alignment layers is arranged to provide alignment in the adjacent liquid crystal material with an in-plane component 417 that is in the plane of the layer 314 of liquid crystal material 414, wherein the angle 617 of said in-plane component of the alignment in the adjacent liquid crystal material 414 changes monotonically along the predetermined axis across a first part 101D of the display device 100 and changes monotonically along the predetermined axis across a second part 101P of the display device 100.

As shown in FIG. 13B, in this example in each of the first part 101D and the second part 101P, the respective mean directions of the in-plane component of the alignment in the adjacent liquid crystal material are at non-zero acute angles to the electric vector transmission directions of the output polariser 218, the reflective polariser 302 and the additional polariser 318.

An alternative switchable privacy display for off-axis display will now be described.

Figure 13C:
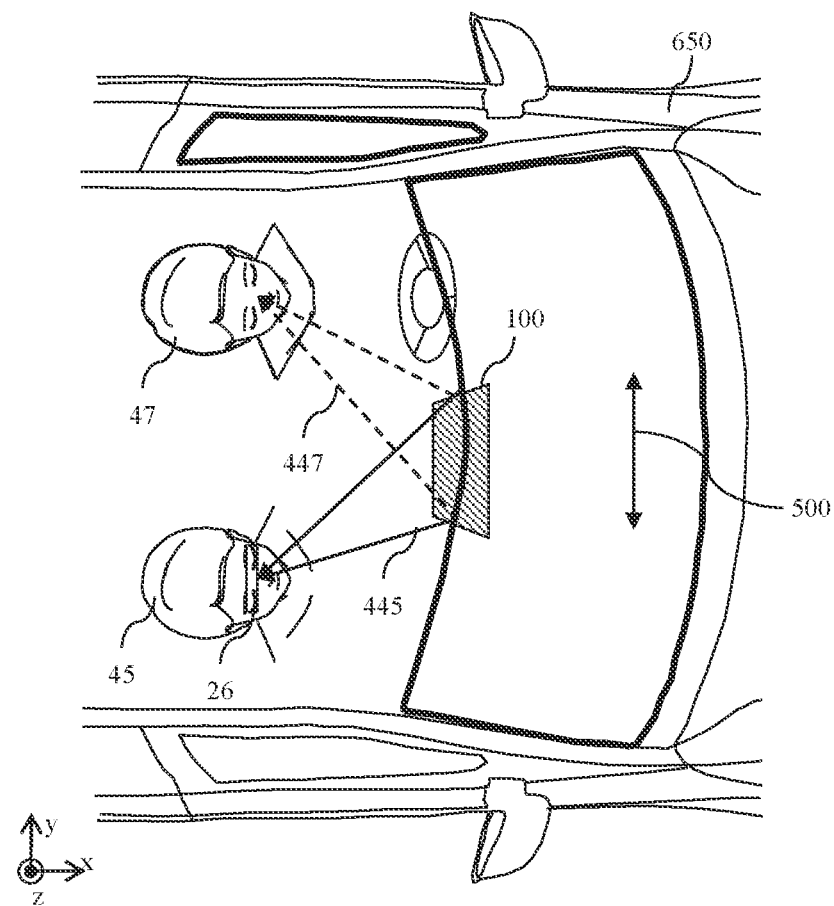
FIG. 13C is a top view of an alternative centre stack display for an automotive vehicle.

FIG. 13C is a top view of an alternative centre stack display 100 for an automotive vehicle 650 comprising the display 100 of FIG. 1A with the reflective polariser 302 omitted and the polar control retarder of FIG. 19A, hereinbelow. Features of the arrangement of FIG. 13C not discussed in further detail may be assumed to correspond to the features with equivalent reference numerals as discussed above, including any potential variations in the features.

In comparison to the arrangement of FIG. 13A, in the alternative display of FIG. 13C, a central privacy display is provided for use by the passenger 45 and to provide image invisibility to the driver 47. A single optical window 26 is provided for the passenger 45. Advantageously image invisibility may be provided to the driver 47 while the passenger may view otherwise distracting content such as entertainment information.

Figure 13D:
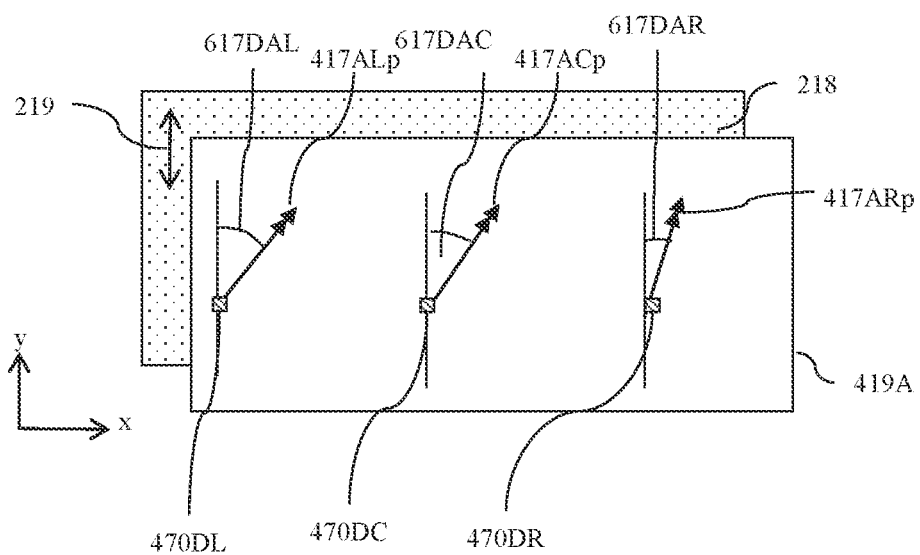
FIG. 13D is a top view of an alignment layer for the display of FIG. 13C.

FIG. 13D is a top view of an alignment layer 419A for the display of FIG. 13C. Features of the arrangement of FIG. 13D not discussed in further detail may be assumed to correspond to the features with equivalent reference numerals as discussed above, including any potential variations in the features. In comparison to the embodiment of FIG. 13B, the average angle 617DAL, 617DAC, 617DAR across the display 100 is non-zero.

Figure 13E:
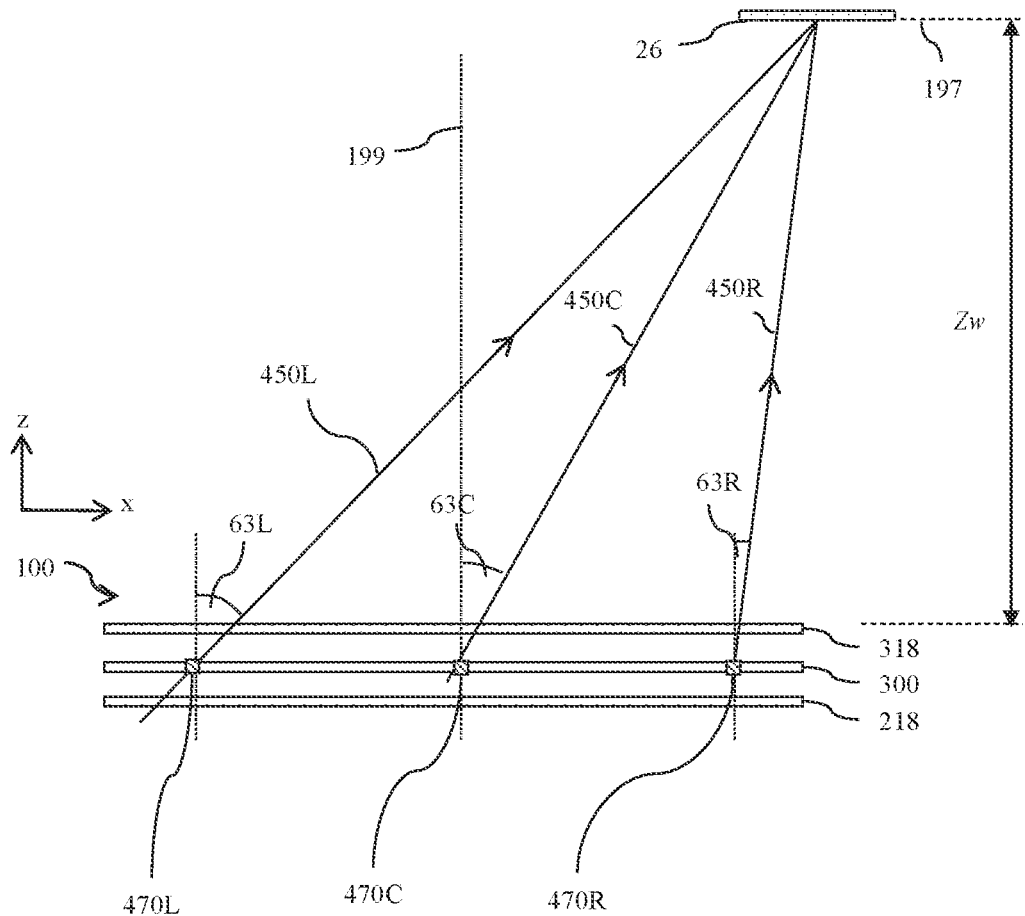
FIG. 13E is a schematic top view of the display device illustrating observation viewing angles of the display of FIG. 13C.

FIG. 13E is a schematic top view of the display device illustrating observation viewing angles 450L, 450C, 450R of the display from points 470L, 470C, 470R of FIG. 13C. Features of the arrangement of FIG. 13E not discussed in further detail may be assumed to correspond to the features with equivalent reference numerals as discussed above, including any potential variations in the features.

The angles 63L, 63c, 63R of maximum transmission are all inclined to axis 199 and are directed to the common optical window 26 that is off-axis.

Figures 13F, 13G, 13H:
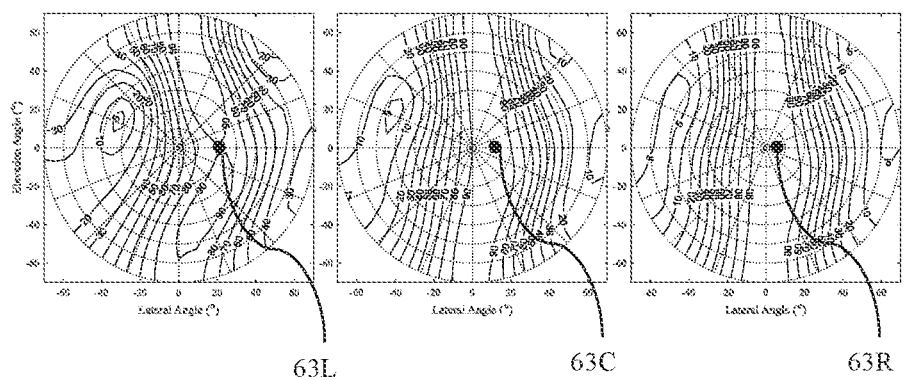
FIGS. 13F-H are graphs illustrating the variation of luminance with polar direction for the light output from a display device of FIG. 13C from different positions across the display.

FIGS. 13F-H are graphs illustrating the variation of luminance with polar direction for the light output from a display device of FIG. 13C from different positions across the display 100. Advantageously uniform luminance may be provided to the passenger 45 at the window 26 and uniform security factor may be provided to the driver 47, reducing visibility of distracting image data.

Arrangements of alignment directions for tiled displays will now be described.

Figure 14A:
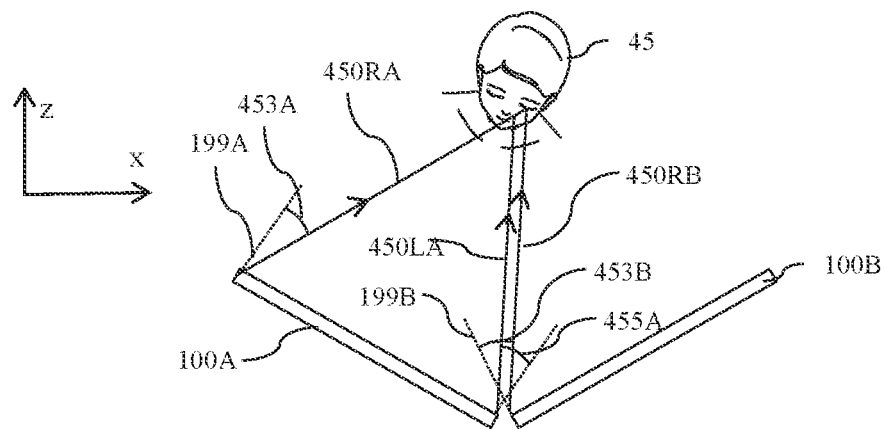
FIG. 14A and FIG. 14B are top and perspective views, respectively, of a pair of tiled display devices that are angled with respect to each other.
Figure 14B:
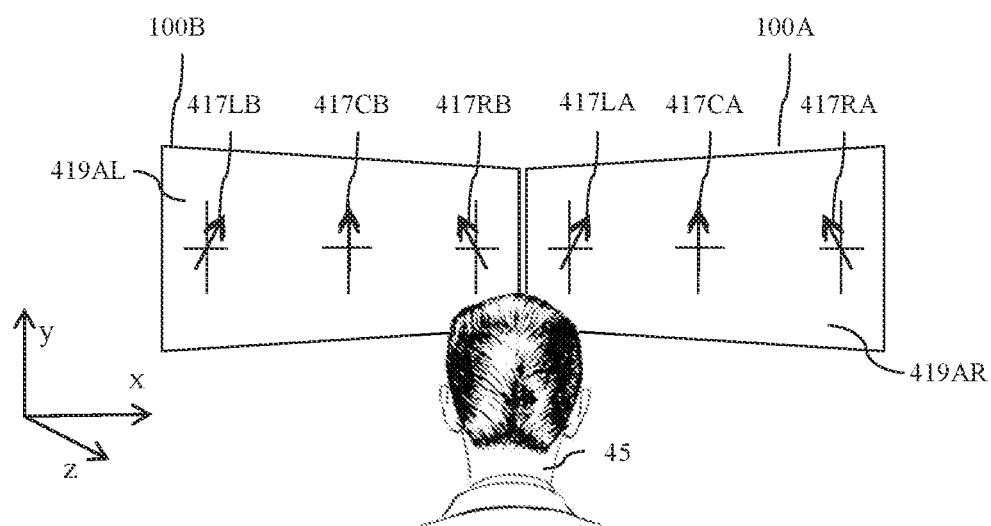

FIG. 14A and FIG. 14B are top and perspective views, respectively, of a pair of tiled display devices 100 that are angled with respect to each other such that the user 45 is aligned to the optical axis 199A, 199B for the centre of each respective display device 100A, 100B. Features of the arrangements of FIGS. 14A-B not discussed in further detail may be assumed to correspond to the features with equivalent reference numerals as discussed above, including any potential variations in the features.

The direction of ray 450LA from display 100A is parallel to ray 450RB from display 100B. The arrangement of alignment directions 417RA, 417CA, 417LA may be the same as the arrangement 417RB, 417CB, 417LB. Advantageously the same alignment may be used for both displays and cost is reduced.

Figure 15A:
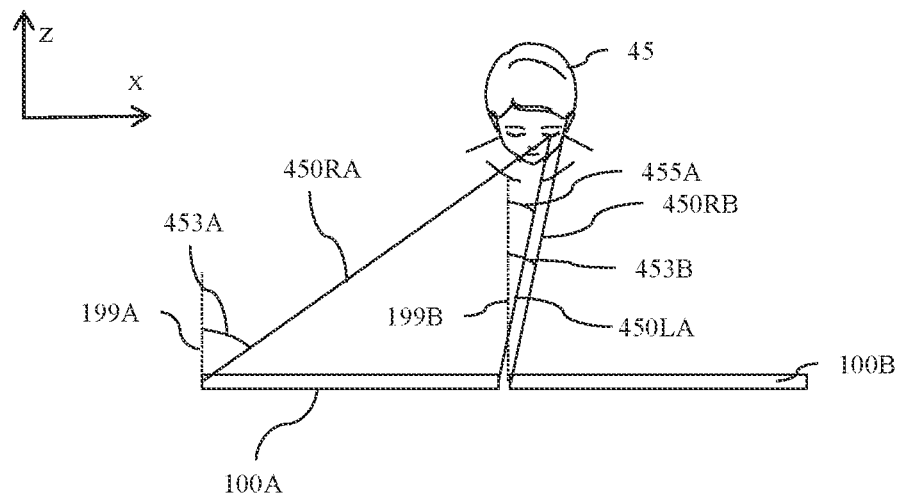
FIG. 15A and FIG. 15B are top and perspective views, respectively, of a pair of tiled display devices that are in-plane with respect to each other.
Figure 15B:
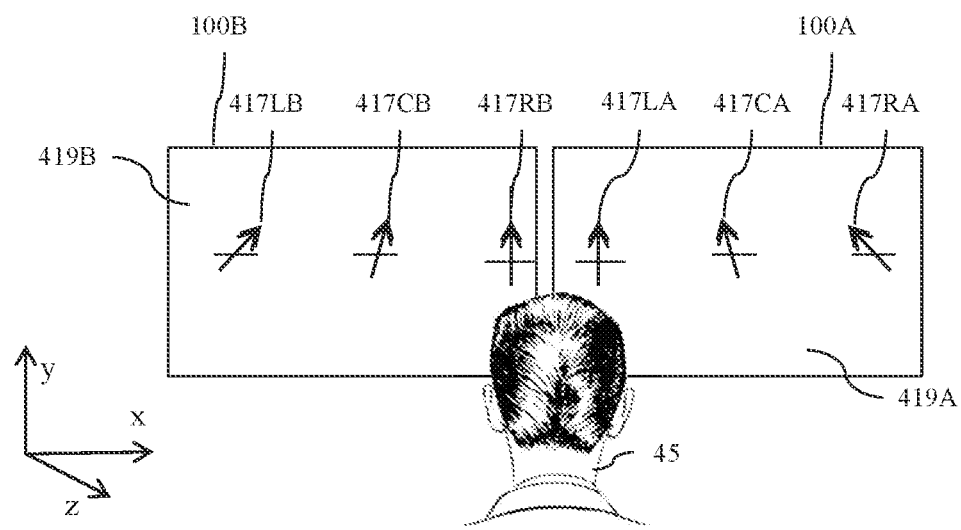

FIG. 15A and FIG. 15B are top and perspective views, respectively, of a pair of tiled display devices 100 that are in-plane with respect to each other.

In comparison to the arrangement of FIGS. 15A-B different arrangements of alignment layers 419 are used for display devices 100A, 100B.

As is apparent from FIG. 15A, a user 45 may no longer be arranged on-axis with the centre of each display. Instead, the user may, approximately, be positioned on-axis with an edge of each display. Accordingly, as shown in FIG. 15B, at least the alignment layer 419B may be arranged to provide alignment in the adjacent liquid crystal material 414 which differs to that for a display 100 which is viewed with a user on-axis with the centre of the display 100, for example as shown in FIG. 3A. The alignment in this arrangement of the display 100 may be arranged such that the luminance appears uniform for points across at least part of the display, despite the observer 45 not being arranged on-axis with the centre of the display 100.

A further illustrative embodiment will now be described.

Figure 16:
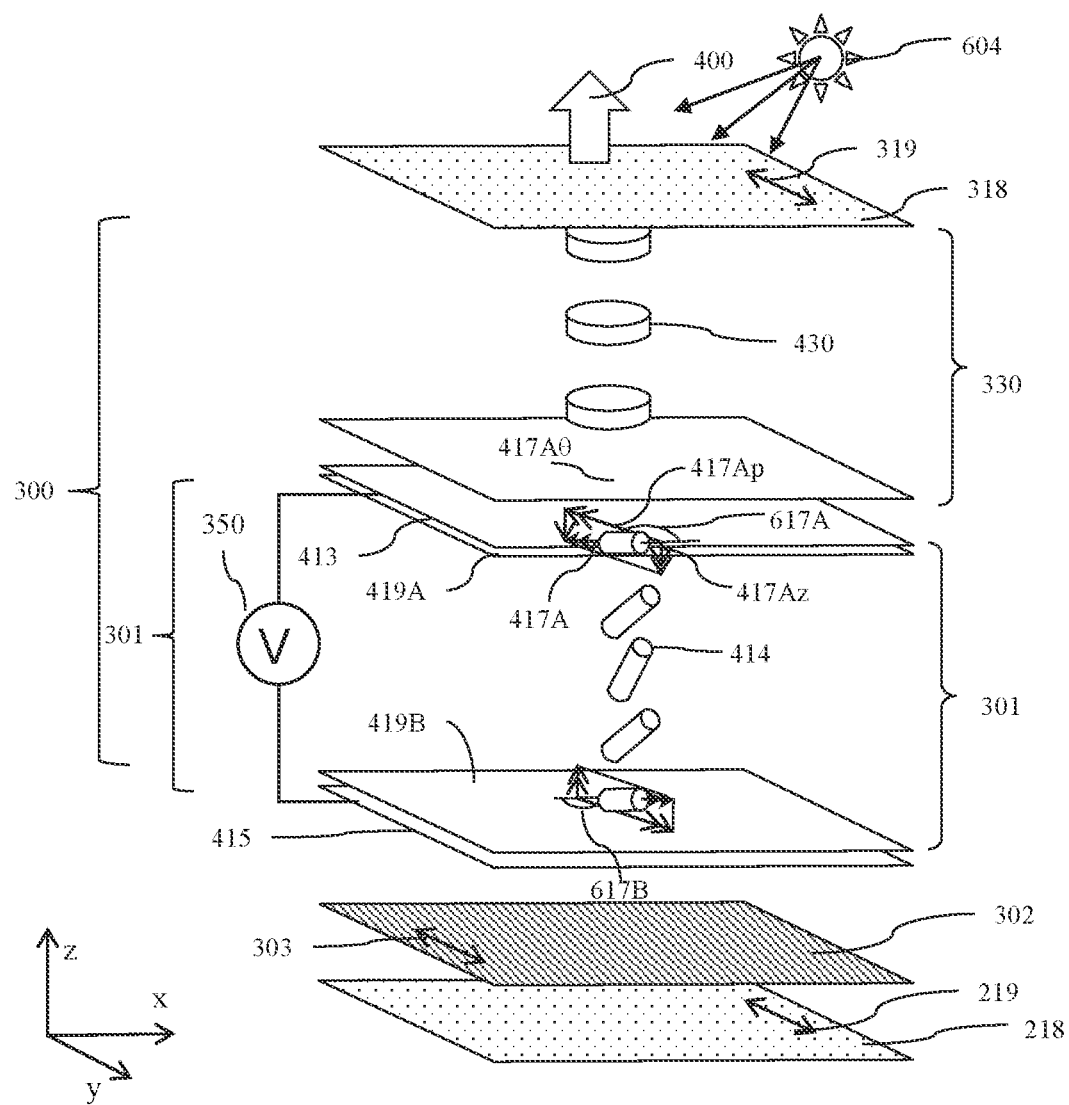
FIG. 16 is a perspective view of polar control retarders that may be applied in FIG. 1, comprising a homogeneously aligned switchable LC retarder and negative C-plate retarder.

FIG. 16 is a perspective view of a polar control retarder 300 that may be applied in the display device 100 seen in FIG. 1A. The polar control retarder 300 comprises a homogeneously aligned switchable LC retarder 301. This is shown by the aligned directions 417A, 417B on the electrodes 413, 415. The polar control retarder 300 further comprises a passive polar control retarder provided by a negative C-plate retarder 330. The negative C-plate has an optical axis perpendicular to the plane of the retarder 330, illustrated schematically by the orientation of the discotic material 430.

Features of the arrangement of FIG. 16 not discussed in further detail may be assumed to correspond to the features with equivalent reference numerals as discussed above, including any potential variations in the features.

Figures 17A, 17B, 17C:
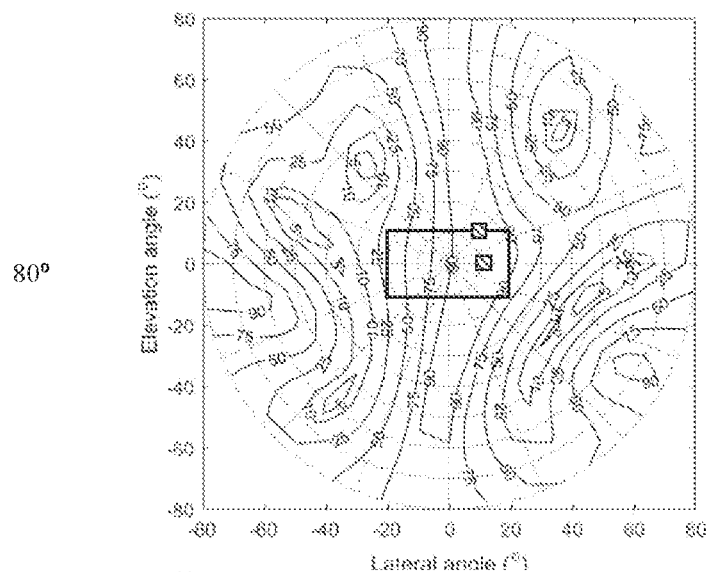
FIGS. 17A-C are graphs illustrating the variation of luminance with polar direction for the light output from a display device of FIG. 1A using the plural retarders of FIG. 16 for different points on the display device with the angle of in-plane component of the alignment of 80°, 90°, 100° respectively.
Figure 17D:
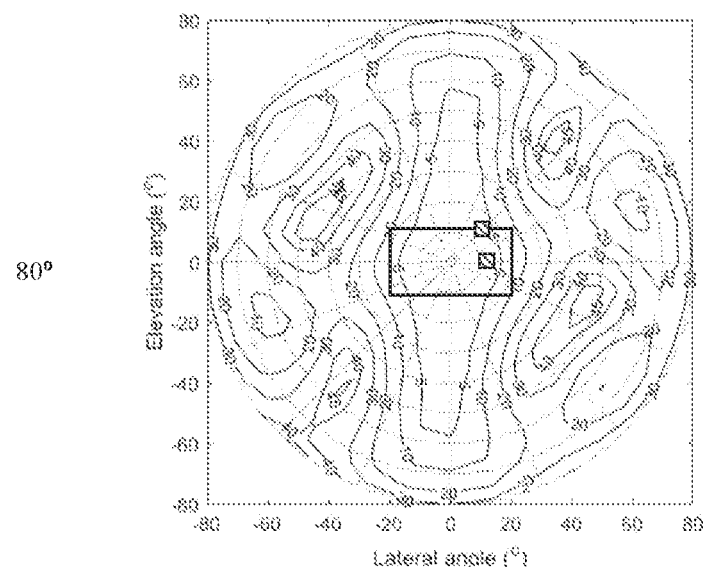
FIGS. 17D-F are graphs illustrating the variation of reflectivity with polar direction for the light output from a display device of FIG. 1A using the plural retarders of FIG. 16 for different points on the display device with the angle of in-plane component of the alignment of 80°, 90°, 100° respectively.
Figure 17E:
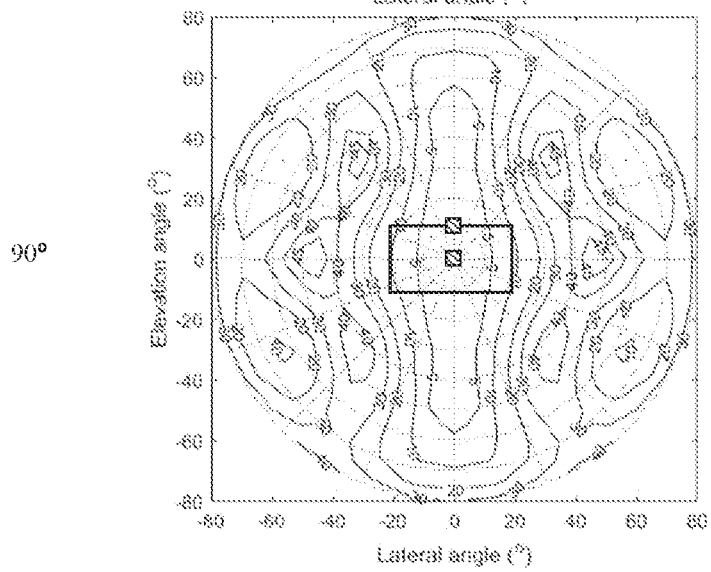
Figure 17F:
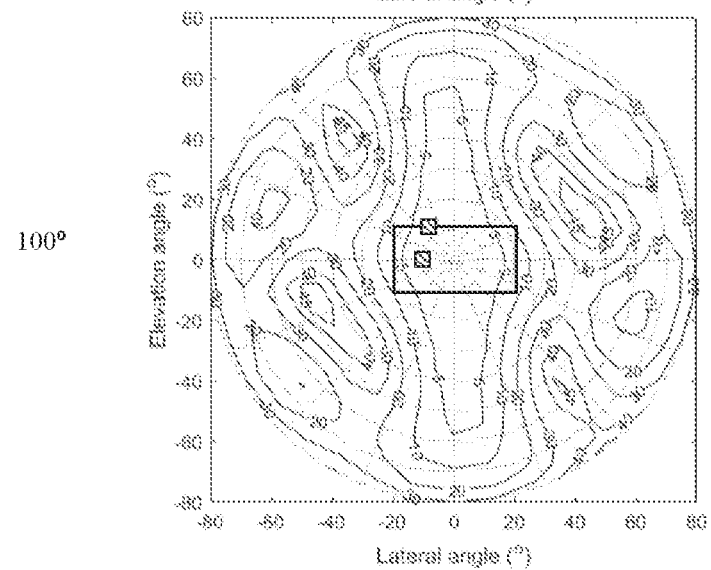

FIGS. 17A-C are graphs illustrating the variation of luminance with polar direction for the light output from a display device of FIG. 1A using the plural retarders of FIG. 16 for different points on the display device with the angle of in-plane component of the alignment of 80°, 90°, 100° respectively; and FIGS. 17D-F are graphs illustrating the variation of reflectivity with polar direction for the light output from a display device of FIG. 1A using the plural retarders of FIG. 16 for different points on the display device with the angle of in-plane component of the alignment of 80°, 90°, 100° respectively.

The profiles of FIGS. 17A-F are provided for the properties of TABLE 2.

TABLE 2

| Passive retarder(s) | | Active LC retarder | | | |
|---|---|---|---|---|---|
| Type | Δn.d/nm | Alignment layers | Pretilt/ deg | Δn.d/ nm | Δε | Voltage/ V |
| C-plate | −700 | Homogeneous Homogeneous | 2 2 | 750 | 13.2 | 2.3 |

Advantageously thickness and cost may be reduced in comparison to the embodiment of FIG. 5A.

Figure 18A:
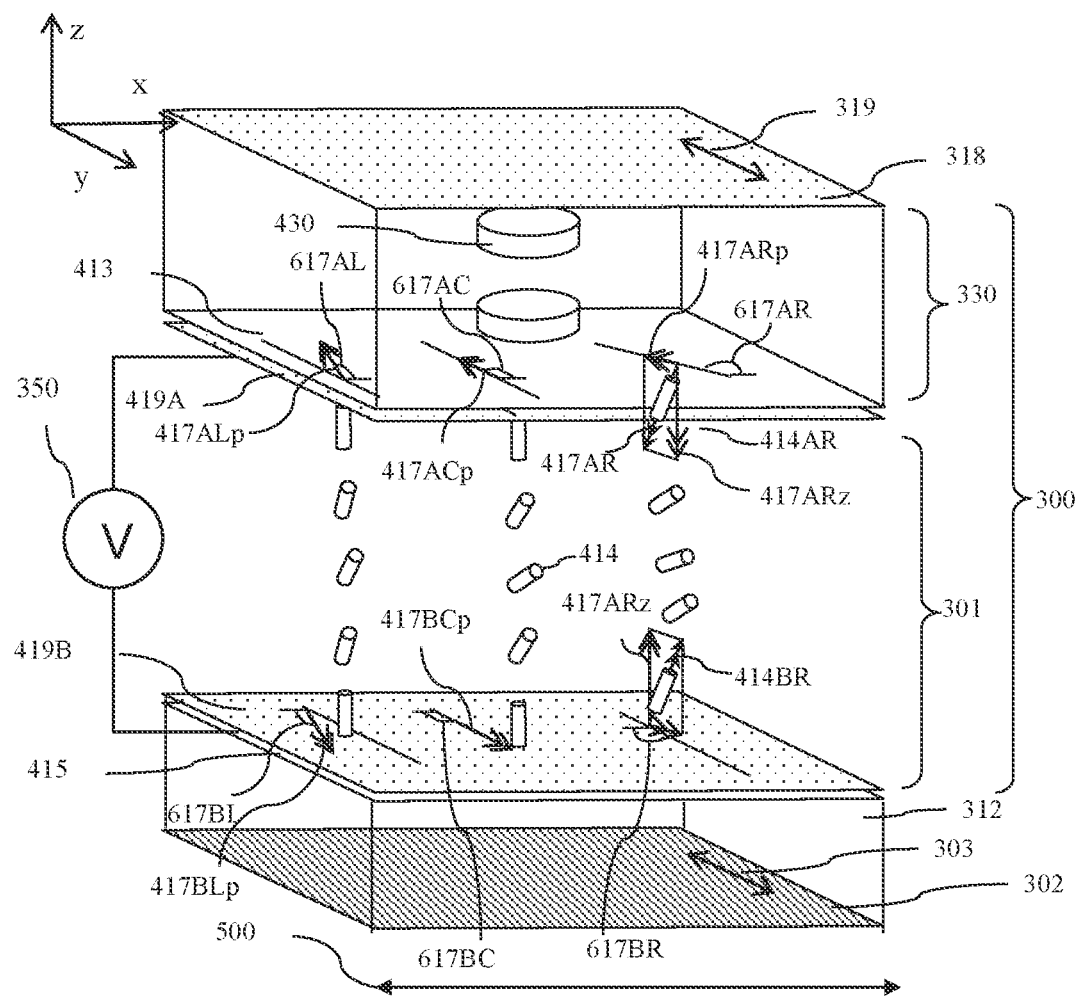
FIG. 18A is perspective views of polar control retarders that may be applied in FIG. 1, comprising a homeotropically aligned switchable LC retarder and negative C-plate retarder in privacy mode of operation.
Figure 18B:
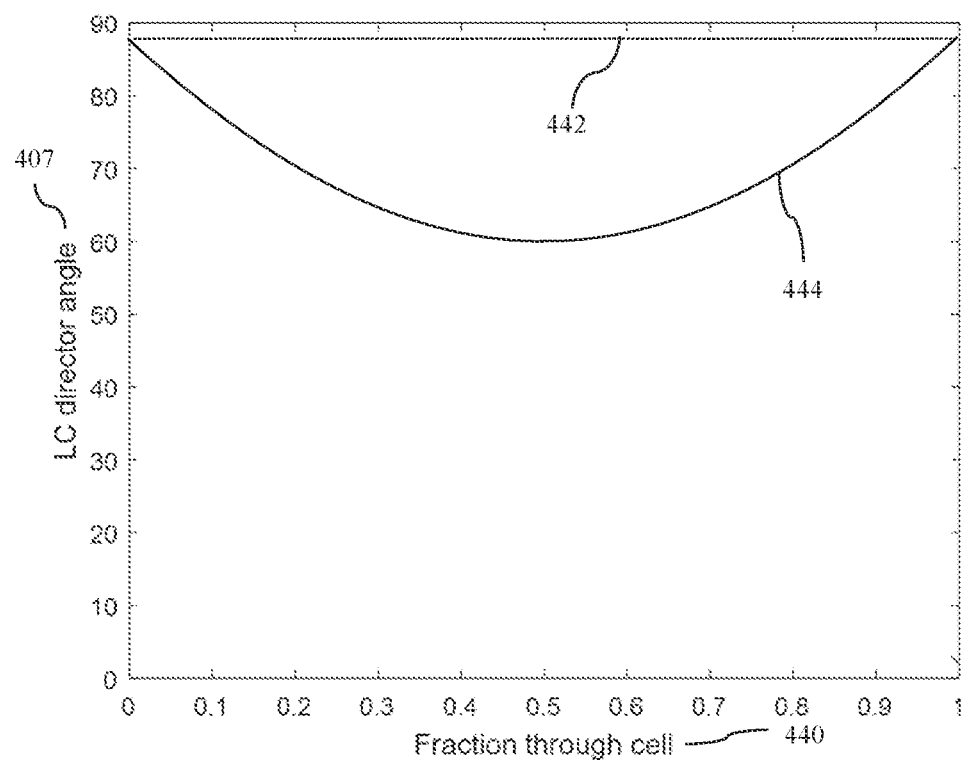
FIG. 18B is a graph of the LC director angle of the homeotropically aligned switchable LC in FIG. 18A through its thickness.

FIG. 18A is perspective views of polar control retarders 300 that may be applied in FIG. 1, comprising a homeotropically aligned switchable LC retarder and negative C-plate retarder in privacy mode of operation; and FIG. 18B is a graph of the LC director angle 407 of the homeotropically aligned switchable LC 414 in FIGS. 17D and 17E through its thickness, shown as the fraction 440 through LC retarder 301. The polar control retarder 300 comprises a homeotropically aligned switchable LC retarder 301 and negative C-plate retarder 330. Features of the arrangement of FIG. 18A not discussed in further detail may be assumed to correspond to the features with equivalent reference numerals as discussed above, including any potential variations in the features.

In comparison to the homogeneous alignment of FIGS. 5A-B, FIG. 18A illustrates that the homeotropically aligned switchable LC retarder 301 has two surface alignment layers 419A, 419B, each having alignment directions 417AL, 417AC, 417AR, 417BL, 417BC, 417BR which provide homeotropic alignment in the adjacent liquid crystal material 414 with a pre-tilt providing the in-plane component, albeit that these in-plane components 417ALp, 417ACp, 417ARp and 417BLp, 417BCp, 417BRp are relatively small in magnitude, and the pretilt components 417ALz, 417ACz, 417ARz and 417BLz, 417BCz, 417BRz that are out of the plane are relatively large in magnitude.

FIG. 18B illustrates the LC director angle 407 shown by profile 444 when a drive voltage is applied, and profile 442 illustrates the LC director angle 407 when no voltage is applied. This graph illustrates how when a drive voltage is applied the liquid crystal material 414 has a varying director angle 407 through the thickness of the layer 314 and when no voltage is applied, the liquid crystal material 414 has a constant LC director angle of close to but not exactly 90°.

In comparison to the homogeneous liquid crystal embodiments of FIG. 5A and FIG. 16, the liquid crystal material 414 may provide wide viewing angle with no applied voltage. The homeotropic alignment at the alignment layers 419 may be arranged with a small pretilt as illustrated by profile 442, such that there remains a preferred alignment direction 617 arrangement within the layer 314, and thus the molecules 414 are provided with a preferred orientation within the layer that varies in the predetermined direction 500.

Figure 19A:
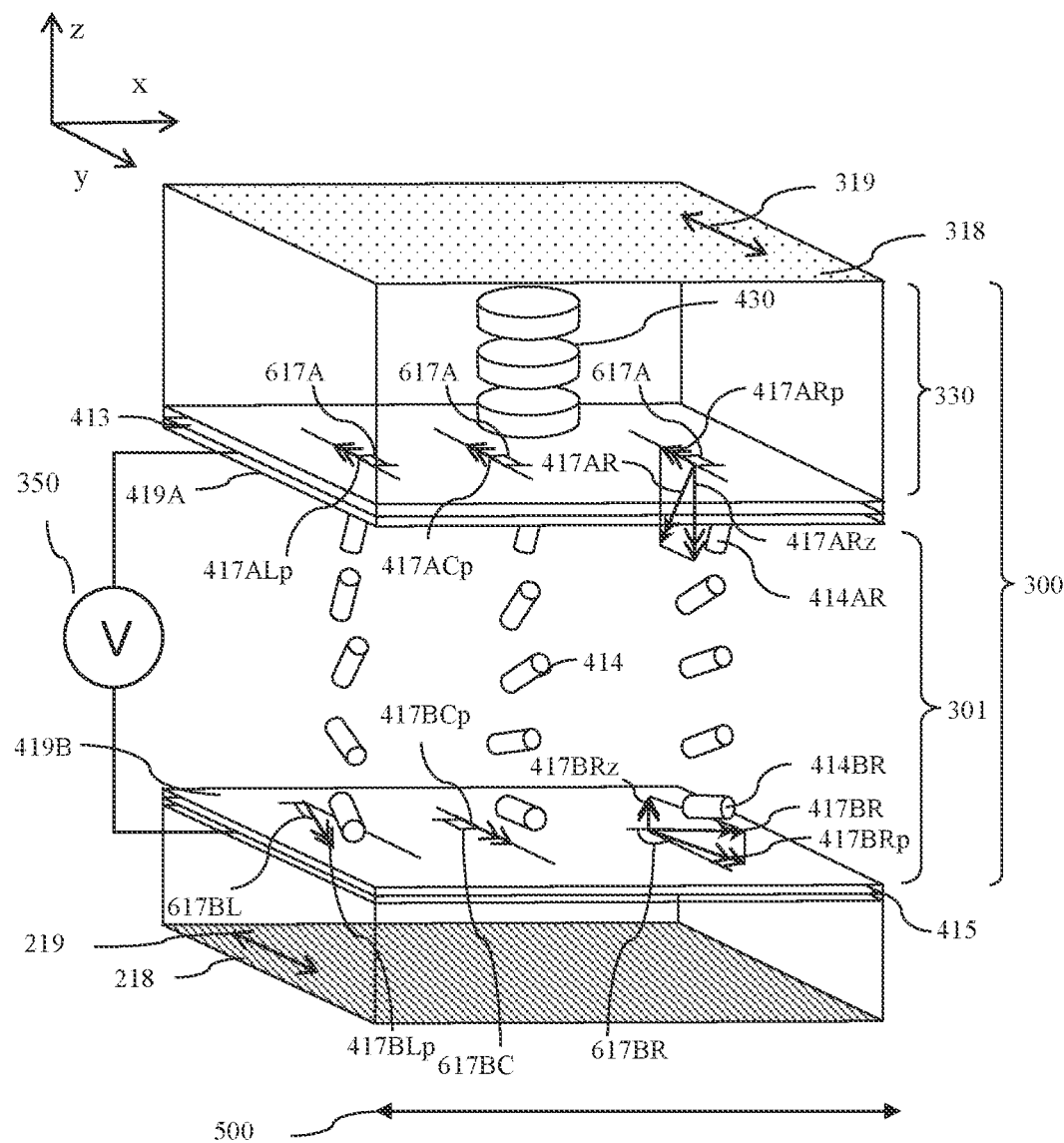
FIG. 19A is perspective views of polar control retarders that may be applied in FIG. 1, comprising a homeotropically and homogeneously aligned switchable LC retarder and a negative C-plate retarder wherein the alignment direction of the homeotropic alignment layer is common across the lateral direction and wherein the alignment direction of the homogeneous alignment layer varies across the lateral direction.

FIG. 19A is perspective views of polar control retarders 300 that may be applied in FIG. 1, comprising a homeotropically and homogeneously aligned switchable LC retarder 301 and a negative C-plate retarder and wherein the alignment direction of the homeotropic alignment layer 419A is common across the lateral direction and wherein the alignment direction of the homogeneous alignment layer 419B varies across the lateral direction. Features of the arrangements of FIG. 19A not discussed in further detail may be assumed to correspond to the features with equivalent reference numerals as discussed above, including any potential variations in the features. An exemplary embodiment is illustrated in TABLE 6.

TABLE 6

| | Passive polar control retarder(s) | | Active LC retarder | | | | |
|---|---|---|---|---|---|---|---|
| Mode | Type | Δn.d/nm | Alignment layers | Pretilt/deg | Δn.d/nm | Δε | Voltage/V |
| Public | Negative C | −1100 | Homogeneous | 2 | 1300 | +4.3 | 15.0 |
| Privacy | | | Homeotropic | 88 | | | 2.8 |

In the alternative embodiment of FIG. 19A, one of the surface alignment layers 419B is arranged to provide homogeneous alignment in the adjacent liquid crystal material 414, wherein the angle 617BL, 617BC, 617BR of said in-plane component of the alignment in the liquid crystal material 414 adjacent to said one of the surface alignment layers 419B changes monotonically along the predetermined axis 500 across at least part of the display device 100, and the other of the surface alignment layers 419A is arranged to provide homeotropic alignment in the adjacent liquid crystal material 414, wherein the angle 617A of said in-plane component of the alignment in the liquid crystal material adjacent to said other of the surface alignment layers 619A does not change along the predetermined axis 500 across at least part of the display device 100.

When the surface alignment layer 419a arranged to provide homeotropic alignment is between the layer 314 of liquid crystal material 414 and the polar control retarder 330, the liquid crystal retarder 301 has a retardance for light of a wavelength of 550 nm in a range from 500 nm to 1800 nm, preferably in a range from 700 nm to 1500 nm and most preferably in a range from 900 nm to 1350 nm. The polar control retarder 300 may further comprise a passive polar control retarder 330 having its optical axis perpendicular to the plane of the retarder 330, the passive polar control retarder 330 having a retardance for light of a wavelength of 550 nm in a range from −300 nm to −1600 nm, preferably in a range from −500 nm to −1300 nm and most preferably in a range from −700 nm to −1150 nm; or the retarder 330 may further comprise a pair of passive retarders which have optical axes in the plane of the retarders that are crossed, each retarder of the pair of retarders having a retardance for light of a wavelength of 550 nm in a range from 400 nm to 1600 nm, preferably in a range from 600 nm to 1400 nm and most preferably in a range from 800 nm to 1300 nm.

FIG. 19A illustrates that the aligned switchable LC retarder 301 has a surface alignment layer 419A, having alignment direction 417A which provides homogeneous alignment in the adjacent liquid crystal material 414 and having alignment direction 417B which provides homeotropic alignment in the adjacent liquid crystal material 414 with a pre-tilt providing the in-plane component. FIG. 19A further illustrates that the homeotropic alignment layer 419A is arranged between the passive retarder 330 and the liquid crystal retarder 301.

In comparison to the embodiments of FIGS. 5A-B and FIG. 18A, the homeotropic alignment layer has an alignment direction that is common in the direction parallel to the axis 500. Further, as the components 417ALp, 417ACp and 417ARp are small, then the effect of the respective alignment layers 417ALp, 417BLp and 417Arp, 417BRp not being parallel or anti-parallel is small. The pupillation of the output, that is redirection of the direction of maximum transmission is thus mostly attributed to the homogeneous alignment layer and desirable pupillation of output is achieved. Advantageously the alignment layer 417A has reduced cost and complexity.

Figure 19B:
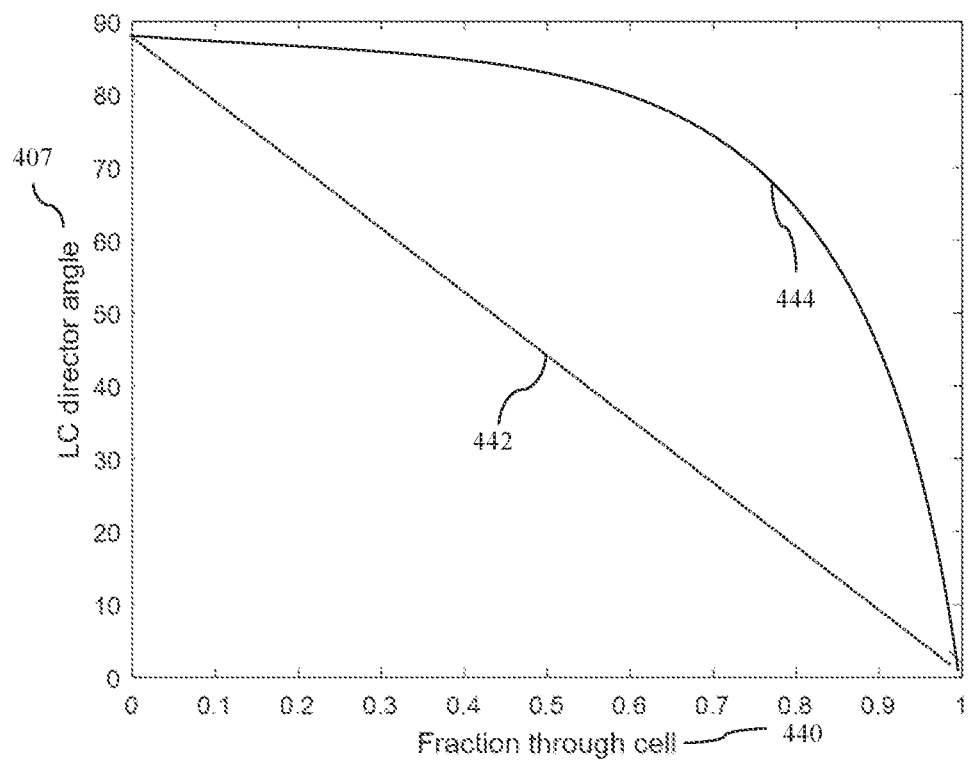
FIG. 19B is a graph of the LC director angle of the homeotropically and homogeneously aligned switchable LC in FIG. 19A through its thickness.
Figure 19C:
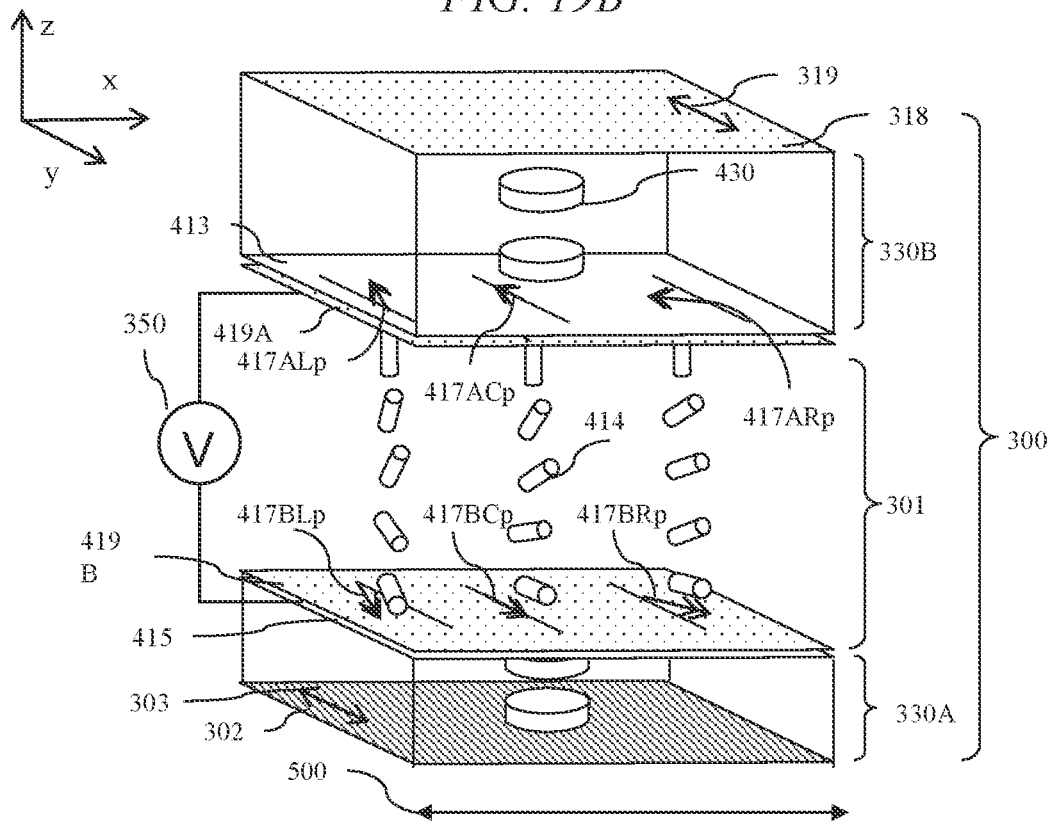
FIG. 19C is perspective views of polar control retarders that may be applied in FIG. 1, comprising a homeotropically and homogeneously aligned switchable LC retarder between negative C-plate retarders and wherein the alignment directions of the homogeneous alignment layer and homeotropic alignment layer each varies across the lateral direction.

FIG. 19B is a graph of the LC director angle of the homeotropically and homogeneously aligned switchable LC in FIG. 19A through its thickness 440.

FIG. 19B illustrates the LC director angle 407 shown by profile 444 when a drive voltage is applied, and profile 442 illustrates the LC director angle 407 when no voltage is applied. This graph illustrates how when a drive voltage is applied the liquid crystal material 414 has a non-linear variation of director angle 407 through the thickness of the layer 314 and when no voltage is applied, the liquid crystal material 414 has a constantly varying LC director angle.

In comparison to the arrangement of FIG. 18A, the arrangement of FIG. 19A may provide increased polar area for desirable visual security level. Advantageously privacy performance and uniformity may be improved for off-axis snoopers.

FIG. 19C is perspective views of polar control retarders 300 that may be applied in FIG. 1, comprising a homeotropically and homogeneously aligned switchable LC retarder 301 arranged between negative C-plate retarders 330A, 330B and wherein the alignment directions of the homogeneous alignment layer and homeotropic alignment layer each varies across the lateral direction. Features of the arrangement of FIG. 19C not discussed in further detail may be assumed to correspond to the features with equivalent reference numerals as discussed above, including any potential variations in the features.

FIG. 19C illustrates an alternative to FIG. 19A wherein the alignment layers 417A, 417B may be formed on passive retarders 330A, 330B, advantageously achieving reduced cost and thickness.

FIG. 19C illustrates another alternative to FIG. 19A wherein alignment layers 417A, 417B have in-plane orientations that vary monotonically along the direction of the axis 500. Advantageously increased transmission efficiency may be achieved for off-centre locations of the display.

Stacked plural retarders and additional polarisers comprising alignment layers with alignment that changes monotonically will now be described.

Figure 20A:
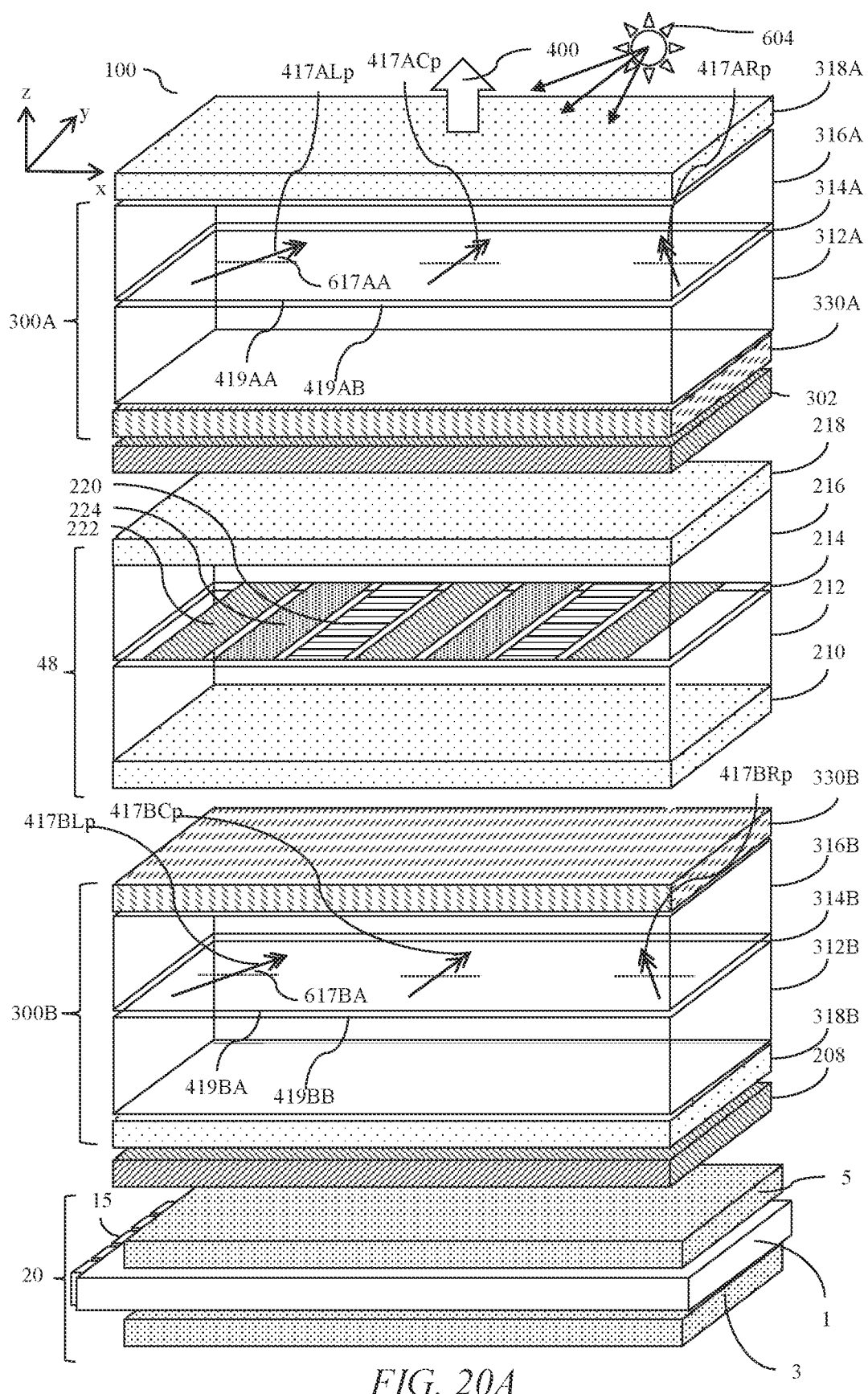
FIG. 20A is a side perspective view of a display device that is modified compared to the display device of FIG. 1A.
Figure 20B:
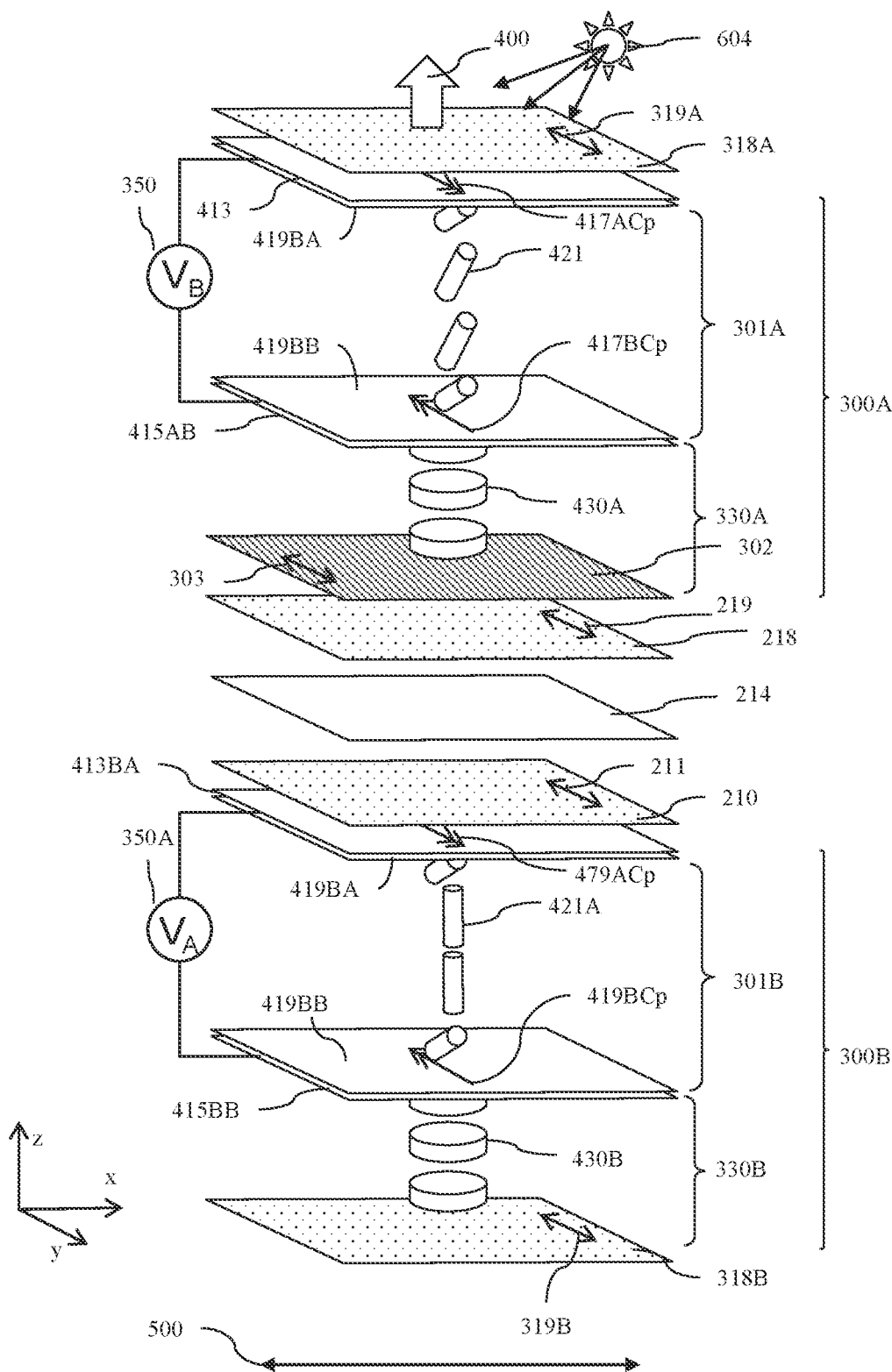
FIG. 20B is a perspective view of two sets of polar control retarders that may be applied in FIG. 1, each comprising a homogeneously aligned switchable LC retarder and negative C-plate retarder.

FIG. 20A is a side perspective view of a display device 100 that is modified compared to the display device 100 of FIG. 1A; and FIG. 20B is s a perspective view of two sets of polar control retarders 300, 300A that may be applied in FIG. 1, each comprising a homogeneously aligned switchable LC retarder 301, 301A and negative C-plate retarder 330, 330A. Features of the arrangements of FIGS. 20A-B not discussed in further detail may be assumed to correspond to the features with equivalent reference numerals as discussed above, particularly with reference to FIG. 1, including any potential variations in the features.

In comparison to the arrangement of FIG. 1A, the display device 100 comprises a further additional polariser 318B arranged on the input side of the input polariser 210 which is arranged on the input side of the SLM 48. As mentioned previously, the input polariser 210 is a linear polariser.

The polar control retarders 300 of FIG. 1 may be provided by respective polar control retarders 300A of FIG. 20A.

The display device 100 thus comprises polar control retarder 300A which is arranged between the output polariser 218 (and reflective polariser 302) and the additional polariser 318A.

The at least one polar control retarder 300A includes a liquid crystal retarder 301A which comprises a layer of liquid crystal material 314A and two surface alignment layers 419AA, 419AB disposed adjacent to the layer of liquid crystal material 314A and on opposite sides thereof. At least one of the surface alignment layers 419AA, 419AB is arranged to provide alignment in the adjacent liquid crystal material 314A with an in-plane component that is in the plane of the layer of liquid crystal material 314A. The angle 617AA of said in-plane component of the alignment in the adjacent liquid crystal material 314A changes monotonically along the predetermined axis 500 across at least part of the display device 100. This is illustrated in FIG. 20A by the arrows 417ALp, 417ACp, 417ARp which show the in-plane component of the alignment layer 419AA, which determines the in-plane component of the alignment in the adjacent liquid crystal material 314A.

The display device 100 also comprises at least one further polar control retarder 300B which is arranged between the input polariser 210 and the further additional polariser 318B. The at least one further polar control retarder 300B includes a liquid crystal retarder 301B which comprises a layer of liquid crystal material 314B and two surface alignment layers 419BA, 419BB disposed adjacent to the layer of liquid crystal material 314B and on opposite sides thereof. At least one of the surface alignment layers 419BA, 419BB is arranged to provide alignment in the adjacent liquid crystal material 314B with an in-plane component that is in the plane of the layer of liquid crystal material 314B. The angle 617BA of said in-plane component 417BA of the alignment in the adjacent liquid crystal material 314B changes monotonically along the predetermined axis across at least part of the display device 100. This is illustrated in FIG. 20A by the arrows 417BLp, 417BCp, 417BRp which show the in-plane component of the alignment layer 419BA, which determines the in-plane component of the alignment in the adjacent liquid crystal material 314B. As mentioned above, the use of two polar control retarders 300A, 300B may make it possible to further reduce the luminance for off-axis snoopers through the multiplicative effect of the reduction in luminance achieved by each of the polar control retarders 300, 300A.

The polar control retarder 300A, 300B are identical to the polar control retarder 300 seen in FIG. 19A. As depicted, it may be possible to apply a voltage V to the polar control retarder 300A and a voltage $V_A$ to the further polar control retarder 300A. The polar control retarder 300A, 300B may have the same or different prescription for properties of retarders 301A, 330A and 301B, 330B. Different prescriptions may provide control of different polar viewing angles. Advantageously uniformity of privacy image to the primary user and uniformity of visual security to off-axis snoopers may be increased.

In alternative embodiments of FIGS. 20A-B, both polar control retarders 300A, 300B may be arranged on the input side of a transmissive spatial light modulator 48 or both polar control retarders 300A, 300B may be arranged on the output side of a transmissive spatial light modulator 48 or on the output side of an emissive spatial light modulator 48.

Figure 21:
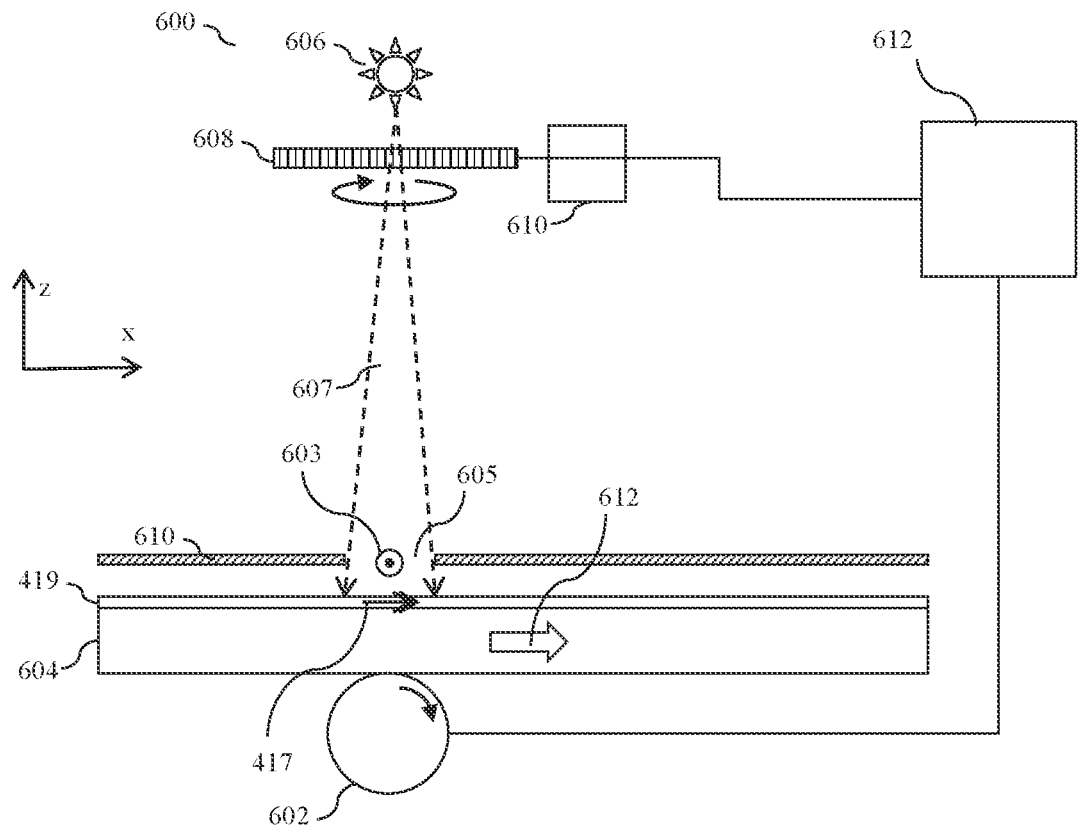
FIG. 21 is a side view of an apparatus for manufacturing a surface alignment layer having a varying angle of alignment across its area.

FIG. 21 is a side view of an apparatus 600 for manufacturing a surface alignment layer 419, for example the alignment layer 419A, 419B described above, having a varying angle of alignment across its area. The apparatus 600 comprises a rotating roller 602 configured to translate a substrate 604 with an alignment layer 419 thereon. The apparatus 600 further comprises a light source 606 such as an ultra-violet light source arranged to provide a beam of light 607 towards the alignment layer 419. Arranged in the optical path of the light source 606 is a polariser 608 and a mask 610. The mask 610 serves to only allow the light beam 607 to be incident on a desired portion 605 of the alignment layer 419. The apparatus further comprises a controller 612 operatively connected to a means 610 to rotate the polarisation 603 from the polariser 608 and the roller 602. The polariser 608 may be a linear polariser that is physically rotated or may comprise a fixed linear polariser and a controllable retarder.

Operation of the apparatus 600 will now be described. In use, the roller 602 may translate the substrate 604, and hence the alignment layer 419, relative to the light source 606 and mask 610 such that the light beam 607 can be incident on different portions of the alignment layer 419 that may be a photoalignment layer. As the roller 602 moves the substrate 604, the polariser 608 may simultaneously be controlled such that the beam of light 607 incident on the alignment layer 419 has a desired polarisation direction 603. The portion of the alignment layer 419 illuminated by the beam of light may align based on the polarisation of the incident beam of light 607. The beam of light 607 may also cure the alignment layer 419. Through control of the polariser 608 orientation to change the polarisation direction 603 of the beam of light 607 as the roller 602 moves the substrate 604, it may be possible to illuminate the alignment layer 419 with different polarisation directions 603 at different portions of the alignment layer 419, and thus change the angle of alignment along the alignment layer 419. Through appropriate control, it may be possible to achieve a monotonically varying in-plane angle of alignment of material in the alignment layer 419. Whilst a roller 602 is described above, any other suitable means may be provided for causing relative movement between the beam of light 607 and the alignment layer 419. For example, the light source 606 may be movably mounted to scan the beam of light 607 over the surface layer 419.

Figure 22:
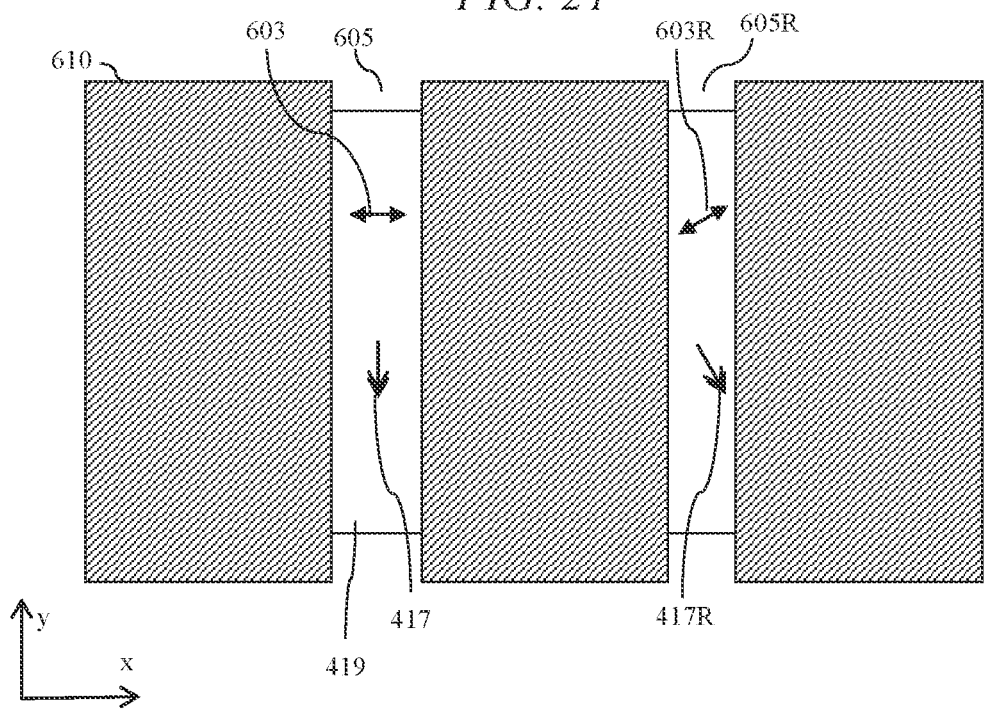
FIG. 22 is front view illustrating the mask of the apparatus seen in FIG. 21 at different positions and the polarisation of the beam of light at those corresponding positions.

FIG. 22 is front view illustrating the mask 610, of the apparatus 600, seen in FIG. 21 over different portions 605, 605R of the alignment layer 419, and the polarisation direction 603, 603R of the beam of light 607 at those corresponding portions. Double ended arrows 419, 419R illustrate the direction of alignment in the alignment layer 419 with the light 607, at the different portions of the alignment layer 419. As shown in FIG. 22 by the arrows 417, 417R, the material of the alignment layer aligns at 90°, i.e. perpendicular, to the polarisation direction 603, 603R of the incident light. The beam of light 607 may also be directed at an angle to the plane of the alignment layer 419 in order to achieve a pre-tilt of the material in the alignment layer 419.

Figure 23A:
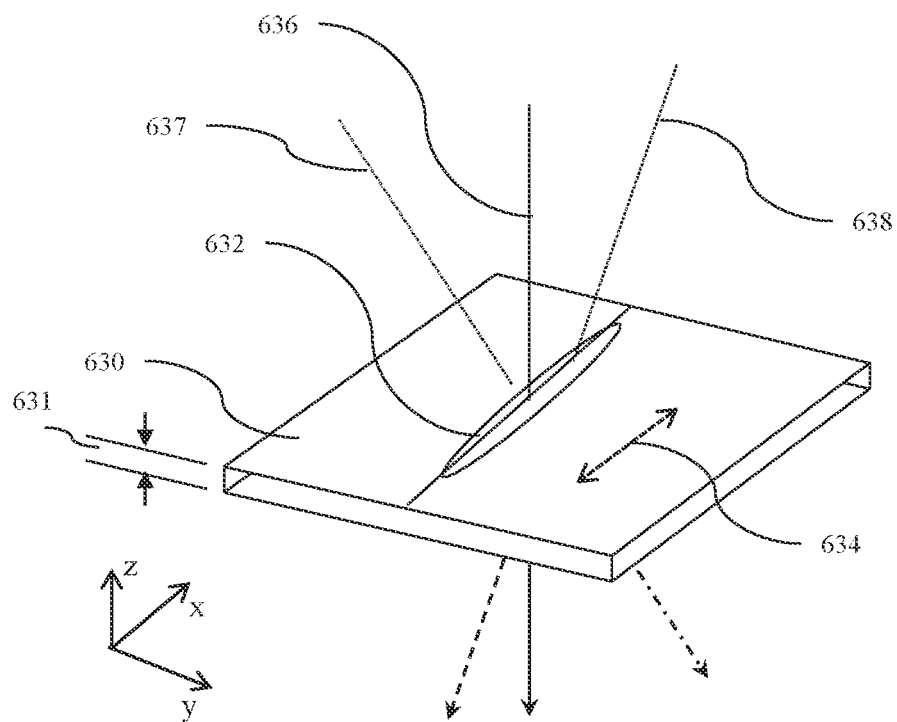
FIG. 23A is a diagram illustrating in perspective view illumination of a retarder layer by off-axis light.

FIG. 23A is a schematic diagram illustrating in perspective view illumination of a polar control retarder 630 layer by off-axis light. Polar control retarder 630 may comprise birefringent material, represented by refractive index ellipsoid 632 with optical axis direction 634 at 0 degrees to the x-axis, and have a thickness 631. The polar control retarder 630 is representative of any of the passive or switchable retarders described above having a homogeneous alignment. Features of the arrangements of FIGS. 23A-25E below that are not discussed in further detail may be assumed to correspond to the features with equivalent reference numerals as discussed above, including any potential variations in the features.

Normal light rays 636 propagate so that the path length in the material is the same as the thickness 631. Light rays 637 are in the y-z plane have an increased path length; however the retardance of the material is substantially the same as the rays 636. By way of comparison light rays 638 that are in the x-z plane have an increased path length in the birefringent material and further the retardance is different to the normal ray 636.

The retardance of the polar control retarder 630 is thus dependent on the angle of incidence of the respective ray, and also the plane of incidence, that is rays 638 in the x-z will have a retardance different from the normal rays 636 and the rays 637 in the y-z plane.

The interaction of polarized light with the polar control retarder 630 will now be described. To distinguish from the first and second polarization components during operation in a directional backlight 20, the following explanation will refer to third and fourth polarization components.

Figure 23B:
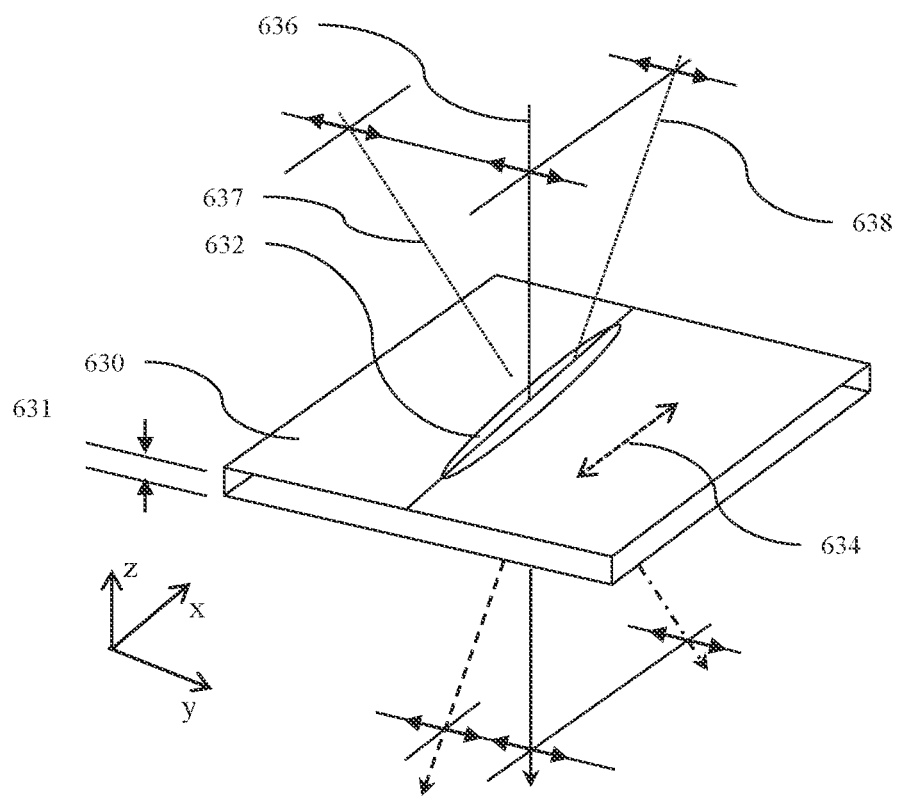
FIG. 23B is a diagram illustrating in perspective view illumination of a retarder layer by off-axis light of a first linear polarization state at 0 degrees.
Figure 23C:
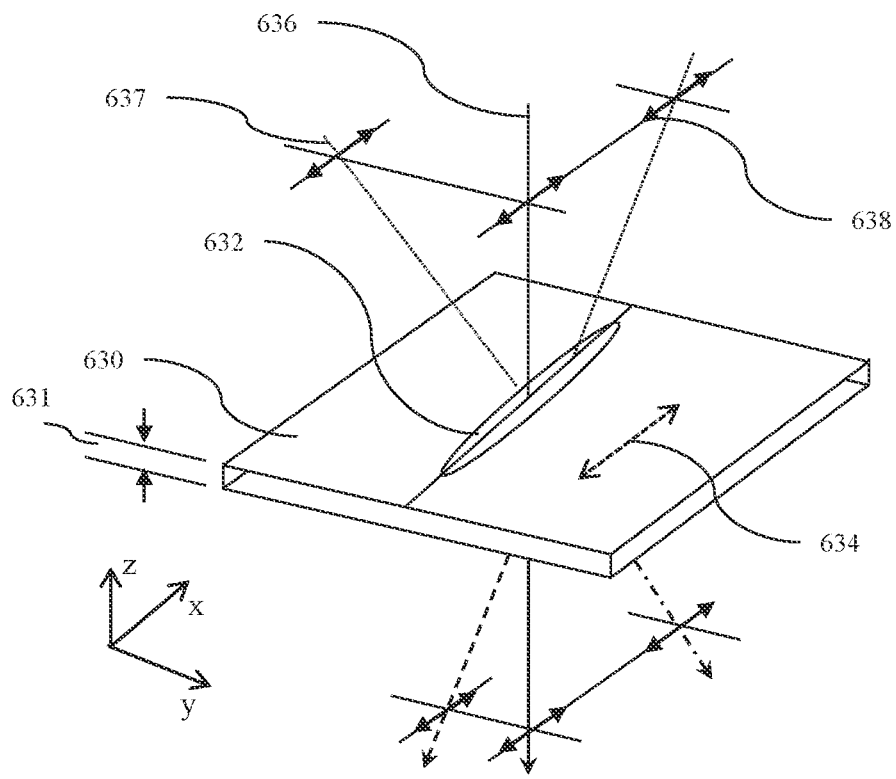
FIG. 23C is a diagram illustrating in perspective view illumination of a retarder layer by off-axis light of a first linear polarization state at 90 degrees.

FIG. 23B is a schematic diagram illustrating in perspective view illumination of a polar control retarder layer by off-axis light of a third linear polarization state at 90 degrees to the x-axis and FIG. 23C is a schematic diagram illustrating in perspective view illumination of a polar control retarder layer by off-axis light of a fourth linear polarization state at 0 degrees to the x-axis. In such arrangements, the incident linear polarization states are aligned to the optical axes of the birefringent material, represented by ellipse 632. Consequently, no phase difference between the third and fourth orthogonal polarization components is provided, and there is no resultant change of the polarization state of the linearly polarized input for each ray 636, 637, 638. Thus, the polar control retarder 630 introduces no phase shift to polarisation components of light passed by the polariser on the input side of the polar control retarder 630 along an axis along a normal to the plane of the polar control retarder 630. Accordingly, the polar control retarder 630, and the polarisers (not shown) on each side of the polar control retarder 630, do not affect the luminance of light passing therethrough. Although FIGS. 23A-C relate specifically to a polar control retarder 630 that which is passive, a similar effect is achieved by the polar control retarders in the devices described above.

Figure 23D:
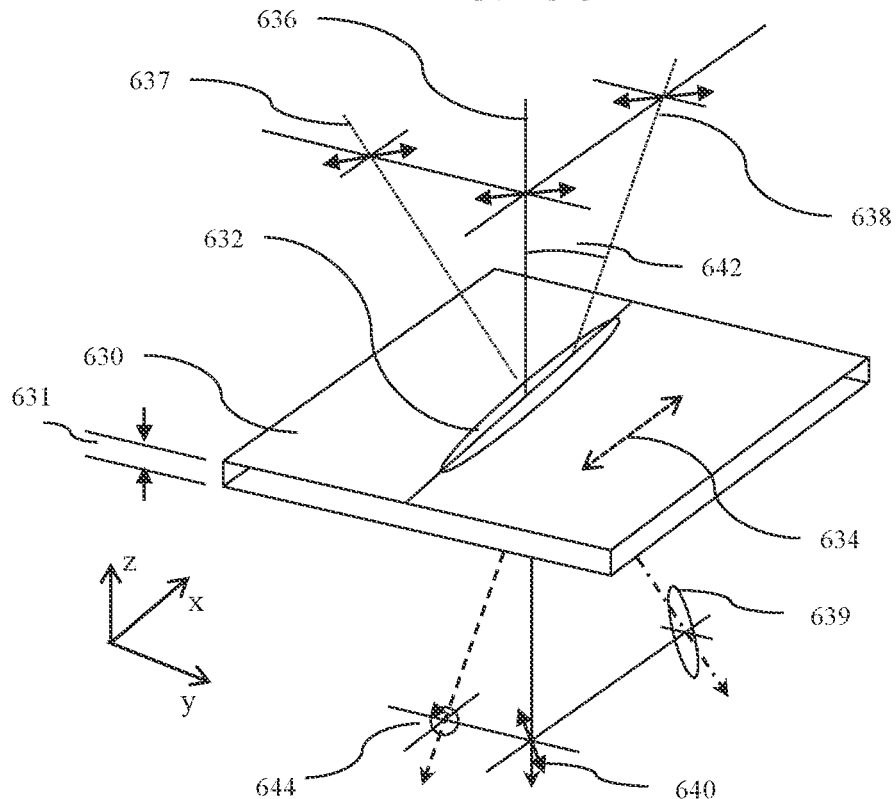
FIG. 23D is a diagram illustrating in perspective view illumination of a retarder layer by off-axis light of a first linear polarization state at 45 degrees.

FIG. 23D is a schematic diagram illustrating in perspective view illumination of a polar control retarder 630 layer by off-axis light of a linear polarization state at 45 degrees. The linear polarization state may be resolved into third and fourth polarization components that are respectively orthogonal and parallel to optical axis 634 direction. The polar control retarder thickness 631 and material retardance represented by refractive index ellipsoid 632 may provide a net effect of relatively shifting the phase of the third and fourth polarization components incident thereon in a normal direction represented by ray 636 by half a wavelength, for a design wavelength. The design wavelength may for example be in the range of 500 to 550 nm.

At the design wavelength and for light propagating normally along ray 636 then the output polarization may be rotated by 90 degrees to a linear polarization state 640 at −45 degrees. Light propagating along ray 637 may see a phase difference that is similar but not identical to the phase difference along ray 636 due to the change in thickness, and thus an elliptical polarization state 639 may be output which may have a major axis similar to the linear polarization axis of the output light for ray 636.

By way of contrast, the phase difference for the incident linear polarization state along ray 638 may be significantly different, in particular a lower phase difference may be provided. Such phase difference may provide an output polarization state 644 that is substantially circular at a given inclination angle 642. Thus, the polar control retarder 630 introduces a phase shift to polarisation components of light passed by the polariser on the input side of the polar control retarder 630 along an axis corresponding to ray 638 that is inclined to a normal to the plane of the polar control retarder 630. Although FIG. 23D relates to the polar control retarder 630 that is passive, a similar effect is achieved by the polar control retarders described above, in a switchable state of the switchable liquid crystal polar control retarder corresponding to the privacy mode.

To illustrate the off-axis behaviour of polar control retarder stacks, the angular luminance control of C-plates for example C-plate 330, between the additional polariser 318 and the output display polariser 218, or C-plate 330A, will now be described for various off-axis illumination arrangements with reference to the operation of a C-plate between the parallel polarisers 500, 210 will now be described.

Figure 24A:
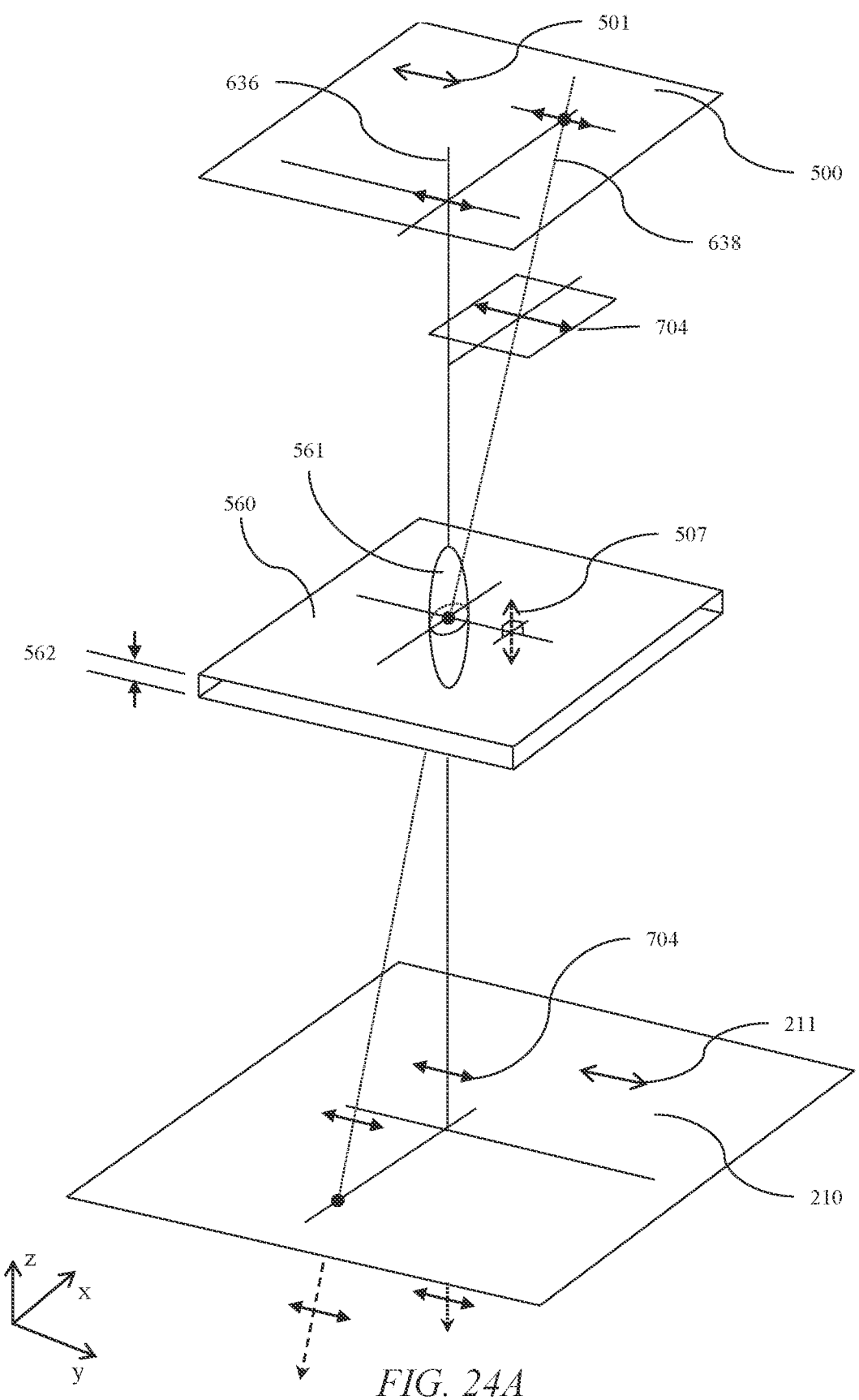
FIG. 24A is a diagram illustrating in perspective view illumination of a C-plate retarder by off-axis polarised light with a positive elevation.

FIG. 24A is a schematic diagram illustrating in perspective view illumination of a C-plate layer by off-axis polarised light 638 with a positive elevation. Incident linear polarisation component 704, achieved by polariser 500 with electric vector transmission direction 501, is incident onto the birefringent material 561 of the polar control retarder 560 that is a C-plate with optical axis direction 507 that is perpendicular to the plane of the polar control retarder 560. Polarisation component 704 sees no net phase difference on transmission through the liquid crystal molecule and so the output polarisation component is the same as component 704. Thus a maximum transmission is seen through the polariser 210 as the polarisation direction is parallel to the electric vector transmission direction 211. The same is also true for the incident light 636 which travels at a zero lateral and zero elevation angle. Thus the polar control retarder 560 has an optical axis 507 perpendicular to the plane of the polar control retarder 560, that is the x-y plane. The polar control retarder 560 having an optical axis 507 perpendicular to the plane of the polar control retarder comprises a C-plate.

Figure 24B:
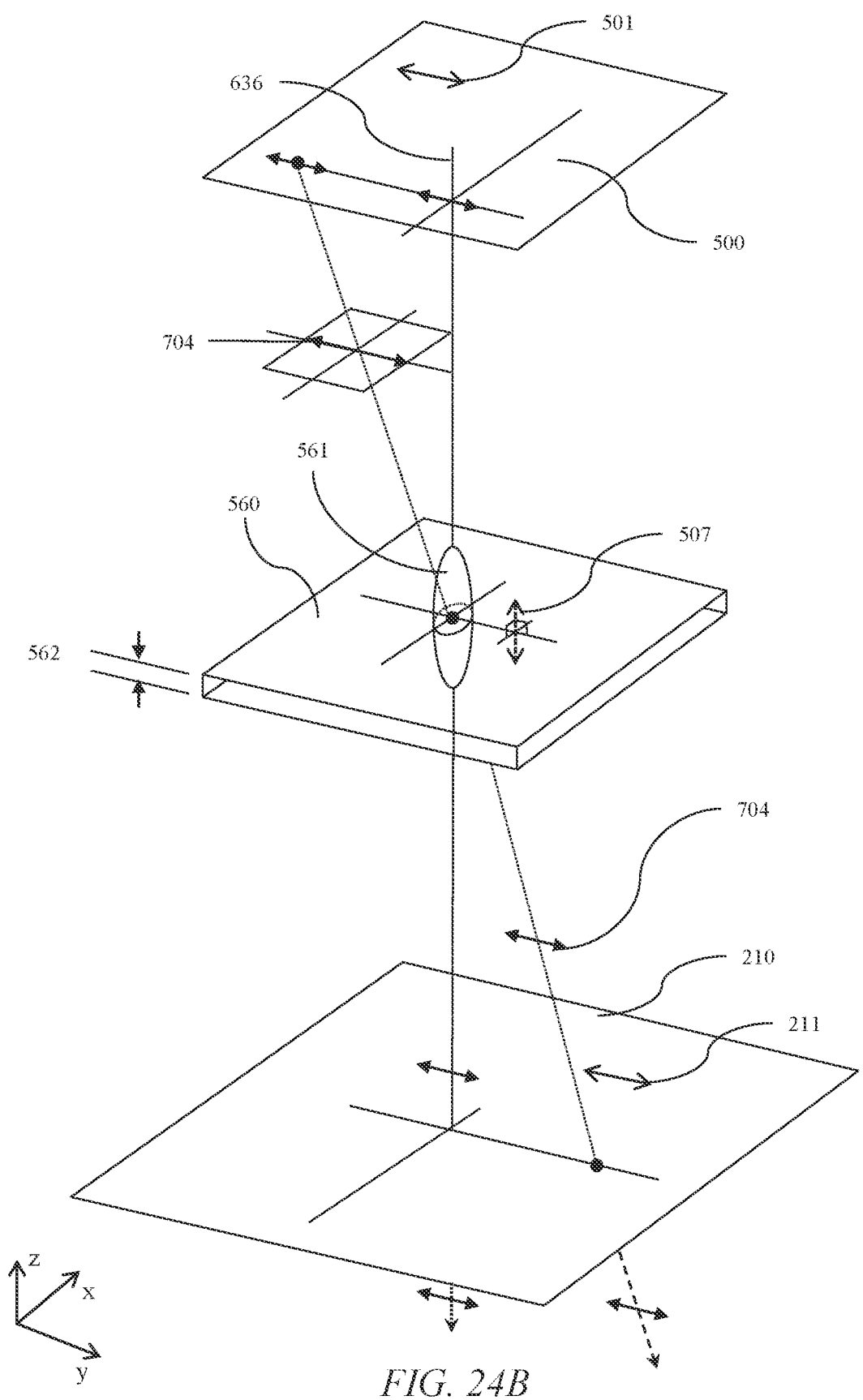
FIG. 24B is a diagram illustrating in perspective view illumination of a C-plate retarder by off-axis polarised light with a negative lateral angle.

FIG. 24B is a schematic diagram illustrating in perspective view illumination of a C-plate layer by off-axis polarised light with a negative lateral angle. As with the arrangement of FIG. 24A, polarisation state 704 sees no net phase difference and is transmitted with maximum luminance. Thus, the polar control retarder 560 introduces no phase shift to polarisation components of light passed by the polariser on the input side of the polar control retarder 560 along an axis along a normal to the plane of the polar control retarder 560. Accordingly, the polar control retarder 560 does not affect the luminance of light passing through the polar control retarder 560 and polarisers 500, 210 on each side of the polar control retarder 560.

Figure 24C:
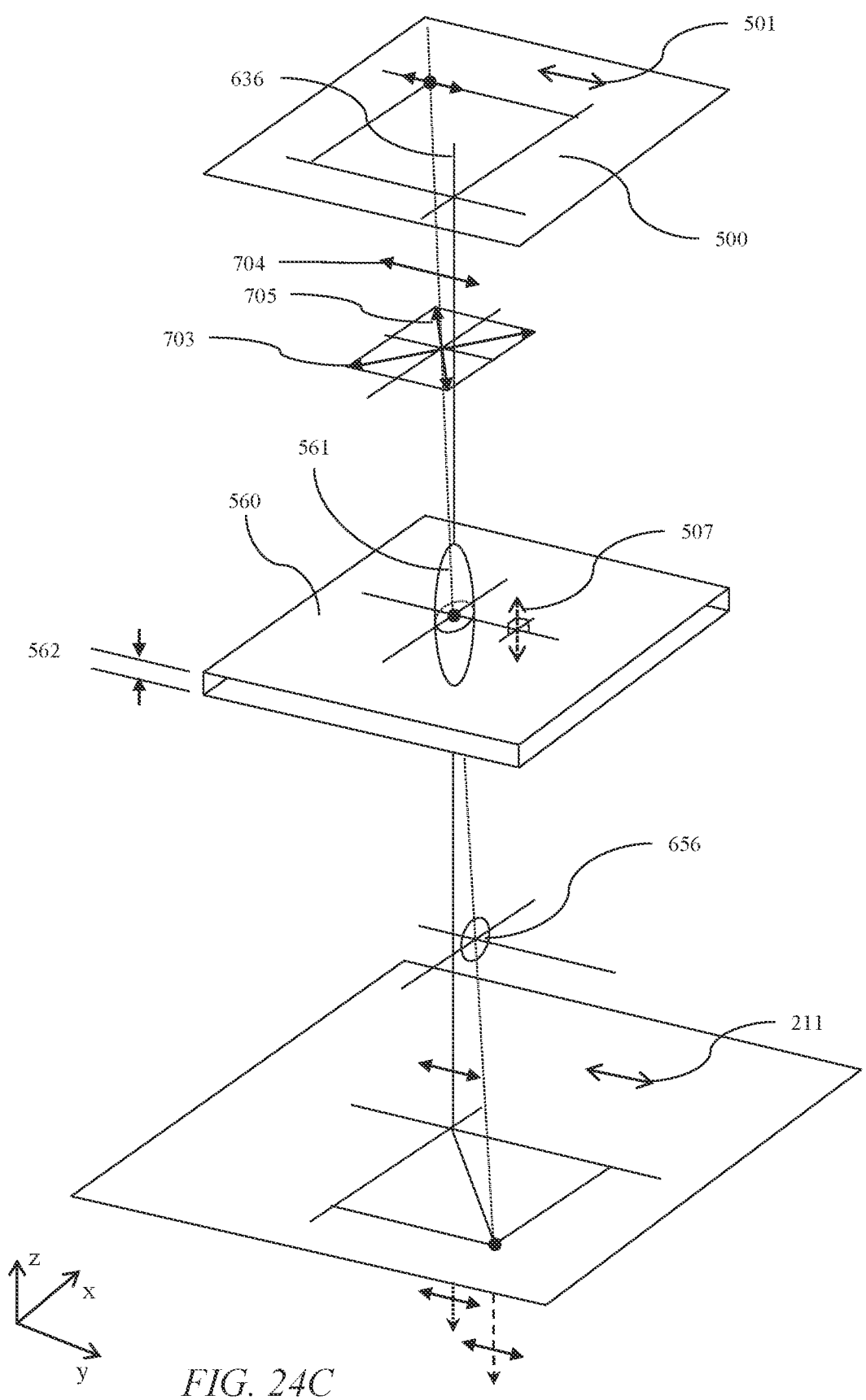
FIG. 24C is a diagram illustrating in perspective view illumination of a C-plate retarder by off-axis polarised light with a positive elevation and negative lateral angle.

FIG. 24C is a schematic diagram illustrating in perspective view illumination of a C-plate layer by off-axis polarised light with a positive elevation and negative lateral angle. In comparison to the arrangement of FIGS. 24A-B, the polarisation state 704 resolves onto eigenstates 703, 705 with respect to the birefringent material 561 providing a net phase difference on transmission through the polar control retarder 560. The resultant elliptical polarisation component 656 is transmitted through polariser 210 with reduced luminance in comparison to the rays illustrated in FIGS. 24A-B. Although FIGS. 24A-C relate specifically to the polar control retarder 560 that is passive, a similar effect is achieved by the polar control retarders in the devices described above.

Figure 24D:
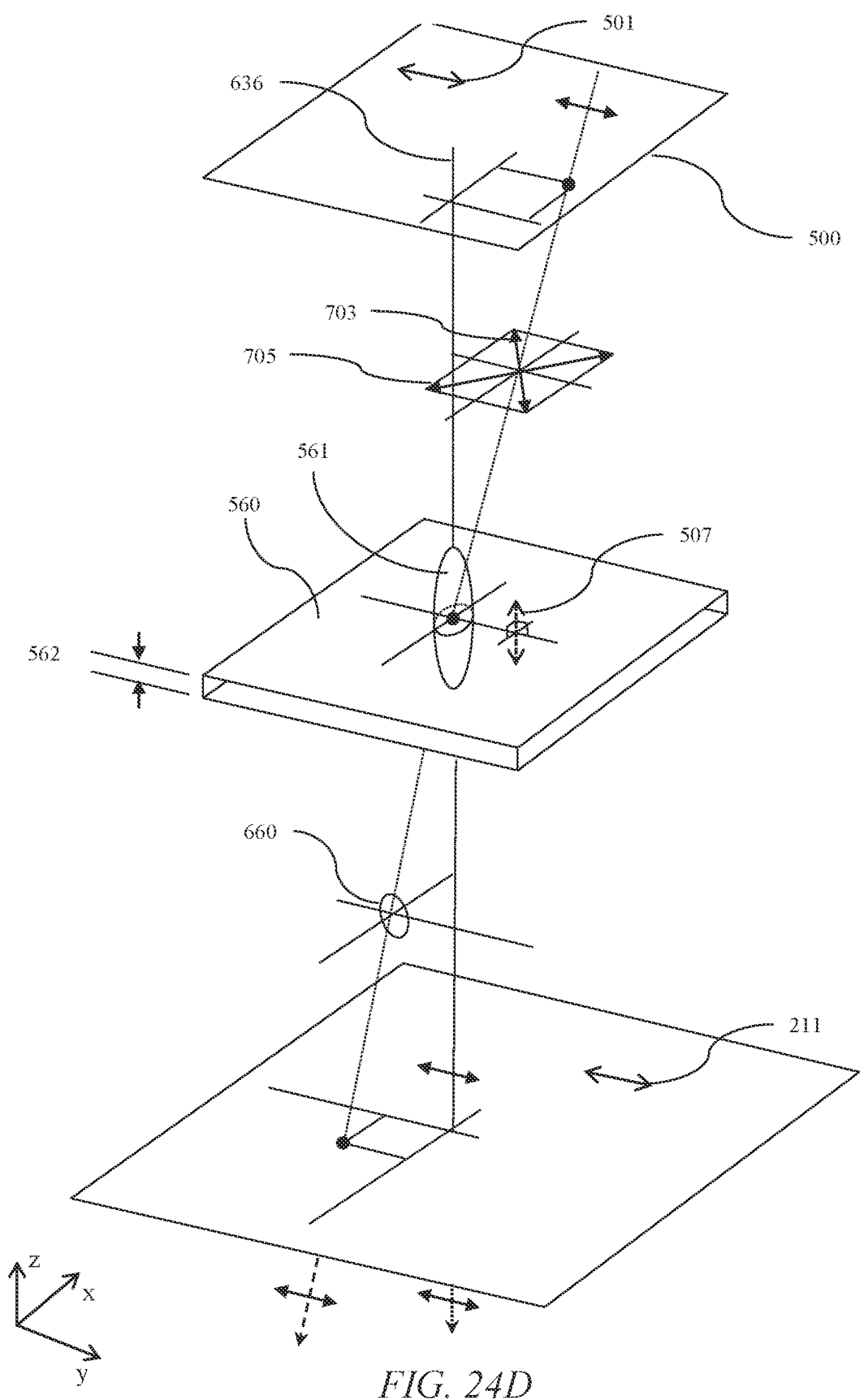
FIG. 24D is a diagram illustrating in perspective view illumination of a C-plate retarder by off-axis polarised light with a positive elevation and positive lateral angle.

FIG. 24D is a schematic diagram illustrating in perspective view illumination of a C-plate layer by off-axis polarised light with a positive elevation and positive lateral angle. In a similar manner to FIG. 24C, the polarisation component 704 is resolved into eigenstates 703, 705 that undergo a net phase difference, and elliptical polarisation component 660 is provided, which after transmission through the polariser reduces the luminance of the respective off-axis ray. Thus, the polar control retarder 560 introduces a phase shift to polarisation components of light passed by the polariser on the input side of the polar control retarder 560 along an axis that is inclined to a normal to the plane of the polar control retarder 560. Although FIG. 24D relates to the polar control retarder 560 that is passive, a similar effect is achieved by the polar control retarders described above, in a switchable state of the switchable liquid crystal polar control retarder corresponding to the privacy mode.

Figure 24E:
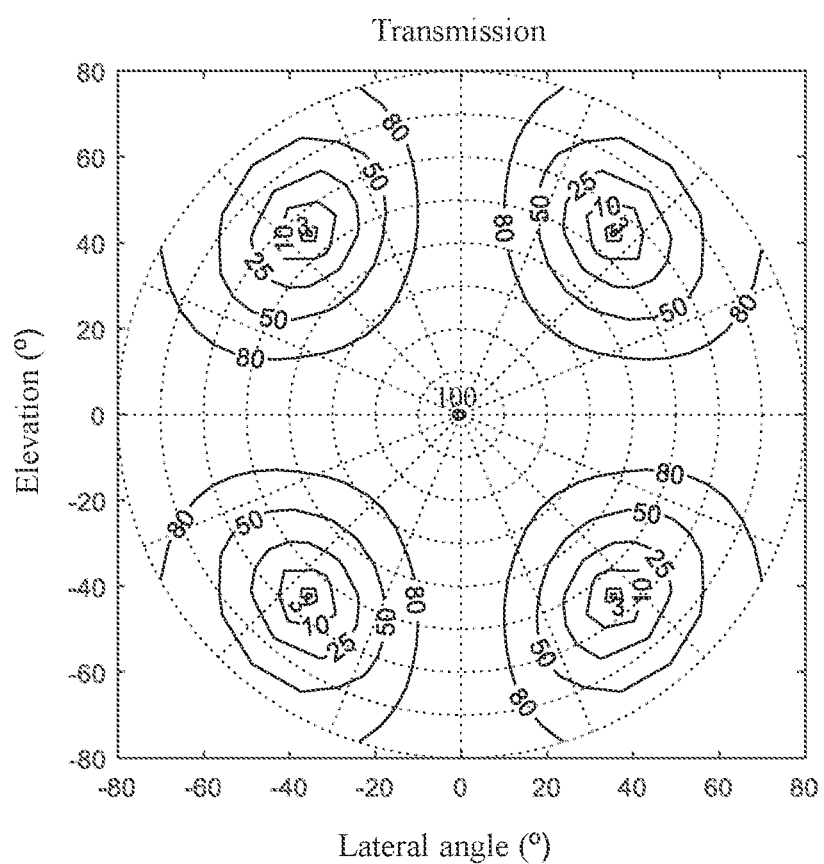
FIG. 24E is a graph illustrating the variation of output transmission with polar direction for transmitted light rays in FIGS. 24A-D.

FIG. 24E is a schematic graph illustrating the variation of output transmission with polar direction for transmitted light rays in FIGS. 24A-D. Thus, the C-plate may provide luminance reduction in polar quadrants. In combination with switchable liquid crystal retarder 301 described elsewhere herein, this may achieve: (i) removal of luminance reduction of the C-plate in a first wide angle state of operation and (ii) extended polar region for luminance reduction may be achieved in a second privacy state of operation.

To illustrate the off-axis behaviour of polar control retarder stacks, the angular luminance control of crossed A-plates 308A, 308B between an additional polariser 318 and output display polariser 218 will now be described for various off-axis illumination arrangements.

Figure 25A:
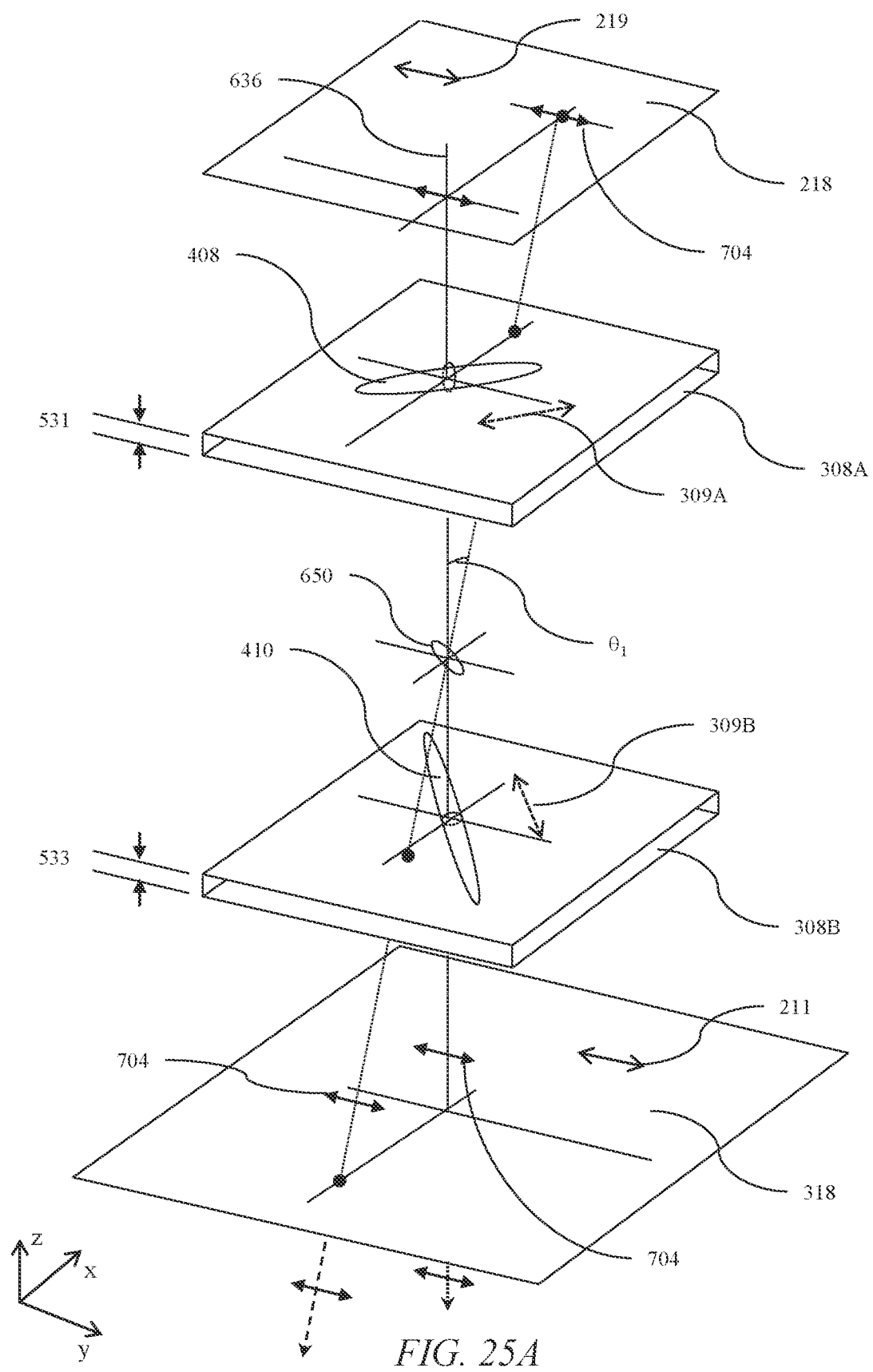
FIG. 25A is a diagram illustrating in perspective view illumination of crossed A-plate retarder layers by off-axis polarised light with a positive elevation.

FIG. 25A is a schematic diagram illustrating in perspective view illumination of crossed A-plate retarder layers by off-axis polarised light with a positive elevation. Linear polariser 218 with electric vector transmission direction 219 is used to provide a linear polarisation state 704 that is parallel to the lateral direction onto first A-plate 308A of the crossed A-plates 308A, 308B. The first A-plate 308A may comprise birefringent material, represented by refractive index ellipsoid 408 with optical axis direction 309A is inclined at +45 degrees to the lateral direction. The first A-plate 308A has a first thickness 531. The retardance of the polar control retarder 308A for the off-axis angle $\theta_1$ in the positive elevation direction provides a resultant polarisation component 650 that is generally elliptical on output. Polarisation component 650 is incident onto the second A-plate 308B of the crossed A-plates 308A, 308B. The second A-plate 308A may comprise birefringent material, represented by refractive index ellipsoid 410 with has an optical axis direction 309B that is orthogonal to the optical axis direction 309A of the first A-plate 330A. The second A-plate 308B has a second thickness 533. The first thickness 531 and second thickness 533 may be the same or different. In the plane of incidence of FIG. 25A, the retardance of the second A-plate 308B for the off-axis angle $\theta_1$ is equal and opposite to the retardance of the first A-plate 308A. Thus a net zero retardation is provided for the incident polarisation component 704 and the output polarisation component is the same as the input polarisation component 704. The same is also true for ray 636 which has zero lateral and zero elevation angle.

The output polarisation component is aligned to the electric vector transmission direction of the additional polariser 318, and thus is transmitted efficiently. Advantageously substantially no losses are provided for light rays that have zero lateral angle angular component so that full transmission efficiency is achieved.

Figure 25B:
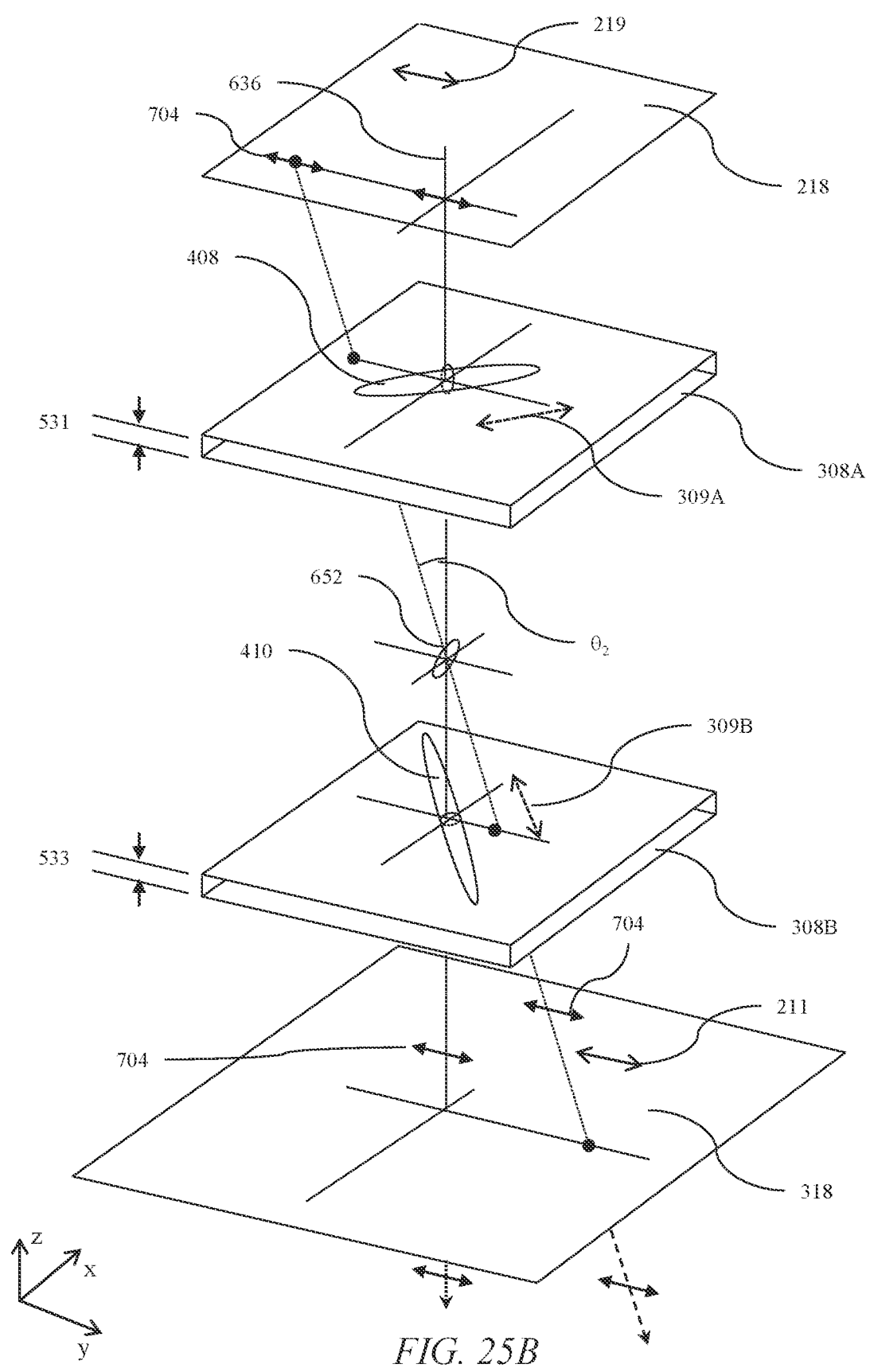
FIG. 25B is a diagram illustrating in perspective view illumination of crossed A-plate retarder layers by off-axis polarised light with a negative lateral angle.

FIG. 25B is a schematic diagram illustrating in perspective view illumination of crossed A-plate retarder layers 308A, 308B, seen in FIG. 25A, by off-axis polarised light with a negative lateral angle. Thus the linear input polarisation component 704 is converted by the first A-plate 308A to an intermediate polarisation component 652 that is generally an elliptical polarisation state. The second A-plate 308B again provides an equal and opposite retardation to the first A-plate 308A so that the output polarisation component 704 is the same as the input polarisation component 704 and light is efficiently transmitted through the polariser 318.

Thus the polar control retarder comprises a pair of retarders 308A, 308B which have optical axes 309A, 309B in the plane of the retarders 330A, 330B that are crossed, that is the x-y plane in the present embodiments. The pair of retarders 308A, 308B have optical axes 309A, 309B that each extend at 45° with respect to an electric vector transmission direction that is parallel to the electric vector transmission of the polariser 318.

Advantageously substantially no losses are provided for light rays that have zero elevation angular component so that full transmission efficiency is achieved.

Figure 25C:
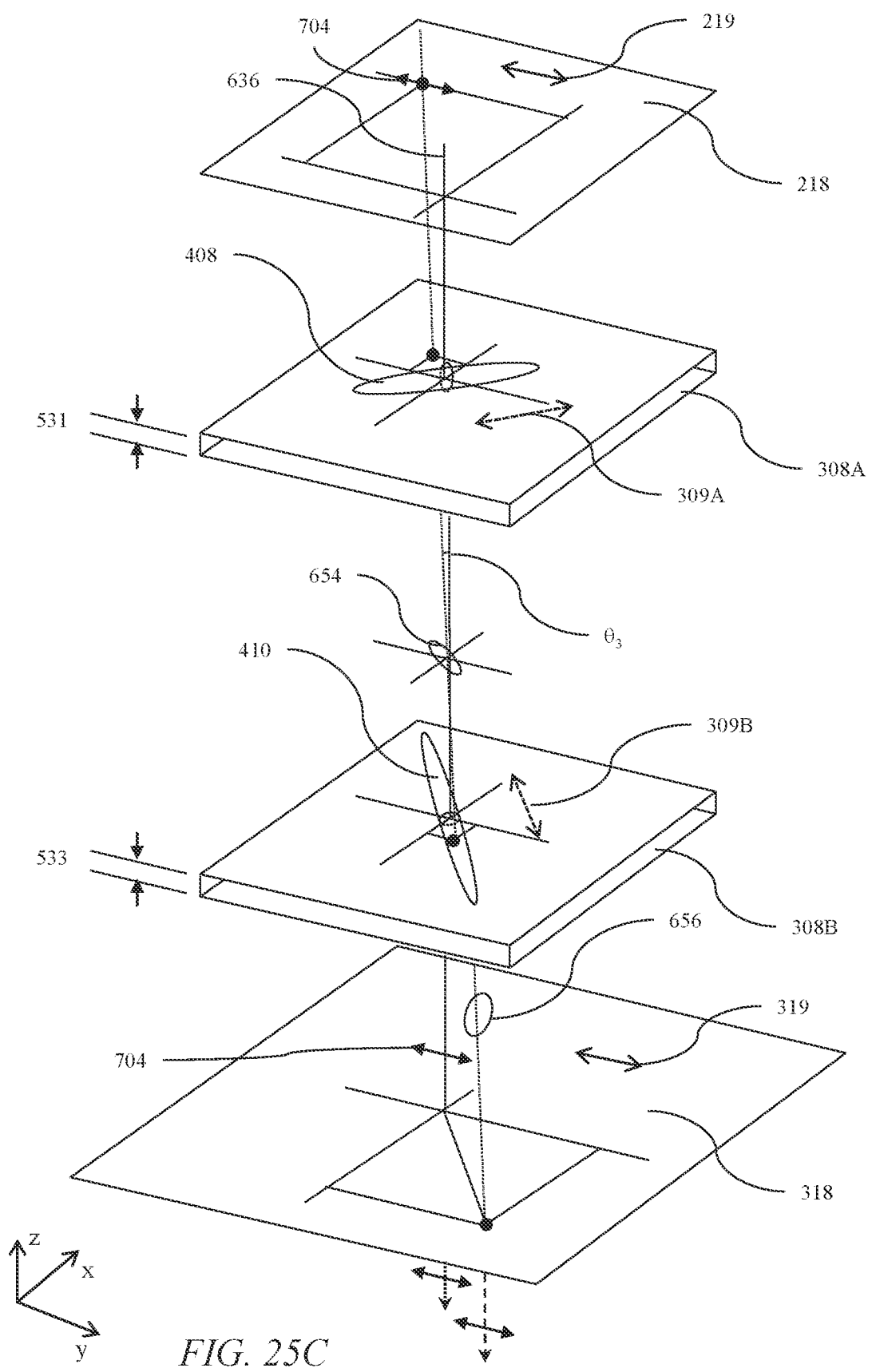
FIG. 25C is a diagram illustrating in perspective view illumination of crossed A-plate retarder layers by off-axis polarised light with a positive elevation and negative lateral angle.

FIG. 25C is a schematic diagram illustrating in perspective view illumination of crossed A-plate retarder layers by off-axis polarised light with a positive elevation and negative lateral angle. Polarisation component 704 is converted to an elliptical polarisation component 654 by first A-plate 308A. A resultant elliptical component 656 is output from the second A-plate 308B. Elliptical component 656 is analysed by input polariser 318 with reduced luminance in comparison to the input luminance of the first polarisation component 704.

Figure 25D:
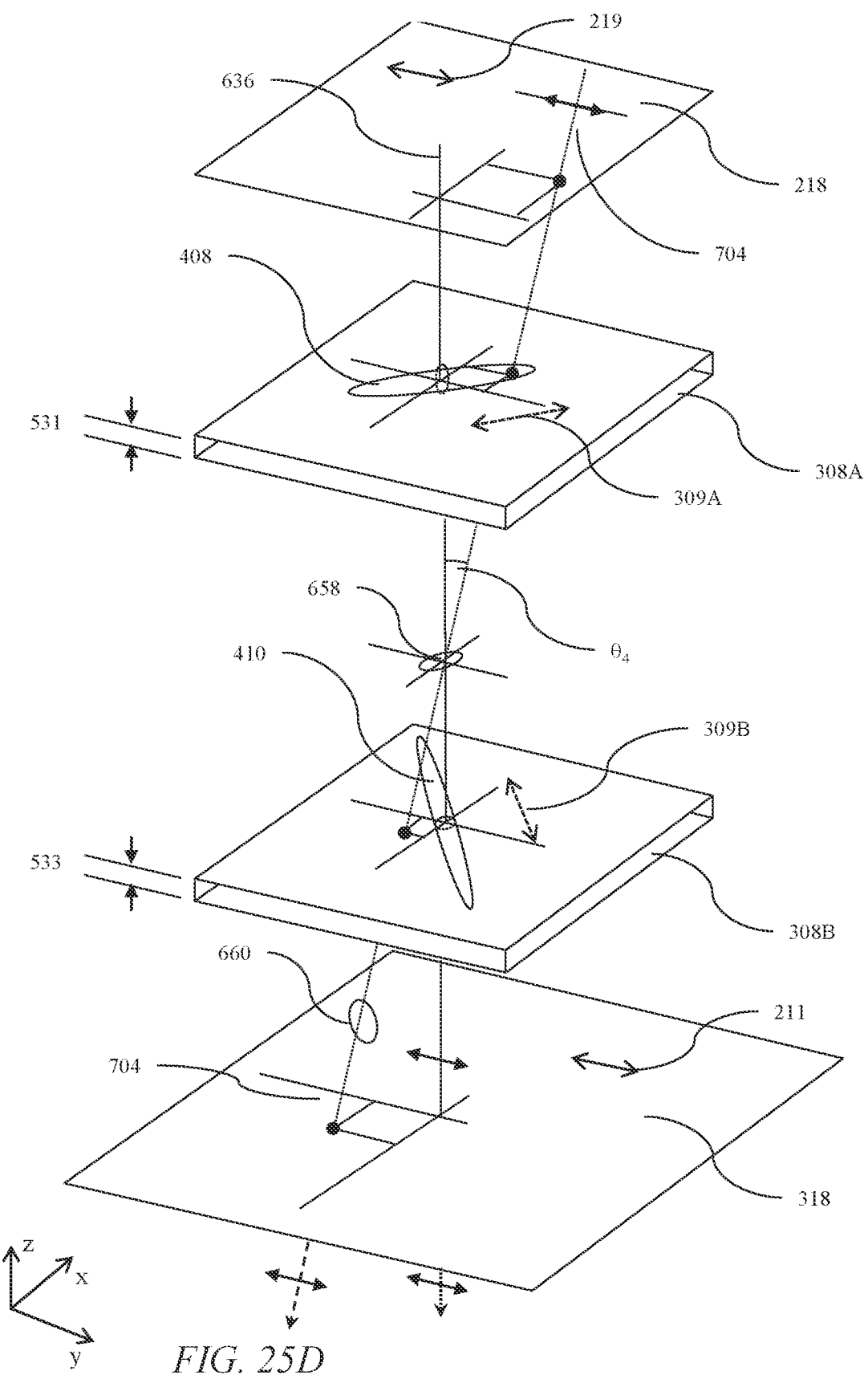
FIG. 25D is a diagram illustrating in perspective view illumination of crossed A-plate retarder layers by off-axis polarised light with a positive elevation and positive lateral angle.

FIG. 25D is a schematic diagram illustrating in perspective view illumination of crossed A-plate retarder layers 308A, 308B by off-axis polarised light with a positive elevation and positive lateral angle. Polarisation components 658 and 660 are provided by first and second A-plates 308A, 308B as net retardance of the first and second A-plates 308A, 308B does not provide compensation.

Thus luminance is reduced for light rays that have non-zero lateral angle and non-zero elevation components. Advantageously display privacy can be increased for snoopers that are arranged in viewing quadrants while luminous efficiency for primary display users is not substantially reduced.

Figure 25E:
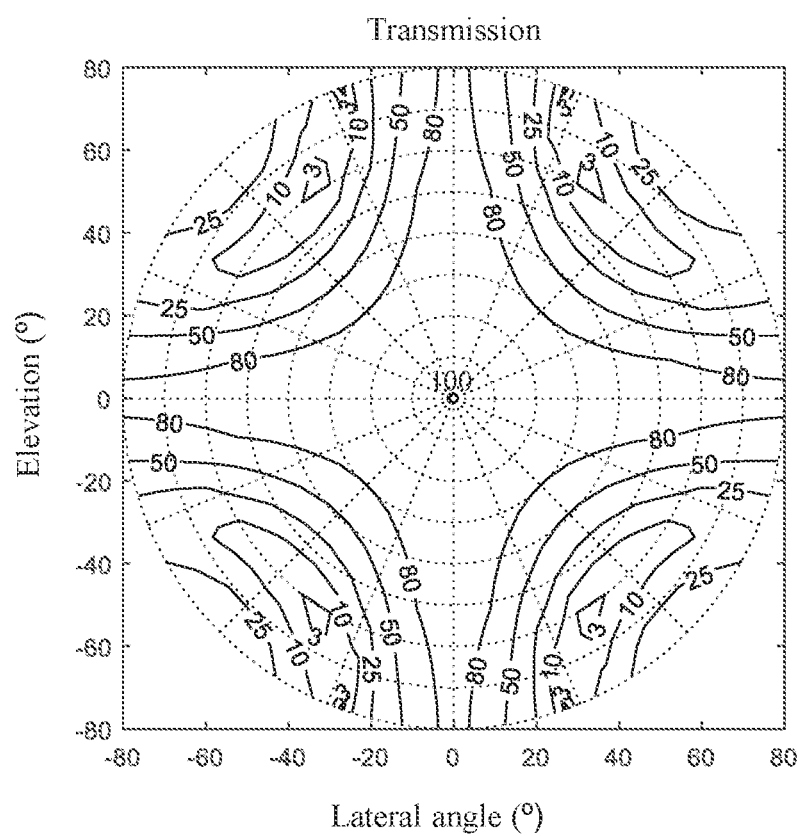
FIG. 25E is a graph illustrating the variation of output transmission with polar direction for transmitted light rays in FIGS. 25A-D.

FIG. 25E is a schematic graph illustrating the variation of output transmission with polar direction for transmitted light rays in FIGS. 25A-D. In comparison to the arrangement of FIG. 24E, the area of luminance reduction is increased for off-axis viewing. However, the switchable liquid crystal layer 314 may provide reduced uniformity in comparison to the C-plate arrangements for off-axis viewing in the first public mode state of operation.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A method of manufacturing a surface alignment layer for aligning liquid crystal molecules, the method comprising:
generating a beam of light that is linearly polarised with a controllable polarisation direction;
directing the beam of light to illuminate a portion of a layer of photoalignment material so as to provide alignment of the portion of the layer of photoalignment material based on the polarisation direction; and
providing relative movement between the beam of light and the layer of photoalignment material while the beam of light illuminates the portion of the layer of photoalignment material such that different portions of the layer of photoalignment material are illuminated with linearly polarised light and changing the polarisation direction of the beam of light continuously during the relative movement so that the polarisation direction is different and changes continuously between the different portions of the layer of photoalignment material.

2. The method according to claim 1, further comprising providing a mask in the optical path of the beam of light, wherein the mask allows the beam of light to be incident on a portion of the layer of photoalignment material.

3. The method according to claim 1, further comprising supporting the layer of photoalignment material on a support arrangement.

4. The method according to claim 1, further comprising simultaneously changing the polarisation direction of the beam of light and changing the illuminated portion of the layer of photoalignment material.

5. The method according to claim 1, further comprising moving the layer of photoalignment material to provide the relative movement.

6. The method according to claim 1, further comprising moving a light source that generates the beam of light to provide the relative movement.

7. The method according to claim 1, wherein the layer of photoalignment material is provided on a substrate.

8. The method according to claim 1, wherein changing the polarisation direction of the beam of light comprises physically rotating a polariser of the beam of light.

9. The method according to claim 1, wherein changing the polarisation direction of the beam of light comprises polarising the beam of light with a fixed linear polariser and using a controllable retarder to change the polarisation direction of light polarised by the fixed linear polariser.

10. The method according to claim 1, further comprising monotonically changing the polarisation direction of the beam of light during the relative movement so that the polarisation direction changes monotonically across the layer of photoalignment material.

11. The method according to claim 1, wherein the beam of light is ultraviolet light.

12. The method according to claim 1, further comprising using the beam of light to cure the different portions of the layer of photoalignment material.

13. The method according to claim 1, further comprising directing the beam of light at an angle to the plane of the layer of photoalignment material in order to achieve a pre-tilt in the layer of photoalignment material.

14. An apparatus for manufacturing a surface alignment layer for aligning liquid crystal molecules, the apparatus comprising:
a light source arranged to provide a beam of light;
a polariser configured to linearly polarise the beam of light with a controllable polarisation direction;
a support arrangement configured to support a layer of photoalignment material; and
a mask configured to allow the beam of light to be incident on a portion of the layer of photoalignment material, the light source being configured so that the beam of light provides alignment of the portion of the layer of photoalignment material based on the polarisation direction,
wherein the apparatus is configured to provide relative movement between the beam of light and the layer of photoalignment material while the beam of light illuminates the portion of the layer of photoalignment material such that different portions of the layer of photoalignment material are illuminated with linearly polarised light and to change the polarisation direction of the beam of light continuously during the relative movement so that the polarisation direction is different and changes continuously between the different portions of the layer of photoalignment material that are illuminated.

15. The apparatus according to claim 14, wherein the apparatus is configured to move the layer of photoalignment material to provide the relative movement between the beam of light and the layer of photoalignment material.

16. The apparatus according to claim 14, wherein the light source is movably mounted and the apparatus is configured to change the illuminated portion of the layer of photoalignment material by moving the light source to provide the relative movement between the beam of light and the layer of photoalignment material.

17. The apparatus according to claim 14, wherein the support arrangement is arranged to support a substrate having the layer of photoalignment material provided thereon.

18. The apparatus according to claim 14, wherein the apparatus is configured to physically rotate the polariser so as to change the polarisation direction of the beam of light.

19. The apparatus according to claim 14, wherein the polariser comprises a fixed linear polariser and a controllable retarder, and wherein the controllable retarder is configured to change the polarisation direction of light polarised by the fixed linear polariser.

20. The apparatus according to claim 14, wherein the apparatus is configured to change the polarisation direction of the beam of light during the relative movement so that the polarisation direction changes monotonically across the layer of photoalignment material.

21. The apparatus according to claim 14, wherein the controller is configured to change the polarisation direction of the light across the plurality of different illuminated portions by at least 40 degrees.

22. The apparatus according to claim 14, wherein the light source is an ultraviolet light source.

23. The apparatus according to claim 14, wherein the light source is further configured so that the beam of light cures the portion of the layer of photoalignment material that is illuminated.

24. The apparatus according to claim 14, wherein the apparatus is configured such that, when a layer of photoalignment material is supported by the support arrangement, the beam of light is directed at an angle to the plane of the layer of photoalignment material in order to achieve a pre-tilt in the layer of photoalignment material.

* * * * *